United States Patent
Kikuchi et al.

(10) Patent No.: US 7,911,038 B2
(45) Date of Patent: Mar. 22, 2011

(54) WIRING BOARD, SEMICONDUCTOR DEVICE USING WIRING BOARD AND THEIR MANUFACTURING METHODS

(75) Inventors: Katsumi Kikuchi, Tokyo (JP); Shintaro Yamamichi, Tokyo (JP); Hideya Murai, Tokyo (JP); Takuo Funaya, Tokyo (JP); Kentaro Mori, Tokyo (JP); Takehiko Maeda, Kanagawa (JP); Hirokazu Honda, Kanagawa (JP); Kenta Ogawa, Kanagawa (JP); Jun Tsukano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 51 days.

(21) Appl. No.: 12/306,987

(22) PCT Filed: Jun. 29, 2007

(86) PCT No.: PCT/JP2007/063179
§ 371 (c)(1),
(2), (4) Date: Jan. 27, 2009

(87) PCT Pub. No.: WO2008/001915
PCT Pub. Date: Jan. 3, 2008

(65) Prior Publication Data
US 2009/0315190 A1   Dec. 24, 2009

(30) Foreign Application Priority Data

Jun. 30, 2006 (JP) .................................. 2006-181257

(51) Int. Cl.
*H01L 23/495* (2006.01)
(52) U.S. Cl. .......... 257/668; 257/E23.036; 257/E21.524
(58) Field of Classification Search .................. 257/686, 257/698, 309, 678, 668, E23.036, E21.524; 174/258, 260, 261
See application file for complete search history.

(56) References Cited

U.S. PATENT DOCUMENTS

2002/0001937 A1* 1/2002 Kikuchi et al. ............... 438/618
2006/0012048 A1* 1/2006 Murai et al. .................. 257/758

FOREIGN PATENT DOCUMENTS

| CN | 1645990 | 7/2005 |
|---|---|---|
| CN | 1697163 | 11/2005 |
| CN | 1701429 | 11/2005 |
| JP | 2002-083893 | 3/2002 |
| JP | 2002-198462 | 7/2002 |
| JP | 2006-049819 | 2/2006 |
| WO | 2006-064863 | 6/2006 |

* cited by examiner (Continued)

OTHER PUBLICATIONS

Chinese Patent Office issued a Chinese Office Action dated Mar. 1, 2010, Application No. 200780031703.9.

*Primary Examiner* — Thomas L. Dickey
*Assistant Examiner* — Nikolay Yushin
(74) *Attorney, Agent, or Firm* — Young & Thompson

(57) ABSTRACT

A wiring board has an insulating layer, a plurality of wiring layers formed in such a way as to be insulated from each other by the insulating layer, and a plurality of vias formed in the insulating layer to connect the wiring layers. Of the wiring layers, a surface wiring layer formed in one surface of the insulating layer include a first metal film exposed from the one surface and a second metal film embedded in the insulating layer and stacked on the first metal film. Edges of the first metal film project from edges of the second metal film in the direction in which the second metal film spreads. By designing the shape of the wiring layers embedded in the insulating layer in this manner, it is possible to obtain a highly reliable wiring board that can be effectively prevented from side etching in the manufacturing process and can adapt to miniaturization and highly dense packaging of wires.

18 Claims, 27 Drawing Sheets

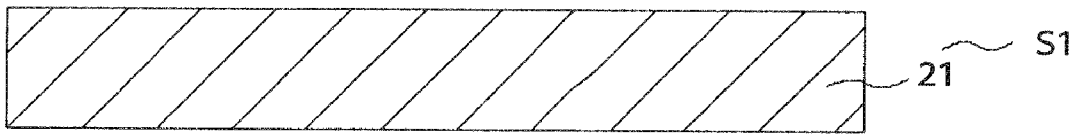
FIG. 6A
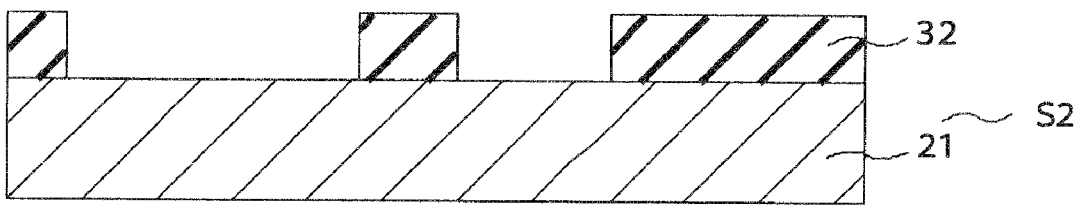
FIG. 6B
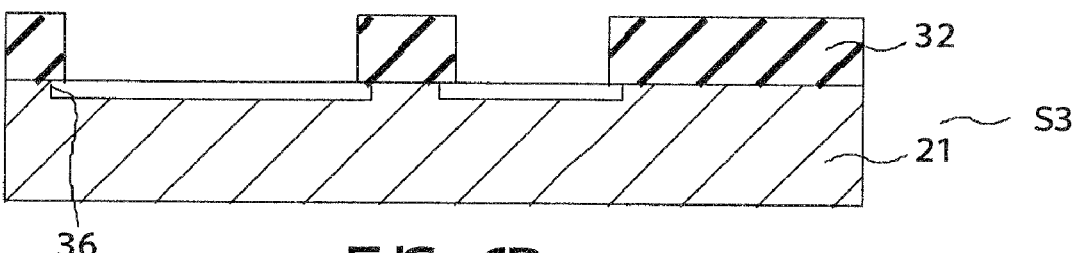
FIG. 6C
FIG. 6D
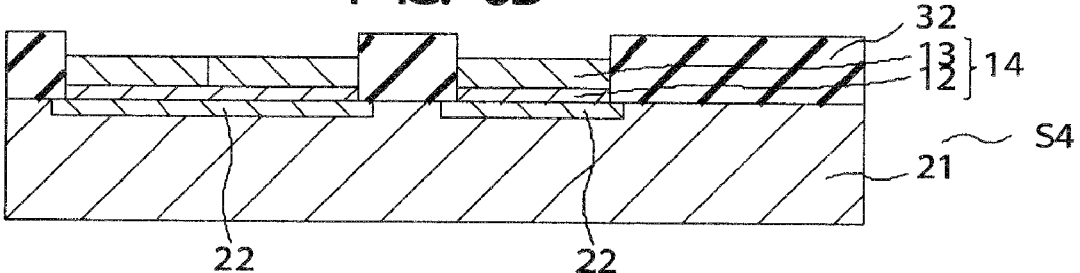
FIG. 6E
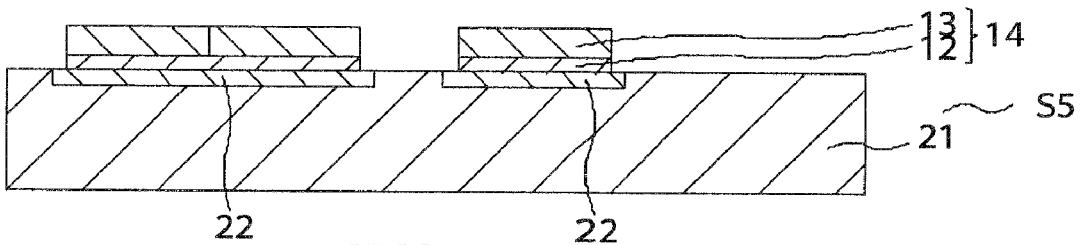
FIG. 6F
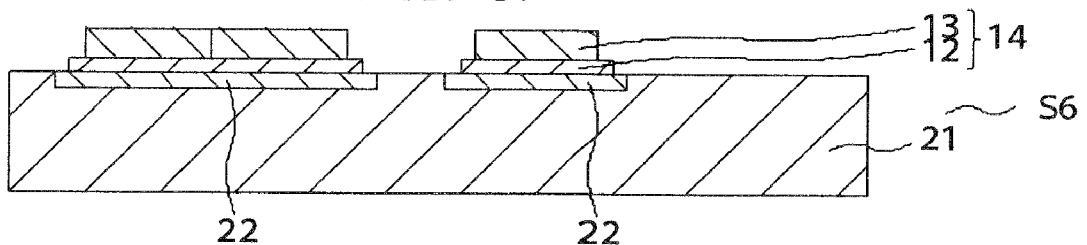

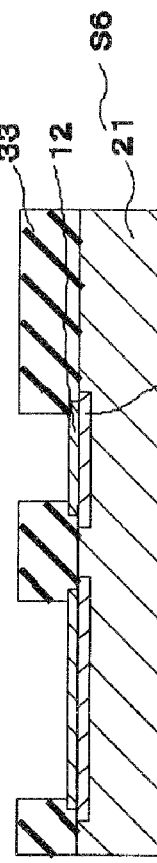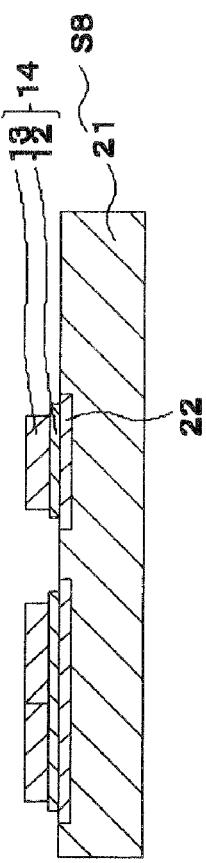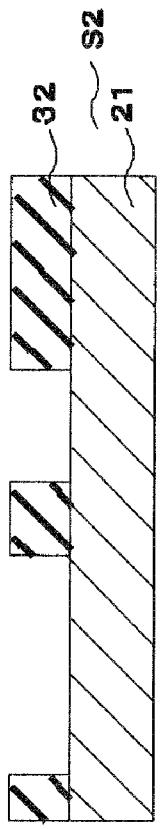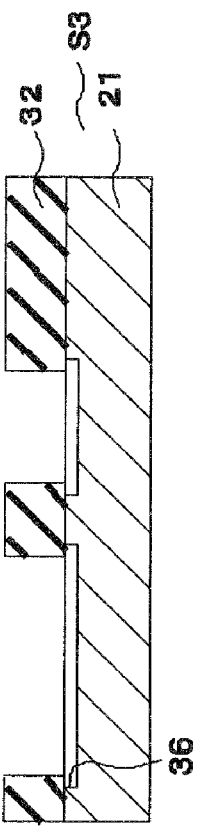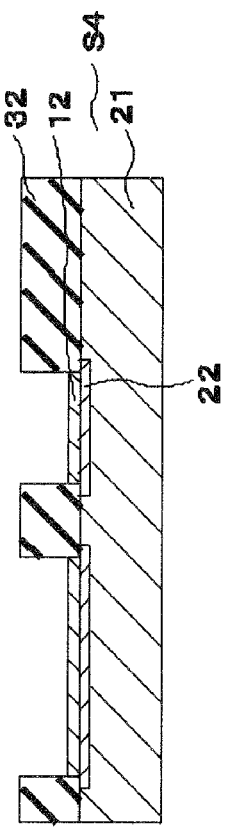

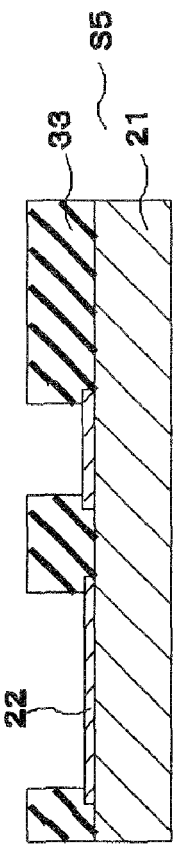
FIG. 16A
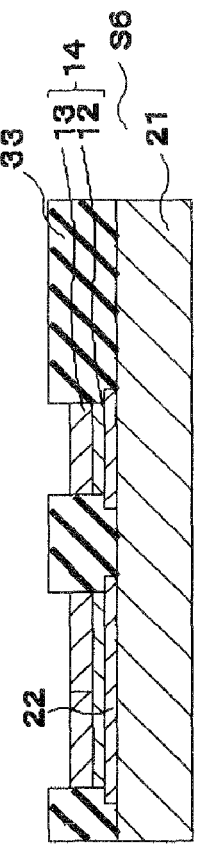
FIG. 16B
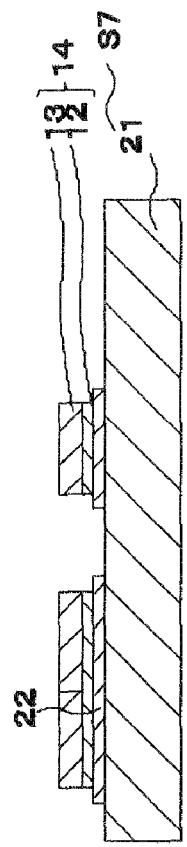
FIG. 16C
FIG. 16D
FIG. 16E
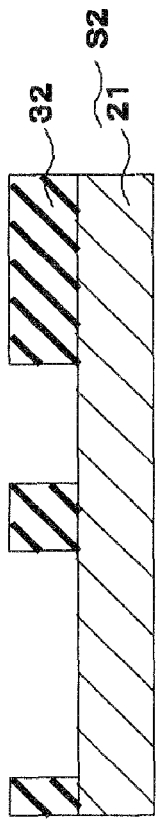
FIG. 16F
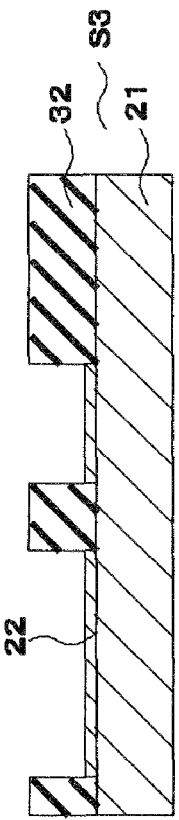
FIG. 16G
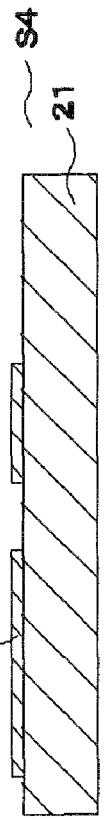

WIRING BOARD, SEMICONDUCTOR DEVICE USING WIRING BOARD AND THEIR MANUFACTURING METHODS

TECHNICAL FIELD

The present invention relates to a wiring board on which a semiconductor element is to be mounted, a semiconductor device formed of a semiconductor element mounted on the wiring board, and their manufacturing methods, and particularly to a thin wiring board excellent in high-speed transmission characteristic and mounting reliability, a semiconductor device using the wiring board, and their manufacturing methods.

BACKGROUND ART

As can be observed from portable devices, electronic devices are now radically advancing toward acquiring a smaller, thinner, and more densely packaged body. Further, improvement in speed and functions of semiconductor elements has increased the number of their terminals, and this requires that a wiring board used for device mounting and semiconductor element mounting should be thinner, lighter, and more suited for dense packaging.

Typical wiring boards have been those that have through holes, such as built-up boards. However, such boards are thick and the through holes make the boards unsuitable for high-speed signal transmission.

Meanwhile, thin boards such as tape substrates have also been used. However, their manufacturing methods allow them to have only one or two wiring layers, and high elasticity of the tape substrates makes them be patterned less positionally accurately than built-up boards are patterned. Because of these factors, those thin boards cannot meet the current demands for highly dense packaging.

To solve these problems, Patent Literature 1 to Patent Literature 3 disclose a method of forming a wired structure on a prepared supporting substrate, and removing the supporting substrate after forming the wired structure, thereby forming a coreless substrate having no through hole.

Patent Literature 1: Unexamined Japanese Patent Application KOKAI Publication No. 2002-83893
Patent Literature 2: Unexamined Japanese Patent Application KOKAI Publication No. 2002-198462
Patent Literature 3: Unexamined Japanese Patent Application KOKAI Publication No. 2006-049819

DISCLOSURE OF INVENTION

Problem to be Solved by the Invention

However, the conventional wiring boards disclosed in Patent Literature 1 to Patent Literature 3 have the following problem. When an electrode embedded in an insulating layer is to be exposed by etching the supporting substrate, the electrode material, which is soluble in the etching solution used, is protected by a metallic material that is insoluble in the used etching solution, but the electrode is etched from its sides by the etching solution that permeates thereinto via the side walls. This side etching limits the size of the wire patterns to be finally formed, making it difficult to meet the demands for them to be miniaturized and densely packaged.

The present invention was made in view of this problem, and an object of the present invention is to provide a wiring board, a semiconductor device using the wiring board, and their manufacturing methods that are reliable and adaptable to miniaturization and highly dense packaging of a wiring layer to be embedded in an insulating layer with effective prevention against side etching in the manufacturing process enabled by a design scheme for the shape of the wiring layer.

Means for Solving the Problem

A wiring board according to the present invention includes: an insulating layer; a plurality of wiring layers formed in such a way as to be insulated from each other by the insulating layer; and a plurality of vias formed in the insulating layer to connect the wiring layers, wherein the wiring layers include a surface wiring layer, which is formed in one surface of the insulating layer, the surface wiring layer including a first metal film exposed from the one surface and a second metal film embedded in the insulating layer and stacked on the first metal film, and the edges of the first metal film project from the edges of the second metal film in a direction in which the second metal film spreads.

An external surface of the first metal film may be located at a position recessed from the one surface of the insulating layer.

The recess in the insulating layer at which the first metal film is formed may have side surfaces that positionally coincide with the edges of the first metal film.

The recess in the insulating layer at which the first metal film is formed may have side surfaces that are located more outward than the edges of the first metal film.

Another wiring board according to the present invention includes: an insulating layer; a plurality of wiring layers insulated from each other by the insulating layer; and a plurality of vias formed in the insulating layer to connect the wiring layers, wherein the wiring layers include surface wiring layers, each of which is formed in one surface of the insulating layer, the surface wiring layer including a first metal film exposed from the one surface and a second metal film embedded in the insulating layer and stacked on the first metal film, the edges of the first metal film positionally coincide with the edges of the second metal film, an external surface of the first metal film is located at a position recessed from the one surface of the insulating layer, and the recess in the insulating layer at which the first metal film is formed has side surfaces that are located more outward than the edges of the first metal film.

The first metal film and the second metal film may be made of the same material.

It is preferred that the first metal film be made of one metal selected from the group consisting of gold, silver, nickel, copper, aluminum, palladium, platinum, rhodium, tin, and solder material, or plural metals selected from the group and stacked together.

It is preferred that the second metal film be made of one metal selected from the group consisting of gold, silver, nickel, copper, aluminum, palladium, platinum, rhodium, tin, and solder material, or plural metals selected from the group and stacked together.

The via may not be connected to a part of the surface wiring layer.

A metal frame may be provided on either surface or both surfaces of the insulating layer.

It is preferred that a second electrode be formed on a surface of the insulating layer opposite to the one surface, a part of the surface wiring layer be used as a first electrode, and a solder resist be formed on either surface or both surfaces of the insulating layer, such that the solder resist have an opening to expose all or a part of the first electrode or the second electrode.

An etching barrier layer and a supporting substrate may be formed on the one surface of the wiring board described above according to the present invention, in an order in which the etching barrier layer is on the one surface.

The etching barrier layer may be formed on the entire surface of the one surface.

The edges of the etching barrier layer may project from the edges of the first metal film in a direction in which the first metal film spreads, or may positionally coincide with the edges of the first metal film.

It is preferred that the supporting substrate be made of a conductive material, or a composite material formed of a conductive material stacked on a surface of an insulating material.

It is preferred that the etching barrier layer be made of a material that is different from the conductive material of the supporting substrate and the material of the first metal film.

It is preferred that a second electrode be formed on a surface of the insulating layer opposite to the one surface, and a solder resist be formed to have an opening to expose all or a part of the second electrode.

A semiconductor device according to the present invention is characterized in that one or a plurality of semiconductor element(s) is/are connected to the wiring board described above.

It is preferred that the semiconductor element(s) and the wiring board be connected by at least one of flip-chip bonding and wire bonding.

A manufacturing method of a wiring board according to the present invention includes: a step of forming an etching barrier layer on a supporting substrate; a step of forming a surface wiring layer by forming a first metal film on the etching barrier layer and stacking a second metal film on the first metal film to be included within the first metal film; a step of forming an insulating layer to cover the supporting substrate, the etching barrier layer, and the surface wiring layers; a step of forming vias in the insulating layer; and a step of forming a second wiring layer on the insulating layer.

The etching barrier layer may be formed on the entire surface of the supporting substrate.

The manufacturing method may include a step of etching the second metal film before the step of forming the insulating layer.

Another manufacturing method of a wiring board according to the present invention includes: a step of forming an etching barrier layer on a supporting substrate; a step of forming a surface wiring layer by forming a first metal film on the etching barrier layer to be included within the etching barrier layer and staking a second metal film on the first metal film; a step of forming an insulating layer to cover the supporting substrate, the etching barrier layer, and the surface wiring layers; a step of forming vias in the insulating layer; and a step of forming a second wiring layer on the insulating layer.

The manufacturing method may include: a step of forming a second electrode on a surface of the insulating layer opposite to a surface in which the surface wiring layer is formed; and a step of forming a solder resist to have an opening to expose all or a part of the second electrode.

Another manufacturing method of a wiring board according to the present invention includes forming a wiring board on both surfaces of a supporting substrate by the manufacturing method of a wiring board described above, and tearing the supporting substrate to obtain two wiring boards.

The manufacturing method may include: a step of removing the supporting substrate; and a step of removing the etching barrier layer.

The supporting substrate may be entirely removed in the step of removing the supporting substrate.

The supporting substrate may be partially left in the step of removing the supporting substrate.

It is preferred that the manufacturing method include, after the step of removing the etching barrier layer, a step of forming a solder resist to have an opening, wherein a part of the surface wiring layer is used as an electrode, and the opening exposes all or a part of the electrode.

A manufacturing method of a semiconductor device according to the present invention includes a step of mounting a semiconductor element on a wiring board that is formed by the manufacturing method of a wiring board described above.

The manufacturing method may include, after the step of mounting the semiconductor element; a step of removing the supporting substrate; and a step of removing the etching barrier layer.

The supporting substrate may be entirely removed in the step of removing the supporting substrate.

The supporting substrate may be partially left in the step of removing the supporting substrate.

It is preferred that the manufacturing method include, after the step of removing the etching barrier layer, a step of forming a solder resist to have an opening, wherein a part of the surface wiring layer is used as an electrode, and the opening exposes all or a part of the electrodes.

According to the manufacturing method of a semiconductor device according to the present invention, it is preferred that the semiconductor element and the wiring board be connected by at least one of flip-chip bonding and wire bonding.

Effects of the Invention

According to the present invention, surface wiring layers formed in one surface of an insulating layer with their surface exposed is formed of a first metal film and a second metal film that are stacked in an order in which the first metal film is closer to the one surface of the insulating layer than the second metal film is, and the edges of the first metal film project from the edges of the second metal film in the direction in which the second metal film spreads. This enables the second metal film to be prevented from side etching in the manufacturing process, and enables wiring boards to be manufactured at a high yield even in a case where minute wires equal to or smaller than 50 μm need to be formed on the wiring boards. Hence, it is possible to stably form even wires that are equal to or smaller than 10 μm, which will be in demand from now.

Since the surface wiring layer formed of the first metal film and the second metal film is embedded in the insulating layer with its surface exposed, it can accept ultrasonical connection manners such as wire bonding while causing less ultrasonic absorption (relaxation) than caused by a wiring structure in which the surface wiring layer protrude from the insulating layer, and can therefore realize stable connection.

Further, since the surface wiring layer is embedded in the insulating layer, stress applied when a semiconductor device on the wiring board is mounted on another substrate or the like can be absorbed by the whole wiring board, which improves secondary mounting reliability.

Since the surface wiring layer is formed of the first metal film that is exposed from the one surface of the insulating layer and the second metal film so that the former film is used as a metal film for connection and the latter film is used as a metal film for reducing wire resistance, the area of the connection electrode can be large, and at the same time the second metal film having a low resistance value can have as large a gap as possible from adjacent patterns, which makes it possible to improve connection reliability and to increase resistance to migration between adjacent patterns. Particularly, in a case where the second metal film is made of copper or silver that tends to migrate, migration that is to occur between minute wires can be delayed.

Further, in the structure where the external surface of the first metal film is located at a position recessed from the one surface of the insulating layer, an effect can be achieved that solder flow is dammed at the time of reflow that accompanies an operation of soldering a semiconductor element such as a flip chip or mounting a solder ball.

The manufacturing method of a wiring board according to the present invention uses the supporting substrate, which suppresses any deformation during the manufacturing process and gives a fine handling ability. Further, the use of the supporting substrate ensures a thick base and can give a higher accuracy in the alignment of the layers than on a thin manufacturing base.

The manufacturing method that manufactures a wiring board on both surfaces of a supporting substrate can double the yield of wiring boards per one supporting substrate and can reduce manufacturing costs.

Furthermore, the manufacturing method of a semiconductor device according to the present invention allows option whether to mount a semiconductor element on the wiring board before removing the supporting substrate that is used in manufacturing the wiring board or to mount a semiconductor element on the wiring board of the present invention in the completed state. In a case where a semiconductor element is to be mounted on the wiring board before such removal of the supporting substrate, the precision in mounting the semiconductor element is so high as to be ready for a narrow pitch, i.e., 50 µm or smaller. On the other hand, in a case where a semiconductor element is mounted on a wiring board from which the supporting substrate has been removed, a thin semiconductor device can be realized. If handling ability during the manufacturing process of a semiconductor device needs to be improved, a partially left supporting substrate can keep rigidity of the wiring board.

BEST MODE FOR CARRYING OUT THE INVENTION

Embodiments of the present invention will be specifically explained below with reference to the attached drawings. To begin with, the first embodiment of the present invention will be explained. FIG. 1 is an exemplary cross-sectional view of a wiring board 101 according to the present embodiment. FIGS. 2A through 2F, FIGS. 3A through 3D, and FIGS. 4A through 4C are exemplary cross-sectional views showing an example of the manufacturing method of the wiring board 101 according to the present embodiment step by step. FIGS. 5A through 5H are exemplary cross-sectional views showing another example of the manufacturing method till the step before FIG. 3A step by step. FIGS. 6A through 6F are exemplary cross-sectional views showing yet another example of the manufacturing method till the step before FIG. 3A step by step. FIGS. 7A through 7H are exemplary cross-sectional views showing still another example of the manufacturing method till the step before FIG. 3A step by step.

As shown in FIG. 1, the wiring board 101 according to the present embodiment has an insulating layer 11, in which a first metal film 12 is embedded with its surface exposed from the lower surface of the insulating layer 11, and in which a second metal film 13 having a similar shape to the first metal film 12 but a smaller area than the first metal film 12 is formed on the first metal film 12. The first metal film 12 and the second metal film 13 form each first wiring layer 14 as a surface wiring layer. The edges of the first metal film 12 project from the edges of the second metal film 12 in the direction in which the second metal film spreads. a Wiring layer 17, electrodes 18, and a solder resist 19 are formed on the surface of the insulating layer 11, and the surface of the electrode 18 is exposed in an opening in the solder resist 19. The first wiring layer 14 and the wiring layer 17 are electrically connected by a via 16, which is formed of a conductive material filled in a via hole 34 formed in the insulating layer 11. This is how the wiring board 101 according to the present embodiment is constructed. The first wiring layer 14 formed to have its surface exposed from the lower surface of the insulation layer 11 may function as a lower electrode of the wiring board.

The insulating layer 11 is made of, for example, a photosensitive or nonphotosensitive organic material. The organic material may be, for example, epoxy resin, epoxy acrylate resin, urethane acrylate resin, polyester resin, phenol resin, polyimide resin, benzocyclobutene (BCB), polybenzoxazole (PBO), polynorbornene resin, or the like, or alternatively, woven or nonwoven fabric made of glass cloth, aramid fiber, or the like and impregnated with epoxy resin, epoxy acrylate resin, urethane acrylate resin, polyester resin, phenol resin, polyimide resin, BCB, PBO, polynorbornene resin or the like. Particularly, polyimide resin, PBO, and the materials using woven or nonwoven fabric have excellent mechanical characteristics such as film strength, modulus of elongation, breaking elongation, etc., and high reliability can therefore be achieved with these materials. In the wiring board 101 according to the present embodiment, the insulating layer 11 may be made of, for example, nonwoven fabric of aramid impregnated with epoxy, and have a thickness of 50 µm at a position where the wiring layer 17 is formed.

When the material of the insulating layer 11 is photosensitive and has a high pattern resolution, the via holes 34 to be formed in the insulating layer 11 can be formed by photolithography to comply with the cross-sectional shape of the via 16. When the material of the insulating layer 11 is nonphotosensitive, or photosensitive but has a low pattern resolution, the via holes 34 can be formed by laser machining, dry etching, or blasting. Alternatively, no via holes 34 may be formed in the insulating layer 11 to form vias 16, if vias 16 are formed by a method that initially forms plated posts at positions where the vias 16 are to be formed, then forms the insulating film 11, and exposes the plated posts by polishing the surface of the insulating film 11.

The first wiring layer 14 is formed of the first metal film 12 and the second metal film 13. The first metal film 12 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds. The second metal film 13 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds, likewise the first metal film 12. The first metal film 12 and the second metal film 13 may be made of the same material. For example, in the wiring board 101 according to the present embodiment, the first metal film 12 may be made of nickel layer having a thickness of 8 µm and gold layer having a thickness of 0.5 µm stacked together in an order by which the gold layer is exposed from the lower surface of the insulating layer 11, and the second metal film 13 may be made of copper layer having a thickness of 18 μm.

The surface shape of the second metal film 13 is similar to the surface shape of the first metal film 12, and the edges of the first metal film 12 project from the edges of the second metal film 12 in the direction in which the second metal film spreads.

It is preferable that the circumference of the second metal film 13 be located 0.1 to 5 μm inward from the circumference of the first metal film 12, and it is more preferable that it be located 0.2 to 2 μm inward.

The wiring layer 17 may be mainly made of at least one selected from the group consisting of copper, gold, nickel, aluminum, silver, and palladium. Using copper is the most preferable in terms of resistance value and costs. Nickel can prevent interface reaction with other materials such as insulating material, and can be used for an inductor or a resistive wire with its magnetic characteristic utilized.

In the wiring board 101 according to the present embodiment, the wiring layer 17 may be made of, for example, copper, and have a thickness of, for example, 18 μm. The wiring layer 17 may be formed by, for example, a subtractive method, a semi-additive method, a full-additive method, or the like. The subtractive method forms a resist of a desired pattern on a copper foil placed on a substrate, etches out unnecessary copper foil, and then peels the resist to obtain the desired pattern. The semi-additive method first forms a power feeding layer by nonelectrolytic plating, sputtering, chemical vapor deposition (CVD), or the like, forms a resist bored into a desired pattern, precipitates metal that originates from electrolytic plating in the resist bores, then removes the resist and etches the power feeding layer to obtain a desired wiring pattern. The full-additive method first makes a nonelectrolytic plating catalyst adsorb onto a substrate, forms a resist pattern, activates the catalyst with the resist left as an insulating film to precipitate metal in the openings of the insulating film by nonelectrolytic plating thereby to form a desired wiring pattern.

The vias 16 to be formed in the insulating layer 11 can be formed, after the via holes 34 are formed in the insulating layer 11, by filling a conductive material in the via holes 34 by electrolytic plating, nonelectrolytic plating, ink jetting, printing, or the like or by making a conductive material conform to the wall surface of the via holes 34. The vias 16 can also be formed simultaneously when the wiring layer 17 is formed, by embedding, in the via holes 34, a conductive material prepared for the formation of the wiring layer.

The electrode 18 is formed on the insulating layer 11 or formed on and beyond the via 16 onto the insulating layer 11, and electrically connected to the first wiring layer 14 through the wiring layer 17 or the via 16. The electrode 18 may be made of, for example, a plurality of metal layers stacked together. For example, it is preferred that the surface of the electrode 18 be made of at least one metal selected from the group consisting of gold, silver, copper, tin, and solder material, or be made of alloy, in consideration of the wettability of a solder ball to be formed on the surface of the electrode 18 or the connectivity of a bonding wire to be formed thereon in a later step in which a semiconductor element or the like is connected to the electrode 18.

The solder resist 19 is formed for protecting the circuit on the surface of the wiring board 101 and for developing flame retardancy. The solder resist 19 may be made of organic material of epoxy series, acrylic series, urethane series, or polyimide series, and may additionally contain an inorganic or organic filler or the like, as needed. In the wiring board 101 according to the present embodiment, the solder resist 19 may be, for example, of a liquid epoxy series, and formed to a thickness of 25 μm.

Further, in the example shown in FIG. 1, an opening in the solder resist 19 is formed to be included within the electrode 18, but it may be larger than shown such that the whole electrode 18 is exposed therein. Further, the electrode 18 may have only its surface that is exposed in the opening in the solder resist 19 made of at least one metal selected from the group consisting of gold, silver, copper, tin, and solder material or alloy. Furthermore, the electrodes 18 may be patterned after the solder resist 19 is patterned, such that the electrodes 18 cover the openings in the solder resist. Still further, the electrode 18 may be formed in the same step as the wiring layer 17. In the wiring board 101 according to the present embodiment, the electrode 18 may be made of, for example, copper layer having a thickness of 18 μm, and further made of, only on the surface that is exposed in the opening in the solder resist 19, nickel layer having a thickness of 5 μm and gold layer having a thickness of 0.5 μm, which are stacked in an order in which the gold layer is the outermost layer. It is also possible to employ the structure obtained by patterning the electrode 18 after patterning the solder resist 19 such that the electrode 18 covers the openings in the solder resist 19.

Next, a manufacturing method of the wiring board 101 according to the present embodiment will be explained. Note that cleaning and heat treatment will be performed between the manufacturing steps as needed.

First, if necessary, wet cleaning, dry cleaning, planarization, roughening, or the like is applied to the surface of a supporting substrate 21, as shown in FIG. 2A (step 1). Preferably, the supporting substrate 21 is made of a conductive material or a material with a conductive film on the surface thereof and has an appropriate rigidity, and may be made of a semiconductor wafer material such as silicon, sapphire, GaAs, or the like, or alternatively, metal, quartz, glass, ceramic, a printed board, or the like. The conductive material or the material of the conductive film may be at least one selected from the group consisting of metals, semiconductor materials, and organic materials having a desired electric conductivity. Specifically, the supporting substrate 21 may be, for example, a copper plate having a thickness of 0.25 mm.

Next, an etching barrier layer 22 is formed on the surface of the supporting substrate 21 as shown in FIG. 2B, by electrolytic plating, nonelectrolytic plating, sputtering, vapor deposition, CVD, printing, or the like (step 2). The etching barrier layer 22 is formed for protecting the first wiring layer 14 from any damage such as side etching when the supporting substrate 21 or the conductive film formed on the surface of the supporting substrate 21 is etched out. The etching barrier layer 22 should be made of a material resistant to the etching solution for etching out the supporting substrate 21 or the conductive film formed on the surface of the supporting substrate 21. For example, the etching barrier layer 22 may be made of at least one selected from the group consisting of gold, silver, nickel, copper, aluminum, palladium, platinum, and rhodium, and as needed, may have a single-layered structure or a stacked-layered structure of metals of different kinds. Specifically, the etching barrier layer 22 may be made of, for example, nickel layer having a thickness of 3 μm.

Next, a plated resist 32 is formed on the etching barrier layer 22 such that openings are formed in the plated resist 32 at positions where the first wiring layer 14 is to be formed, as shown in FIG. 2C (step 3). The plated resist 32 can be formed by depositing a liquid form of the plated resist 32 by spin coating, die coating, curtain coating, alpha coating, printing, or the like, or by depositing a dry film form of the plated resist 32 by laminating, pressing, or the like, then hardening the deposited material by drying or the like, and then patterning the material by photolithography or the like when the plated resist 32 is photosensitive or by laser machining or the like when the plated resist 32 is nonphotosensitive. Specifically, for example, a photosensitive dry film resist having a thickness of 35 μm may be patterned by photolithography.

Then, a stacked film is formed in the openings in the plated resist 32 by stacking the first metal film 12 and the second metal film 13 in this order as shown in FIG. 2D, by electrolytic plating or nonelectrolytic plating (step 4).

First, the first metal film 12 is formed on the surface of the etching barrier layer 22 that is exposed in the openings in the plated resist 32. The first metal film 12 will remain in the lower surface of the wiring board 101 when the supporting substrate 21 and the etching barrier layer 22 are removed, and functions as an electrode to which an external electronic component or the like will be connected. A metal material to form the first metal film 12, which is deposited to contact and cover the etching barrier layer 22, has resistance to the etching solution for etching the etching barrier layer 22 so that the metal(s) deposited or stacked to form the first metal film 12 and also the second metal film can be prevented from side etching when the etching barrier layer 22 is etched out. The first metal film 12 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds. Specifically, for example, nickel layer having a thickness of 8 μm and gold layer having a thickness of 0.5 μm may be stacked as the first metal film 12, in an order in which the gold layer contacts the etching barrier layer 22.

After the first metal film 12 is formed, the second metal film 13 is formed on the exposed surface of the first metal film 12. The second metal film 13 remains in the lower surface of the wiring board 101 together with the first metal film 12 after the supporting substrate 21 and the etching barrier layer 22 are removed, and functions as a principal electric conductor. The second metal film 13 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds, likewise the first metal film 12. Further, the first metal film 12 and the second metal film 13 may be made of the same material. Specifically, for example, copper layer having a thickness of 18 μm may be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 2E (step 5). Here, the surfaces of the first metal film 12 and second metal film 13 that are parallel with the top and bottom surfaces of the supporting substrate 21 have the same circumferential shape as each other.

Next, the second metal film 13 is etched to have a smaller surface shape than that of the first metal film 12 as shown in FIG. 2F (step 6). At this time, the second metal film 13 is etched so that its circumference comes 0.1 to 5 μm more inward, or more preferably, 0.2 to 2 μm more inward than the circumference of the first metal film 12.

The second metal film 13 can be etched based on mixed factors that the etching barrier layer 22 and the first metal film 12 are made of materials resistant to this etching, and that the etching produces an etching rate difference to make the second metal film 13 be etched at a higher rate than that at which the etching barrier layer 22 and the first metal film 12 are etched. The etching may be wet etching, dry etching, blasting, or the like. In a case where the etching of the second metal film 13 is by wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step. Specifically, for example, wet etching may be by an etching solution that dissolves neither nickel in the etching barrier layer 22 nor gold and nickel in the first metal film 12, but dissolves copper in the second metal film 13.

Next, the insulating layer 11 is formed to cover the surface of the supporting substrate 21, the etching barrier layer 22, the first metal film 12, and the second metal film 13 as shown in FIG. 3A (step 7). The insulating layer 11 may be made of, for example, a photosensitive or nonphotosensitive organic material. The organic material may be, for example, epoxy resin, epoxy acrylate resin, urethane acrylate resin, polyester resin, phenol resin, polyimide resin, BCB, PBO, polynorbornene resin, or the like, or alternatively, woven or nonwoven fabric made of glass cloth, aramid fiber, or the like and impregnated with epoxy resin, epoxy acrylate resin, urethane acrylate resin, polyester resin, phenol resin, polyimide resin, BCB, PBO, polynorbornene resin or the like. Particularly, polyimide resin, PBO, and the materials using woven or nonwoven fabric have excellent mechanical characteristics such as film strength, modulus of elongation, breaking elongation, etc., and high reliability can therefore be achieved with these materials. Specifically, the insulating layer 11 may be made of, for example, nonwoven fabric of aramid impregnated with epoxy, and have a thickness of 50 μm at the position where the wiring layer 17 is formed.

The insulating layer 11 can be formed by depositing the material and hardening the material by heat treatment such as drying during or after the deposition. The material can be deposited by spin coating, die coating, curtain coating, alpha coating, printing, or the like if the material is liquid, or by laminating, pressing, or laminating or pressing with a vacuum atmosphere if the material is dry film, copper foil with resin, prepreg, or the like.

Next, via holes 34 are formed in the insulating layer 11 as shown in FIG. 3B (step 8). The via holes 34 can be formed by photolithography, when the insulating layer 11 is made of a photosensitive material having a high pattern resolution. The via holes 34 can be formed by laser machining, dry etching, or blasting, when the insulating layer 11 is made of a nonphotosensitive material, or a photosensitive material having a low pattern resolution. Alternatively, no via holes 34 may be formed in the insulating layer 11 to form vias 16, if vias 16 are formed by a method that initially forms plated posts at positions where the vias 16 are to be formed, then deposits the insulating film 11, and exposes the plated posts by polishing the surface of the insulating film 11. Specifically, for example, the insulating layer 11 may be made of nonwoven fabric of aramid impregnated with epoxy, and the via holes 34 may be formed in the insulating layer 11 by laser machining.

Next, a conductive material is deposited in the via holes 34 to form the vias 16, and the wiring layer 17 and the electrodes 18 are formed as shown in FIG. 3C (step 9). The via 16 can be formed by filling a conductive material in the via hole 34 by electrolytic plating, nonelectrolytic plating, ink jetting, printing, or the like or by making a conductive material conform to the wall surface of the via holes 34. The via 16 can also be formed simultaneously when the wiring layer 17 is formed, by embedding, in the via hole, a conductive material prepared for the formation of the wiring layer. The via 16 may be made of a metal material such as copper, gold, silver, tin, nickel, solder material, and the like, or alloy of these metals. Before the conductive material is deposited in the via hole 34, cleaning may be conducted by wet etching, dry etching, or both of them so that any residue on the bottom of the via hole 34 may be removed.

The wiring layer 17 can be formed by, for example, a subtractive method, a semi-additive method, a full-additive method, or the like. The subtractive method forms a resist of a desired pattern on a copper foil placed on a substrate, etches out unnecessary copper foil, and then peels the resist to obtain the desired pattern. The semi-additive method first forms a power feeding layer by nonelectrolytic plating, sputtering, CVD, or the like, forms a resist bored into a desired pattern, precipitates metal that originates from electrolytic plating in the resist bores, then removes the resist and etches the power feeding layer to obtain a desired wiring pattern. The full-additive method first makes a nonelectrolytic plating catalyst adsorb onto a substrate, forms a resist pattern, activates the catalyst with the resist left as an insulating film to precipitate metal in the openings in the insulating film by nonelectrolytic plating thereby to form a desired wiring pattern. Specifically, the wiring layer 17 may be made of, for example, copper and have a thickness of, for example, 18 μm.

The electrode 18 is formed on the insulating layer 11 or formed on and beyond the via 16 onto the insulating layer 11, and electrically connected to the first wiring layer 14 through the wiring layer 17 or the via 16. The electrode 18 may be made of, for example, a plurality of metal layers stacked together. Specifically, for example, the surface of the electrode 18 may be made of at least one metal selected from the group consisting of gold, silver, copper, tin, and solder material, or be made of alloy, in consideration of the wettability of a solder ball to be formed on the surface of the electrode 18 or the connectivity of a bonding wire to be formed thereon in a later step in which a semiconductor element or the like is connected to the electrode 18.

Next, a solder resist 19 is formed to cover the insulating film 11, the wiring layer 17, and the electrodes 18, and openings are formed in the solder resist 19 at desired positions as shown in FIG. 3D and FIG. 4A (step 10). The solder resist 19 may be made of an organic material of epoxy series, acrylic series, urethane series, or polyimide series, and may additionally contain an inorganic or organic filler or the like, as needed. The solder resist 19 can be formed by depositing the material and hardening the material by heat treatment such as drying. The material can be deposited by spin coating, die coating, curtain coating, alpha coating, printing, or the like if the material is liquid, or by laminating, pressing, or laminating or pressing with a vacuum atmosphere if the material is dry film or the like. Specifically, for example, the solder resist 19 may be made of liquid solder resist of epoxy series, and have a thickness of 25 μm.

In a case where the solder resist 19 is made of a photosensitive organic material having a high pattern resolution, an opening in the solder resist 19 can be formed by photolithography. In a case where the solder resist 19 is made of a nonphotosensitive material or a photosensitive material having a low pattern resolution, an opening in the solder resist 19 can be formed by laser machining, dry etching, or blasting.

In the example shown in FIG. 3D and FIG. 4A, an opening in the solder resist 19 is formed to be included within the electrode 18, but it may be larger than shown such that the whole electrode 18 is exposed therein. The electrode 18 may be formed from copper in the same step as the wiring layer 17 and then openings may be formed in the solder resist 19 so that thereafter at least one metal selected from the group consisting of gold, silver, copper, tin, and solder material or alloy may be deposited on the surface of the electrode 18 that is exposed in the openings in the solder resist 19 thereby to complete the electrode 18. Alternatively, the electrodes 18 may be patterned, after openings are formed in the solder resist 19, such that the pattern covers the openings. Specifically, the electrode 18 can be formed in a manner in which, for example, the wiring layer 17 and the electrode 18 are formed by a semi-additive method that uses nonelectrolytically plated copper layer as a power feeding layer such that the wiring layer 17 and the electrode 18 will be a copper layer having a thickness of 18 μm, and then nickel layer and gold layer are stacked only upon the surface of the electrode 18 that is exposed in the openings in the solder resist 19 in a stacking order in which the gold layer is the outermost layer, such that the nickel layer and the gold layer have a thickness of 5 μm and 0.5 μm.

Next, the supporting substrate 21 is removed as shown in FIG. 4B (step 11). The supporting substrate 21 can be removed by wet etching, dry etching, polishing, or the like, or combination of these. If the supporting substrate 21 has any portion that has weak adhesiveness and is thus easy to peel, such a portion may be removed by peeling, and a treatment by any of wet etching, dry etching, polishing, or the like may be performed or a treatment by combination of these may be performed after the peeling. A protective layer made of resist or tape material may further be formed on a side on which the solder resist 19 is formed.

In a case where the removal of the supporting substrate 21 is by wet etching or dry etching when the supporting substrate 21 is to be removed, if, particularly, the etching volume of the supporting substrate 21 is large and even the surface area of the supporting substrate 21 is large, the etching rate will be uneven inside the supporting substrate 21, and the etching barrier layer 22 and the etching medium will thus keep contact with each other for a period of time that varies from place to place across the supporting substrate 21, which calls for secure prevention against side etching.

Here, since the edges of the etching barrier layer 22 project from the edges of the first metal film 12 in the direction in which the first metal film 12 spreads, the first metal film 12 and the second metal film 13 can be effectively protected from side etching, which ensures stable wiring.

Next, the etching barrier layer 22 is removed as shown in FIG. 4C (step 12). The etching barrier layer 22 is removed by any of wet etching, dry etching, and the like, or by combination of these. As long as the etching barrier layer 22 is thin to remove, even if the first metal film 12 contains any material that might be etched by the etching medium prepared for the etching barrier layer 22, such a material can be saved from being exposed to the etching medium for greatly different periods of time from place to place due to any difference in etching rate. This helps suppress occurrence of damage to the first metal film 12 due to side etching, etc. Further, since the circumference of the second metal film 13 is set 0.1 to 5 μm inward, or more preferably 0.2 to 2 μm inward from the first metal film 12, occurrence of damage to the second metal film 13 due to side etching, etc. can be suppressed.

Here, in a case where the circumference of the second metal film 13 is set, for example, less than 0.1 μm inward from the circumference of the first metal film 12, the second metal film 13 will be etched, and manufacturing the wiring board will thus be unstable. Further, in a case where the difference in shape between the second metal film 13 and the first metal film 12 is larger than 5 µm, the wire cannot have a wire width of 10 µm or smaller, which makes it impossible to adapt the wiring board to miniaturization and highly dense packaging.

The wiring board 101 according to the present embodiment can be formed through steps 1 to 12 described above. In the example shown in FIG. 2 to FIG. 4, there are two levels of wiring layers, but this is not the only case. By repeating steps 7 to 9 shown in FIGS. 3A to 3C, it is possible to stack the insulating layer 11 and the wiring layer 17 alternately to form a wiring board that has three or more levels of wiring layers. Further, the solder resist 19 may not be formed in step 10 shown in FIG. 3D and FIG. 4A, and steps from step 11 may be performed in this state to manufacture a wiring board that has no solder resist 19.

Alternatively, it is possible to form the wiring layer 17, by forming depressions to serve as a wiring pattern in an insulating layer (unillustrated) on which the wiring layer 17 is to be formed, then forming a power feeding layer in the depressions by nonelectrolytic plating, sputtering, CVD, or the like, filling the depressions by nonelectrolytic plating or electrolytic plating, and then polishing the surface to be finished. In this case, it is optional to form a solder resist on the insulating layer (unillustrated) as shown in step 10 of FIG. 3D and FIG. 4A, or not to form the solder resist 19 but perform steps from step 11 in this no resist state to form a wiring board that has no solder resist 19.

Next, another manufacturing method of the wiring board 101 according to the present embodiment will be explained. Note that cleaning and heat treatment will be performed between the manufacturing steps as needed.

First, the same processes as steps 1 to 3 shown in FIGS. 2A to 2C described above are performed in steps 1 to 3 shown in FIGS. 5A to 5C (steps 1 to 3).

Next, a first metal film 12 is formed in openings in a plated resist 32 by electrolytic plating or nonelectrolytic plating as shown in FIG. 5D. The first metal film 12 can be formed in the same manner as the first metal film 12 is formed in step 4 shown in FIG. 2D described above.

Next, the plated resist 32 is removed as shown in FIG. 5E (step 5).

Next, a plated resist 33 is formed to have openings above the surface of the first metal film 12 as shown in FIG. 5F (step 6). The plated resist 33 can be formed by depositing a liquid form of the plated resist 33 by spin coating, die coating, curtain coating, alpha coating, printing, or the like, or by depositing a dry film form of the plated resist 33 by laminating, pressing, or the like, then hardening the deposited material by drying or the like, and then patterning the material by photolithography or the like when the plated resist 33 is photosensitive or by laser machining or the like when the plated resist 33 is nonphotosensitive. Specifically, for example, a photosensitive dry film resist having a thickness of 35 µm may be used and patterned by photolithography.

Here, since a second metal film 13 is to be formed on the surface of the first metal film 12 that is exposed in the openings in the plated resist 33, the openings in the plated resist 33 are formed such that each is located 0.1 to 5 µm inward, or more preferably, 0.2 to 2 µm inward from the circumference of the first metal film 12.

Next, the second metal film 13 is formed by electrolytic plating or nonelectrolytic plating, on the surface of the first metal film 12 that is exposed in the openings in the plated resist 33 as shown in FIG. 5G (step 7). The second metal film 13 can be formed in the same manner as the second metal film 13 is formed in step 4 shown in FIG. 2D described above.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 33 is removed as shown in FIG. 5H (step 8). At this time, as a pretreatment before wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step.

In the steps to follow, the same processes as steps 7 to 12 shown in FIG. 3 and FIG. 4 will be performed. In this way, the wiring board 101 according to the present embodiment can be manufactured. Here, by repeating steps 7 to 9 shown in FIGS. 3A to 3C, it is possible to stack the insulating layer 11 and the wiring layer 17 alternately to form a wiring board that has three or more levels of wiring layers.

Next, yet another manufacturing method of the wiring board 101 according to the present embodiment will be explained. Note that cleaning and heat treatment will be performed between the manufacturing steps as needed.

First, the same process as step 1 shown in FIG. 2A described above is performed in step 1 shown in FIG. 6A (step 1).

Next, a plated resist 32 is formed on the surface of the supporting substrate 21 to have openings at positions where an etching barrier layer 22 and a first wiring layer 14 are to be formed, as shown in FIG. 6B (step 2). The plated resist 32 can be formed in the same manner as the plated resist 32 is formed in step 3 shown in FIG. 2C described above.

Next, while masked by the plated resist 32, the supporting substrate 21 is etched by wet etching, dry etching, or combination of these to form excavations (recesses) 36 as shown in FIG. 6C (step 3). The excavation 36 is formed to have preferably a depth of 0.3 to 10 µm, or more preferably, a depth of 0.5 to 3 µm. If the excavation 36 is formed to have a depth of less than 0.3 µm, it is no different from acid treatment, performed as a pretreatment before ordinary plating, for removing an oxide from the surface of the metal to which plating is to be applied. Further, at this depth, when the metal to make the etching barrier layer 22 is embedded in the excavation 36, it cannot allow the etching barrier layer 22 to show the barrier effect. If the excavation 36 is deeper than 10 µm, the plated resist 32 for enabling miniaturized wiring will highly probably peel off, making stable wiring hard. If the excavation 36 is formed by isotropic etching, the etching barrier layer 22 will substantially widen transversally and can exert an improved barrier function in a step in which the supporting substrate 21 is removed.

Next, an etching barrier layer 22, a first metal film 12, and a second metal film 13 are stacked in this order in the openings in the plated resist 32 by electrolytic plating or nonelectrolytic plating, as shown in FIG. 6D (step 4).

The etching barrier layer 22 can be formed from the same material and in the same manner as the etching barrier layer 22 is formed in step 2 shown in FIG. 2B. Specifically, the excavation 36 is formed to be 3 µm deep, and the etching barrier layer 22 is formed from nickel to be 3 µm thick, so that the surface of the supporting substrate 21 and the surface of the etching barrier layer 22 can be coplanar.

After the etching barrier layer 22 is formed, the first metal film 12 is formed on the surface of the etching barrier layer 22 that is exposed in the openings in the plated resist 32. The first metal film 12 can be formed in the same manner as the first metal film 12 is formed in step 4 shown in FIG. 2D described above. Specifically, for example, as the first metal film 12, nickel layer having a thickness of 8 μm and gold layer having a thickness of 0.5 μm may be stacked in an order in which the gold layer contacts the etching barrier layer 22.

After the first metal film 12 is formed, the second metal film 13 is formed on the exposed surface of the first metal film 12. The second metal film 13 can be formed in the same manner as the second metal film 13 is formed in step 4 shown in FIG. 2D described above. Specifically, for example, copper layer having a thickness of 18 μm may be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 6E (step 5). Here, the surfaces of the first metal film 12 and second metal film 13 that are parallel with the top and bottom surfaces of the supporting substrate 21 have the same circumferential shape as each other.

Next, the second metal film 13 is etched to have a smaller surface shape than that of the first metal film 12 as shown in FIG. 6F (step 6). At this time, the second metal film 13 is etched so that its circumference comes 0.1 to 5 μm more inward, or more preferably, 0.2 to 2 μm more inward than the circumference of the first metal film 12. The second metal film 13 can be etched in the same manner as the second metal film 13 is etched in step 6 shown in FIG. 2F described above. Specifically, for example, the second metal film 13 can be wet-etched by an etching solution that dissolves neither nickel in the etching barrier layer 22 nor gold and nickel in the first metal film 12 but dissolves copper in the second metal film 13.

In the steps to follow, the same processes as steps 7 to 12 shown in FIG. 3 and FIG. 4 will be performed. In this manner, the wiring board 101 according to the present embodiment can be manufactured. Here, by repeating steps 7 to 9 shown in FIGS. 3A to 3C, it is possible to stack the insulating layer 11 and the wiring layer 17 alternately to form a wiring board that has three or more levels of wiring layers. Alternatively, excavations 36 may be preliminary formed in a supporting substrate by pressing, lasing, or the like and the supporting substrate may be prepared by filling the excavations 36 with metal that forms the etching barrier layer 22, so that the step to follow step 2 shown in FIG. 6B performed on the supporting substrate can be step 4 shown in FIG. 6D, in which the first metal film 13 is formed.

Next, still another manufacturing method of the wiring board 101 according to the present embodiment will be explained. Note that cleaning and heat treatment will be performed between the manufacturing steps as needed.

First, in steps 1 to 3 shown in FIGS. 7A to 7C, the same processes as steps 1 to 3 shown in FIGS. 6A to 6C described above are performed (steps 1 to 3).

Next, an etching barrier layer 22 and a first metal film 12 are stacked in this order in openings in the plated resist 32 by electrolytic plating or nonelectrolytic plating, as shown in FIG. 7D (step 4).

The etching barrier layer 22 can be formed from the same material and in the same manner as the etching barrier layer 22 is formed in step 2 shown in FIG. 2B.

After the etching barrier layer 22 is formed, the first metal film 12 is formed on the surface of the etching barrier layer 22 that is exposed in the openings in the plated resist 32. The first metal film 12 can be formed in the same manner as the first metal film 12 is formed in step 4 shown in FIG. 2D described above. Specifically, for example, nickel layer having a thickness of 8 μm and gold layer having a thickness of 0.5 μm can be stacked as the first metal film 12 in an order in which the gold layer contacts the etching barrier layer 22.

Next, the plated resist 32 is removed as shown in FIG. 7E (step 5).

Next, a plated resist 33 is formed to have openings above the surface of the first metal film 12 as shown in FIG. 7F (step 6). The plated resist 33 can be formed in the same manner as the plated resist 33 is formed in step 6 shown in FIG. 5F described above. Specifically, for example, a photosensitive dry film resist having a thickness of 35 μm may be used and patterned by photolithography.

Here, since a second metal film 13 is to be formed on the surface of the first metal film 12 that is exposed in the openings in the plated resist 33, the openings in the plated resist 33 is formed such that each is located 0.1 to 5 μm inward, or more preferably, 0.2 to 2 μm inward from the circumference of the first metal film 12.

Next, a second metal film 13 is formed on the surface of the first metal film that is exposed in the openings in the plated resist 33 by electrolytic plating or nonelectrolytic plating, as shown in FIG. 7G (step 7). The second metal film 13 can be formed in the same manner as the second metal film 13 is formed in step 4 shown in FIG. 2D described above. Specifically, for example, copper layer having a thickness of 18 μm may be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 7H (step 8). At this time, as a pretreatment before wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step.

In the steps to follow, the same processes as steps 7 to 12 shown in FIG. 3 and FIG. 4 will be performed. In this manner, the wiring board 101 according to the present embodiment can be manufactured. Here, by repeating steps 7 to 9 shown in FIGS. 3A to 3C, it is possible to stack the insulating layer 11 and the wiring layer 17 alternately to form a wiring board that has three or more levels of wiring layers.

Through the manufacturing steps, the wiring board 101 according to the present embodiment is formed such that the etching barrier layer 22 functioning as etching barrier and the first metal film 12 have a larger outer shape than that of the second metal film 13 that should be protected from side etching. Therefore, even a minute wire having a wire width of 50 μm or smaller can be formed on the wiring board 101 at a high yield. Accordingly, even a wire having a wire width of 10 μm or smaller, which will be in demand from now on, can be stably manufactured.

Further, since the first metal film 12 of the first wiring layer 14 is used as a metal film for connection and the second metal film 13 is used as a metal film for reducing wire resistance, the area of the connection electrode can be large, and at the same time the second metal film having a low resistance value can have a large gap from adjacent patterns, which makes it possible to improve connection reliability and to increase resistance to migration between adjacent patterns. Particularly, in a case where the second metal film 13 is made of copper or silver that tends to migrate, migration that is to occur between minute wires can be delayed.

Further, since the wiring board 101 according to the present embodiment has the first wiring layer 14, which is made of the first metal film 12 and the second metal film 13, embedded in the insulating layer 11 with the surface of the first wiring layer 14 exposed, it can accept ultrasonical connection manners such as wire bonding while causing less ultrasonic absorption (relaxation) than caused by a wiring structure in which the wiring layer protrudes from the insulating layer 11, and can realize stable connection with consequent less ultrasonic attenuation. Further, since the first wiring layer 14 is embedded in the insulating layer 11, stress applied when the semiconductor device on the wiring board 101 is mounted on another substrate or the like can be absorbed by the whole wiring board 101. Therefore, secondary mounting reliability is improved.

Further, since the manufacturing method of the wiring board according to the present embodiment uses the supporting substrate 21 and stacks layers on the supporting substrate 21 for manufacturing the wiring board, any deformation during the manufacturing process can be suppressed and a fine handling ability can be obtained. Furthermore, the supporting substrate 21 ensures a thick base and can give a higher accuracy in the alignment of the layers than on a thin manufacturing base.

Next, the second embodiment of the present invention will be explained. FIG. 8 is an exemplary cross-sectional view of a wiring board 102 according to the present embodiment. FIGS. 9A through 9E, FIGS. 10A through 10D and FIGS. 11A through 11C are exemplary cross-sectional views showing one example of a manufacturing method of the wiring board 102 according to the present embodiment step by step. FIGS. 12A through 12G are exemplary cross-sectional views showing another example of the manufacturing method till the step before FIG. 11A step by step. In FIG. 8 through FIG. 12, components that are the same as those in FIG. 1 through FIG. 7 will be denoted by the same reference numerals and will not be explained in detail again.

In the first embodiment described above, the first wiring layer 14 is embedded in the insulating layer 11 with its surface exposed, and the surface of the first wiring layer 14 and the lower surface of the insulating layer 11 are coplanar. The present embodiment differs from the first embodiment in that the external surface of the first metal film 12 is located at a position recessed from the lower surface of the insulating layer 11, but is the same as the first embodiment in the other respects.

As shown in FIG. 8, in the wiring board 102 according to the present embodiment, the first metal film 12 is embedded in the insulating layer 11, and the external surface of the first metal film 12 is exposed at a position recessed from the lower surface of the insulating layer 11, thereby a depression 15 is formed as the recess in the insulating layer 11. The depression 15 at which the first metal film is formed has side surfaces that coincide with the edges of the first metal film 13. Further, the insulating layer 11 includes therein a second metal film 13 upon the first metal film 12, which has a similar shape to the first metal film 12 and a smaller area than the first metal film 12. The first metal film 12 and the second metal film 13 form a first wiring layer 14. The edges of the first metal film 12 project from the edges of the second metal film 12 in the direction in which the second metal film spreads. Wiring layer 17, electrodes 18, and a solder resist 19 are formed on the surface of the insulating layer 11, and the surface of the electrode 18 is exposed in openings in the solder resist 19. The first wiring layer 14 and the wiring layer 17 are electrically connected through a via 16 formed in the insulating layer 11. This is the construction of the wiring board 102 according to the present embodiment. The first wiring layer 14 that is formed in the lower surface of the insulating layer 11 with its surface exposed at a position recessed inward from the lower surface of the insulating layer 11 may function as a lower electrode of the wiring board.

The insulating layer 11 may be made of the same material as in the first embodiment. For example, in the wiring board 102 according to the present embodiment, the insulating layer 11 may be made of nonwoven fabric of aramid impregnated with epoxy and have a thickness of 50 μm at the positions where the wiring layer 17 is formed.

The first metal film 12 and second metal film 13 that constitute the first wiring layer 14 may be made of the same materials as in the first embodiment described above. For example, in the wiring board 102 according to the present embodiment, the first metal film 12 may be made of nickel layer having a thickness of 8 μm and gold layer having a thickness of 0.5 μm, which are stacked in an order in which the gold layer is exposed from the lower surface of the insulating layer 11. The second metal film 13 may be made of copper layer having a thickness of 18 μm.

The surface shape of the second metal film 13 is similar to the surface shape of the first metal film 12, and the edges of the first metal film 12 project from the edges of the second metal film 12 in the direction in which the second metal film spreads.

As shown in FIG. 8, the side surfaces of the depression 15 at which the first metal film is formed coincide with the edges of the first metal film 13. It is preferred that the circumference of the second metal film 13 be set 0.1 to 5 μm inward, or more preferably, 0.2 to 2 μm inward from the circumference of the depression 15 and first metal film 12.

The via 16 formed in the insulating layer 11 may be made of the same material as in the first embodiment described above, and formed by the same manufacturing method as in the first embodiment described above.

The wiring layer 17 may be made of the same material as in the first embodiment described above, and formed by the same manufacturing method as in the first embodiment described above. In the wiring board 102 according to the present embodiment, the wiring layer 17 may be made of; for example, copper, and have a thickness of, for example, 18 μm.

The electrode 18 is formed on the insulating layer 11 or on or beyond the via 16 onto the insulating layer 11, and electrically connected to the first wiring layer 14 through the wiring layer 17 or the via 16. The electrode 18 may be made of the same material as in the first embodiment described above.

The solder resist 19 is formed for protecting the circuit on the surface of the wiring board 102 and for developing flame retardancy. The solder resist 19 may be made of the same material as in the first embodiment described above. In the wiring board 102 according to the present embodiment, the solder resist 19 may be made of, for example, liquid solder resist of epoxy series, and have a thickness of 25 μm.

In the example shown in FIG. 8, an opening in the solder resist 119 is formed to be included within the electrode 18, but it may be larger than shown such that the whole electrode 18 is exposed therein. Further, the electrode 18 may have only its surface that is exposed in the openings in the solder resist 19 made of at least one metal selected from the group consisting of gold, silver, copper, tin, and solder material or alloy. Furthermore, the electrodes 18 may be patterned after the solder resist 19 is patterned, such that the electrodes 18 cover the openings in the solder resist 19.

FIG. 8 shows that there are two levels of wiring layers, but this is not the only case. The wiring board may include three or more levels of wiring layers, with the insulating layer 11 and the wiring layer 17 stacked alternately. Further, the wiring board may not include the solder resist 19.

Next, the manufacturing method of the wiring board 102 according to the present embodiment will be explained. Note that cleaning and heat treatment will be performed between the manufacturing steps as needed.

First, in steps 1 and 2 shown in FIGS. 9A and 9B, the same processes as steps 1 and 2 shown in FIGS. 6A and 6B described above are performed (steps 1 and 2).

Next, an etching barrier layer 22, a first metal film 12, and a second metal film 13 are stacked in this order in openings in a plated resist 32 as shown in FIG. 9C, by electrolytic plating or nonelectrolytic plating (step 3).

The etching barrier layer 22 may be formed from the same material and in the same manner as the etching barrier layer 22 is formed in step 2 shown in FIG. 2B.

After the etching barrier layer 22 is formed, the first metal film 12 is formed on the exposed surface of the etching barrier layer 22 in the openings in the plated resist 32. The first metal film 12 can be formed in the same manner as the first metal film 12 is formed in step 4 shown in FIG. 2D described above. Specifically, for example, nickel layer having a thickness of 8 μm and gold layer having a thickness of 0.5 μm may be stacked as the first metal film 12 in an order in which the gold layer contacts the etching barrier layer 22.

After the first metal film 12 is formed, the second metal film 13 is formed on the exposed surface of the first metal film 12. The second metal film 13 can be formed in the same manner as the second metal film 13 is formed in step 4 shown in FIG. 2D described above. Specifically, for example, copper layer having a thickness of 18 μm can be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 9D (step 4). Here, the surfaces of the etching barrier layer 22, first metal film 12, and second metal film 13 that are parallel with the top and bottom surfaces of the supporting substrate 21 have the same circumferential shape as one another.

Next, the second metal film 13 is etched to have a smaller surface shape than that of the first metal film 12 as shown in FIG. 9E (step 5). At this time, the second metal film 13 is etched so that its circumference comes 0.1 to 5 μm more inward, or more preferably, 0.2 to 2 μm more inward than the circumference of the first metal film 12. The second metal film 13 can be etched in the same manner as the second metal film 13 is etched in step 6 shown in FIG. 2F described above. Specifically, for example, the second metal film 13 can be wet-etched by an etching solution that dissolves neither nickel in the etching barrier layer 22 nor gold and nickel in the first metal film 12 but dissolves copper in the second metal film 13.

Next, an insulating layer 11 is formed to cover the surface of the supporting substrate 21, the etching barrier layer 22, the first metal film 12, and the second metal film 13 as shown in FIG. 10A (step 6). The insulating layer 11 can be formed in the same manner as the insulating layer 11 is formed in step 7 shown in FIG. 3A described above. Specifically, for example, the insulating layer 11 may be made of nonwoven fabric of aramid impregnated with epoxy and have a thickness of 50 μm at the positions where the wiring layer 17 is formed.

Next, via holes 34 are formed in the insulating layer 11 as shown in FIG. 10B (step 7). The via holes 34 can be formed in the same manner as the via holes 34 are formed in step 8 shown in FIG. 3B described above. Specifically, for example, nonwoven fabric of aramid impregnated with epoxy may be used as the material of the insulating layer 11 and via holes 34 may be formed therein by laser machining.

Next, a conductive material is deposited in the via holes 34 to form vias 16, and the wiring layer 17 and electrodes 18 are formed as shown in FIG. 10C (step 8). The vias 16 can be formed in the same manner as the vias 16 are formed in step 8 shown in FIG. 3C described above. The wiring layer 17 can also be formed in the same manner as the wiring layer 17 is formed in step 8 shown in FIG. 3C described above. Specifically, for example, the wiring layer 17 may be formed from copper and have a thickness of, for example 18 μm. The electrodes 18 can also be formed in the same manner as the electrodes 18 are formed in step 8 shown in FIG. 3C described above. Specifically, for example, the surface of the electrode 18 may be made of at least one metal selected from the group consisting of gold, silver, copper, tin, and solder material, or made of alloy, in consideration of the wettability of a solder ball to be formed on the surface of the electrode 18 or the connectivity of a bonding wire to be formed thereon when a semiconductor element or the like is connected to the electrode 18.

Next, a solder resist 19 is formed to cover the insulating film 11, the wiring layer 17, and the electrodes 18, and openings are formed in the solder resist 19 at desired positions, as shown in FIG. 10D and FIG. 11A (step 9). The solder resist 19 can be formed in the same manner as the solder resist 19 is formed in step 10 shown in FIG. 3D and FIG. 4A described above. Specifically, for example, the solder resist 19 may be made of liquid solder resist of epoxy series, and have a thickness of 25 μm. Further, the manner of forming openings in the solder resist 19 at desired positions may be the same as the manner of forming openings in the solder resist 19 in step 10 shown in FIG. 3D and FIG. 4A described above.

In the example shown in FIG. 10D and FIG. 11A, an opening in the solder resist 19 is formed to be included within the electrode 18, but it may be larger than shown such that the whole electrode 18 is exposed therein. The electrode 18 may be formed from copper in the same step as the wiring layer 17 and then openings may be formed in the solder resist 19 so that thereafter at least one metal selected from the group consisting of gold, silver, copper, tin, and solder material or alloy may be deposited on the surface of the electrode 18 that is exposed in the openings in the solder resist 19 to complete the electrode 18. Alternatively, the electrodes 18 may be patterned, after openings are formed in the solder resist 19, such that the electrodes 18 cover the openings. Specifically, the electrode 18 can be formed in a manner in which, for example, the wiring layer 17 and the electrode 18 are formed by a semi-additive method that uses nonelectrolytically plated copper layer as a power feeding layer such that the wiring layer 17 and the electrode 18 will be a copper layer having a thickness of 18 μm, and then nickel layer and gold layer are stacked only upon the surface of the electrodes 18 that is exposed in the openings in the solder resist 19 in a stacking order in which the gold layer is the outermost layer, such that the nickel layer having a thickness of 5 μm and the gold layer having a thickness of 0.5 μm.

Next, the supporting substrate 21 is removed as shown in FIG. 11B (step 10). The supporting substrate 21 can be removed in the same manner as the supporting substrate 21 is removed in step 11 shown in FIG. 4B described above.

In a case where the removal of the supporting substrate 21 is by wet etching or dry etching when the supporting substrate 21 is to be removed, if, particularly, the etching volume of the supporting substrate 21 is large and further the surface area of the supporting substrate 21 is large, the etching rate will be uneven inside the supporting substrate 21, and the etching barrier layer 22 and the etching medium will thus keep contact with each other for a period of time that varies from place to place across the supporting substrate 21, which calls for secure prevention against side etching.

Here, since the edges of the etching barrier layer 22 project from the edges of the first metal film 12 in the direction in which the first metal film 12 spreads, the first metal film 12 and the second metal film 13 can be effectively protected from side etching, which ensures stable wiring.

Next, the etching barrier layer 22 is removed as shown in FIG. 11C (step 11). The etching barrier layer 22 can be removed in the same manner as the etching barrier layer 22 shown in FIG. 4C described above is removed. As long as the etching barrier layer 22 is thin to remove, even if the first metal film 12 contains any material that might be etched by the etching medium prepared for the etching barrier layer 22, such a material can be saved from being exposed to the etching medium for greatly different periods of time from place to place due to any difference in etching rate. This helps suppress occurrence of damage to the first metal film 12 due to side etching, etc. Further, since the circumference of the second metal film 13 is set 0.1 to 5 μm inward, or more preferably 0.2 to 2 μm inward from the first metal film 12, occurrence of damage to the second metal film 13 due to side etching, etc. can be suppressed.

Here, in a case where the circumference of the second metal film 13 is set, for example, less than 0.1 μm inward from the circumference of the first metal film 12, the second metal film 13 will be etched, and manufacturing the wiring board will thus be unstable. Further, in a case where the difference in shape between the second metal film 13 and the first metal film 12 is larger than 5 μm, the wire cannot have a wire width of 10 μm or smaller, which makes it impossible to adapt the wiring board to miniaturization and highly dense packaging.

The wiring board 102 according to the present embodiment can be formed through steps 1 to 11 described above. The example shown in FIG. 9 to FIG. 11 shows that there are two levels of wiring layers, but this is not the only case. By repeating steps 6 to 8 shown in FIGS. 10A to 10C, it is possible to stack the insulating layer 11 and the wiring layer 17 alternately to form a wiring board that has three or more levels of wiring layers. Further, the solder resist 19 may not be formed in step 9 shown in FIG. 10D and FIG. 11A, and steps from step 10 may be performed in this state to manufacture a wiring board that has no solder resist 19.

Alternatively, it is possible to form the wiring layer 17, by forming depressions to serve as a wiring pattern in an insulating layer (unillustrated) on which the wiring layer 17 is to be formed, then depositing a power feeding layer in the depressions by nonelectrolytic plating, sputtering, CVD, or the like, filling the depressions by nonelectrolytic plating or electrolytic plating, and then polishing the surface to be finished. In this case, it is optional to form a solder resist on the insulating layer (unillustrated) as shown in step 10 of FIG. 3D and FIG. 4A, or not to form the solder resist 19 but perform steps from step 11 in this no resist state to form a wiring board that has no solder resist 19.

In the example shown in FIG. 10D and FIG. 11A, an opening in the solder resist 19 is formed to be included within the electrode 18, but it may be larger than shown such that the whole electrode 18 is exposed therein. The electrode 18 may be formed from copper in the same step as the wiring layer 17 and then openings may be formed in the solder resist 19 so that thereafter at least one metal selected from the group consisting of gold, silver, copper, tin, and solder material or alloy may be deposited on the surface of the electrode 18 that is exposed in the openings in the solder resist 19 to complete the electrode 18. Alternatively, the electrodes 18 may be patterned, after opening are formed in the solder resist 19, such that the electrodes 18 cover the openings. Specifically, the electrode 18 can be formed in a manner in which, for example, the wiring layer 17 and the electrode 18 are formed by a semi-additive method that uses nonelectrolytically plated copper layer as a power feeding layer such that the wiring layer 17 and the electrode 18 will be a copper layer having a thickness of 18 μm, and then nickel layer and gold layer are stacked only upon the surface of the electrode 18 that is exposed in the openings in the solder resist 19 in a stacking order in which the gold layer is the outermost layer, such that the nickel layer and the gold layer have a thickness of 5 μm and 0.5 μm.

Further, after step 2 shown in FIG. 9B, excavations having a depth of 0.5 to 3 μm may be formed in the supporting substrate 21 with the plated resist 32 used as a mask, before the etching barrier layer 22 is formed. In this case, by depositing the etching barrier layer 22 to be thicker than the depth of the excavation, it is possible to eventually form the depression 15. Further, with this excavation, the etching barrier layer 22 will substantially widen transversally and can exert an improved barrier function in a step in which the supporting substrate 21 is removed. If the excavation is formed to have a depth of less than 0.5 μm, it is no different from acid treatment, performed as a pretreatment before ordinary plating, for removing an oxide from the surface of the metal to which plating is to be applied. If the excavation is deeper than 3 μm, the plated resist 32 for enabling miniaturized wiring will highly probably peel off, making stable wiring hard.

Next, another manufacturing method of the wiring board 102 according to the present embodiment will be explained. Note that cleaning and heat treatment will be performed between the manufacturing steps as needed.

First, in steps 1 and 2 shown in FIGS. 12A and 12B, the same processes as steps 1 and 2 shown in FIGS. 6A and 6B described above are performed (steps 1 and 2).

Next, an etching barrier layer 22 and a first metal film 12 are stacked in this order in openings in the plated resist 32 by electrolytic plating or nonelectrolytic plating as shown in FIG. 12C (step 3).

The etching barrier layer 22 can be formed from the same material and in the same manner as the etching barrier layer 22 is formed in step 2 shown in FIG. 2B.

After the etching barrier layer 22 is formed, the first metal film 12 is formed on the surface of the etching barrier layer 22 exposed in the openings in the plated resist 32. The first metal film 12 can be formed in the same manner as the first metal film 12 is formed in step 4 shown in FIG. 2D described above. Specifically, for example, nickel layer having a thickness of 8 μm and gold layer having a thickness of 0.5 μm may be formed as the first metal film 12 in a stacking order in which the gold layer contacts the etching barrier layer 22.

Next, the plated resist 32 is removed as shown in FIG. 12D (step 4).

Next, a plated resist 33 is formed to have openings above the surface of the first metal film 12 as shown in FIG. 12E (step 5). The plate resist 33 can be formed in the same manner as the plated resist 33 is formed in step 6 shown in FIG. 5F described above. Specifically, for example, a photosensitive dry film resist having a thickness of 35 μm may be used and patterned by photolithography.

Here, since a second metal film 13 is to be formed on the surface of the first metal film 12 that is exposed in the openings in the plated resist 33, the openings in the plated resist 33 are formed such that each is located 0.1 to 5 μm inward, or more preferably, 0.2 to 2 μm inward from the circumference of the first metal film 12.

Next, a second metal film 13 is formed on the surface of the first metal film 12 that is exposed in the openings in the plated resist 33 by electrolytic plating or nonelectrolytic plating, as shown in FIG. 12F (step 6). The second metal film 13 can be formed in the same manner as the second metal film 13 is formed in step 4 shown in FIG. 2D described above. Specifically, for example, copper layer having a thickness of 18 μm can be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 12G (step 7). At this time, as a pretreatment before wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step.

In the steps to follow, the same processes as steps 6 to 11 shown in FIG. 10 and FIG. 11 will be performed. In this way, the wiring board 102 according to the present embodiment can be formed. Here, by repeating steps 6 to 8 shown in FIGS. 10A to 10C, it is possible to stack the insulating layer 11 and the wiring layer 17 alternately to form a wiring board that has three or more levels of wiring layers.

Since the wiring board 102 according to the present embodiment has the first wiring layer 14, which is formed of the first metal film 12 and the second metal film 13, located at a position recessed from the lower surface of the insulating layer 11 with the surface of the first wiring layer 14 exposed, it can achieve an effect that solder flow is dammed at the time of reflow that accompanies an operation of solder-connecting a semiconductor element such as a flip chip or mounting a solder ball. Further, the wiring board 102 can accept ultrasonical connection manners such as wire bonding while causing less ultrasonic absorption (relaxation) than caused by a wiring structure in which the wiring layer protrudes from the insulating layer 11, and can realize stable connection with consequent less ultrasonic attenuation. Further, since the first wiring layer 14 is embedded in the insulating layer 11, stress applied when the semiconductor device on the wiring board 102 is mounted on another substrate or the like can be absorbed by the whole wiring board 102. Therefore, secondary mounting reliability is improved.

Next, the third embodiment of the present invention will be explained. FIG. 13 is an exemplary cross-sectional view of a wiring board 103 according to the present embodiment. FIGS. 14A through 14H are exemplary cross-sectional views showing one example of a manufacturing method of the wiring board 103 according to the present embodiment step by step. In FIG. 13 and FIG. 14, components that are the same as those in FIG. 1 through FIG. 12 will be denoted by the same reference numerals and will not be explained in detail again.

In the second embodiment described above, the side surfaces of the depression coincide with the edges of the first metal film 13. The present embodiment differs from the second embodiment in that the side surfaces of the depression 15 are located more outward than the edges of the first metal film 12, but is the same as the first embodiment in the other respects.

As shown in FIG. 13, in the wiring board 103 according to the present embodiment, the first metal film 12 is embedded in the insulating layer 11, and the external surface of the first metal film 12 is exposed at a position recessed from the lower surface of the insulating layer 11, thereby a depression 15 is formed as the recess in the insulating layer 11. The depression 15 at which the first metal film is formed has side surfaces that are located more outward than the edges of the first metal film 13. Further, the insulating layer 11 includes therein a second metal film 13 upon the first metal film 12, which has a similar shape to the first metal film 12 and a smaller area than the first metal film 12. The first metal film 12 and the second metal film 13 form a first wiring layer 14. The edges of the first metal film 12 project from the edges of the second metal film 12 in the direction in which the second metal film spreads. Wiring layer 17, electrodes 18, and a solder resist 19 are formed on the surface of the insulating layer 11, and the surface of the electrodes 18 is exposed in openings in the solder resist 19. The first wiring layer 14 and the wiring layer 17 are electrically connected through a via 16 formed in the insulating layer 11. This is the construction of the wiring board 103 according to the present embodiment. The first wiring layer 14 that is formed in the lower surface of the insulating layer 11 with its surface exposed at a position recessed inward from the lower surface of the insulating layer 11 may function as a lower electrode of the wiring board.

As shown in FIG. 13, the shape of the depression 15 is similar to the surface shape of the first metal film 12, but larger than the surface shape of the first metal film 12. Therefore, the circumference of the first metal film 12 is located within the depression 15.

The circumference of the first metal film 12 may preferably be located 0.1 to 5 μm inward, or more preferably, 0.2 to 2 μm inward from the circumference of the depression 15. The circumference of the second metal film 13 may preferably be located 0.1 to 5 μm inward, or more preferably, 0.2 to 2 μm inward from the circumference of the depression 15 and first metal film 12.

Next, a manufacturing method of the wiring board 103 according to the present embodiment will be explained. Note that cleaning and heat treatment will be performed between the manufacturing steps as needed.

In steps 1 and 2 shown in FIGS. 14A and 14B, the same processes as steps 1 and 2 shown in FIGS. 6A and 6B described above are performed (steps 1 and 2).

Next, an etching barrier layer 22 is formed in openings in the plated resist 32 by electrolytic plating or nonelectrolytic plating as shown in FIG. 14C (step 3).

The etching barrier layer 22 can be formed from the same material and in the same manner as the etching barrier layer 22 is formed in step 2 shown in FIG. 2B.

Next, the plated resist 32 is removed as shown in FIG. 14D (step 4).

Next, a plated resist 33 is formed to have openings above the surface of the etching barrier layer 22 as shown in FIG. 14E (step 5). The plated resist 33 can be formed in the same manner as the plated resist 33 is formed in step 6 shown in FIG. 5F described above. Specifically, for example, a photosensitive dry film resist having a thickness of 35 μm may be used and patterned by photolithography. At this time, the openings in the plated resist 33 are formed such that each is located 0.1 to 5 μm inward, or more preferably, 0.2 to 2 μm inward from the circumference of the etching barrier layer 22, in order that the first metal film 12 and the second metal film 13 can be formed on the surface of the etching barrier layer 22 that is exposed in the openings. If the opening is formed less than 0.1 μm inward from the circumference of the etching barrier layer 22, the first metal film 12 which should remain, or both the first metal film 12 and the second metal film 13 will be etched in a later step in which the supporting substrate 21 is removed, and manufacturing the wiring board will thus be unstable. Or if this shape difference is larger than 5 μm, the wire cannot have a wire width of 10 μm or smaller, which makes it impossible to adapt the wiring board to miniaturization and highly dense packaging.

Next, the first metal film 12 and the second metal film 13 are formed in this order on the surface of the etching barrier layer 22 in the openings in the plated resist 33 by electrolytic plating or nonelectrolytic plating, as shown in FIG. 14F (step 7). The first metal film 12 can be formed in the same manner as the first metal film 12 is formed in step 4 shown in FIG. 2D described above. Specifically, for example, nickel layer having a thickness of 8 μm and gold layer having a thickness of 0.5 μm may be stacked as the first metal film 12 in an order in which the gold layer contacts the etching barrier layer 22.

After the first metal film 12 is formed, the second metal film 13 is formed on the exposed surface of the first metal film 12. The second metal film 13 can be formed in the same manner as the second metal film 13 is formed in step 4 shown in FIG. 2D described above. Specifically, for example, copper layer having a thickness of 18 μm may be formed as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 33 is removed as shown in FIG. 14G (step 8). At this time, as a pretreatment before wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step.

Next, the second metal film 13 is etched to have a smaller surface shape than that of the first metal film 12 as shown in FIG. 14H (step 6). At this time, the second metal film 13 is etched so that its circumference comes 0.1 to 5 μm more inward, or more preferably, 0.2 to 2 μm more inward than the circumference of the first metal film 12. This makes it possible to suppress occurrence of any damage to the second metal film 13 due to side etching, etc., in a later step in which the etching barrier layer 22 is removed. The second metal film 13 can be etched in the same manner as the second metal film 13 is etched in step 6 shown in FIG. 2F described above. Specifically, for example, the second metal film 13 can be wet-etched by an etching solution that dissolves neither nickel in the etching barrier layer 22 nor gold and nickel in the first metal film 12 but dissolves copper in the second metal film 13. At this time, the second metal film 13 may be intergranularly corroded so that its surface may be roughened.

In the steps to follow, the same processes as steps 7 through 12 shown in FIG. 3 and FIG. 4 will be performed. In this manner, the wiring board 103 according to the present embodiment can be manufactured. Here, by repeating steps 7 to 9 shown in FIGS. 3A to 3C, it is possible to stack the insulating layer 11 and the wiring layer 17 alternately to form a wiring board that has three or more levels of wiring layers.

After step 5 shown in FIG. 14E, step 6 shown in FIG. 14F may be performed in a manner that the first metal film 13 is formed, the plated resist 33 is removed, a plated resist having openings above the surface of the first metal film 13 is formed, and then the second metal film 13 is formed in the openings in the plated resist by electrolytic plating or nonelectrolytic plating. In this case, as a wet etching process after the plated resist is removed, the second metal film 13 to be etched may be intergranularly corroded so that its surface may be roughened. If the surface of the second metal film 13 is roughened, the second metal film 13 can improve its adhesiveness to the insulating layer 11 that is to be stacked thereon in a later step.

Further, after step 2 shown in FIG. 14B, excavations having a depth of 0.5 to 3 μm may be formed in the supporting substrate 21 with the plated resist 32 used as a mask, before the etching barrier layer 22 is formed. In this case, by depositing the etching barrier layer 22 to be thicker than the depth of the excavation, it is possible to eventually form the depression 15. In this case, by depositing the etching barrier layer 22 to be thicker than the depth of the excavation, it is possible to eventually form the depression 15. Further, with this excavation, the etching barrier layer 22 will substantially widen transversally and can exert an improved barrier function in a step in which the supporting substrate 21 is removed. If the excavation is formed to have a depth of less than 0.5 μm, it is no different from acid treatment, performed as a pretreatment before ordinary plating, for removing an oxide from the surface of the metal to which plating is to be applied. If the excavation is deeper than 3 μm, the plated resist 32 for enabling miniaturized wiring will highly probably peel off, making stable wiring hard.

Through the manufacturing process, the wiring board 103 according to the present embodiment is formed such that it can obtain the effect of the wiring board 102 according to the second embodiment, and such that the etching barrier layer 22 is larger than the first metal film 12. Therefore, the wiring board 103 according to the present embodiment can more effectively be prevented from side etching in the step of removing the supporting substrate 21, which enables stable manufacture of the wiring board.

Further, in a later step in which a semiconductor element or the like is connected to the first wiring layer 14 as the lower electrode of the wiring board, the wiring board 103 according to the present embodiment can allow a solder ball to be attached to the entire surface of the first metal film 12, because the side surfaces of the depression 15 are located more outward than the edges of the first metal film 12. Accordingly, the wiring board 103 according to the present embodiment can have a better adhesiveness to the solder ball than can a structure like the wiring board 102 according to the second embodiment, in which the side surfaces of the depression 15 coincide with the edges of the first metal film 13.

Further, in a later step in which a semiconductor element or the like is connected by a wire to the first wiring layer 14 as the lower electrode of the wiring board, the wiring board 103 according to the present embodiment, in which the side surfaces of the depression 15 are located more outward than the edges of the first metal film 12, can protect the insulating layer 11 from being frictioned by the wire bonding jig, because it is more largely opened than is a structure like the wiring board 102 according to the second embodiment, in which the side surfaces of the depression 15 coincide with the edges of the first metal film 13.

Next, the fourth embodiment of the present invention will be explained. FIG. 15 is an exemplary cross-sectional view of a wiring board 104 according to the present embodiment, and FIGS. 16A through 16G are exemplary cross-sectional views showing an example of a manufacturing method of the wiring board 104 according to the present embodiment step by step. In FIG. 15 and FIG. 16, components that are the same as those in FIG. 1 through FIG. 14 will be denoted by the same reference numerals and will not be explained in detail again.

In the third embodiment described above, the edges of the first metal film 12 project from the edges of the second metal film 12 in the direction in which the second metal film spreads. The present embodiment differs from the third embodiment in that the edges of the first metal film 12 positionally coincide with the edges of the second metal film 12, but is the same as the third embodiment in the other respects.

As shown in FIG. 15, in the wiring board 104 according to the present embodiment, the first metal film 12 is embedded in the insulating layer 11 with the external surface of the first insulating film 12 exposed at a position recessed from the lower surface of the insulating layer 11, thereby a depression 15 is formed as the recess in the insulating layer 11. The side surfaces of the depression 15 at which the first metal film is formed are located more outward than the edges of the first metal film 13. The insulating layer 11 further includes therein a second metal film 13 above the first metal film 12. The first metal film 12 and the second metal film 13 form a first wiring layer 14. The position of the edges of the first metal film 12 coincides with the position of the edges of the second metal film 12. Wiring layer 17, electrodes 18, and a solder resist 19 are formed on the surface of the insulating layer 11, and the surface of the electrode 18 is exposed in openings in the solder resist 19. The first wiring layer 14 and the wiring layer 17 are electrically connected through a via 16 formed in the insulating layer 11. This is the construction of the wiring board 104 according to the present embodiment. The first wiring layer 14 that is formed in the lower surface of the insulating layer 11 with its surface exposed at a position recessed inward from the lower surface of the insulating layer 11 may function as a lower electrode of the wiring board.

As shown in FIG. 15, the shape of the depression 15 is similar to the surface shape of the first metal film 12, but larger than the surface shape of the first metal film 12, so the circumference of the first metal film 12 is located within the depression 15.

The circumference of the first metal film 12 may preferably be located 0.1 to 5 μm inward, or more preferably, 0.2 to 2 μm inward from the circumference of the depression 15.

Next, a manufacturing method of the wiring board 104 according to the present embodiment will be explained. Note that cleaning and heat treatment will be performed between the manufacturing steps as needed.

In steps 1 through 7 shown in FIGS. 16A through 16G, the same processes as steps 1 through 7 shown in FIGS. 14A and 14G are performed, likewise in the manufacturing method of the wiring board 103 according to the third embodiment described above (steps 1 through 7).

In the steps to follow, the same processes as steps 7 through 12 shown in FIG. 3 and FIG. 4 are performed. In this manner, the wiring board 104 according to the present embodiment can be manufactured. Here, by repeating steps 7 to 9 shown in FIGS. 3A to 3C, it is possible to stack the insulating layer 11 and the wiring layer 17 alternately to form a wiring board that has three or more levels of wiring layers.

Further, after step 2 shown in FIG. 16B, excavations having a depth of 0.5 to 3 μm may be formed in the supporting substrate 21 with the plated resist 32 used as a mask, before the etching barrier layer 22 is formed. In this case, by depositing the etching barrier layer 22 to be thicker than the depth of the excavation, it is possible to eventually form the depression 15. In this case, by depositing the etching barrier layer 22 to be thicker than the depth of the excavation, it is possible to eventually form the depression 15. Further, with this excavation, the etching barrier layer 22 will substantially widen transversally and can exert an improved barrier function in a step in which the supporting substrate 21 is removed. If the excavation is formed to have a depth of less than 0.5 μm, it is no different from acid treatment, performed as a pretreatment before ordinary plating, for removing an oxide from the surface of the metal to which plating is to be applied. If the excavation is deeper than 3 μm, the plated resist 32 for enabling miniaturized wiring will highly probably peel off, making stable wiring hard.

In a later step in which a semiconductor element or the like is connected to the first wiring layer 14 as the lower electrode of the wiring board, the wiring board 104 according to the present embodiment can allow a solder ball to be attached to the entire surface of the first metal film 12, because the side surfaces of the depression 15 are located more outward than the edges of the first metal film 12. Accordingly, the wiring board 104 according to the present embodiment can improve adhesiveness to the solder ball.

Further, in a later step in which a semiconductor element or the like is connected by a wire to the first wiring layer 14 as the lower electrode of the wiring board, the wiring board 104 according to the present embodiment, in which the side surfaces of the depression 15 are located more outward than the edges of the first metal film 12 and hence the insulating layer 11 is largely opened, can protect the insulating layer 11 from being frictioned by the wire bonding jig.

Next, the fifth embodiment of the present invention will be explained. FIG. 17 is an exemplary cross-sectional view of a wiring board 105 according to the present embodiment, and FIGS. 18A and 18B are exemplary cross-sectional views showing one example of a manufacturing method of the wiring board 105 according to the present embodiment step by step. In FIG. 17 and FIG. 18, components that are the same as those in FIG. 1 through FIG. 16 will be denoted by the same reference numerals, and will not be explained in detail again.

In the first embodiment described above, the wiring board 101 has the solder resist 19 only upon the upper surface of the insulating layer 11. The present embodiment differs from the first embodiment in that it has a solder resist 20 also upon the lower surface of the insulating layer 11, but is the same as the first embodiment in the other respects.

As shown in FIG. 17, the wiring board 105 according to the present embodiment has a solder resist 20 also on the side of the lower surface of the wiring board 101 according to the first embodiment described above, such that the solder resist 20 covers the first wiring layer 14 and the insulating layer 11 but has an opening at a necessary position such as for an electrode.

The solder resist 20 may be made of an organic material of epoxy series, acrylic series, urethane series, or polyimide series, and may additionally contain an inorganic or organic filler or the like as needed. In the wiring board 103 according to the present embodiment, the solder resist 20 may be made of, for example, liquid solder resist of epoxy series, and formed to have a thickness of 15 μm.

The first metal film 12 may be mainly made of at least one selected from the group consisting of gold, silver, nickel, copper, aluminum, palladium, platinum, rhodium, tin, and solder material, and may have a single-layered structure or a stacked-layered structure of metals of different kinds. The outermost surface of the first metal film 12 that is exposed in the openings in the solder resist 20 may preferably be made of at least one of copper, gold, palladium, silver, aluminum, tin, solder material, and the like, which are suitable for connection, or alloy of metals of different kinds.

Next, a manufacturing method of the wiring board 105 according to the present embodiment will be explained. Note that cleaning and heat treatment will be performed between the manufacturing steps as needed. First, the solder resist 20 is formed on the lower surface of the wiring board 101 according to the first embodiment described above shown in FIG. 18A (step 1), such that the solder resist 20 covers the first wiring layer 14 and the insulating layer 11 and has an opening at a necessary position for electrode, etc. as shown in FIG. 18B (step 2). The solder resist 20 can be formed by depositing the material and hardening the material by heat treatment such as drying. The material can be deposited by spin coating, die coating, curtain coating, alpha coating, printing, or the like if the material is liquid, or by laminating, pressing, or laminating or pressing with a vacuum atmosphere if the material is dry film or the like. Specifically, for example, the solder resist 20 may be made of liquid solder resist of epoxy series, and have a thickness of 15 μm.

The opening in the solder resist 20 can be formed by photolithography, in a case where the material of the solder resist 20 is a photosensitive organic material having a high pattern resolution. In a case where the solder resist 20 is made of a nonphotosensitive material or a photosensitive material with a low pattern resolution, the opening in the solder resist 20 can be formed by laser machining, dry etching, or blasting.

After the opening is formed in the solder resist 20, it is optional to deposit metal for connection on the consequently exposed surface of a first wiring layer 14. Further, it is optional to form an electrode pattern, after the solder resist 20 is patterned, such that the electrode covers the opening in the solder resist. Furthermore, it is optional to expose metal for connection by removing the superficial metal from the first wiring layer 14 using the solder resist 20 as a mask.

Alternatively, the first wiring layer 14 may be exposed in a manner that the supporting substrate 21 is removed from the wiring board in the state of step 6 shown in FIG. 6 or step 8 shown in FIG. 7 in the manufacturing method of the wiring board 101, then the solder resist 20 is formed in the state that the etching barrier layer 22 is not removed, and the etching barrier layer 22 that is exposed in the opening in the solder resist 20 is removed with the solder resist 20 used as a mask. Metal for connection may be deposited on the surface of the first wiring layer 14 that is exposed in this manner, or alternatively, an electrode pattern may be formed to cover the opening in the solder resist 20. When the wiring board 105 according to the present embodiment is practically used, the wiring board 105 may not have the solder resist 19 on its top surface.

Alternatively, the solder resist 20 may be formed on the lower surface of the wiring board 102 according to the second embodiment of the present invention, such that the solder resist 20 covers the first wiring layer 14 and the insulating layer 11 but has an opening at a necessary position for electrode, etc.

The wiring board 105 according to the present embodiment can securely attain the effects of the wiring board 101 according to the first embodiment described above and of the wiring board 102 according to the second embodiment, and in addition, an effect as a dam that suppresses solder flow at the time of reflow that accompanies an operation of soldering a semiconductor element such as a flip chip to the lower surface of the wiring board or mounting a solder ball thereto, and at the same time can have an improved wiring density for the first wiring layer 14.

For example, in a case where a wiring board that has a depression 15 in its lower surface likewise the wiring board 102 according to the second embodiment described above cannot be expected to have its depression 15 dam the solder flow due to circumstances in wire routing in an operation of connecting a flip chip or mounting a solder ball, it is preferred that the insulating layer 11 be provided with the solder resist 20 also on its lower surface as in the present embodiment.

Since the solder resists 19 and 20 heavily harden and contract due to their material property, the wiring board easily deforms due to this hardening and contracting. By providing the solder resist 19 and the solder resist 20 on the upper and lower surfaces of the insulating layer 11 respectively, it is possible to balance the hardening and contracting, and to reduce warping of the wiring board 105.

Next, the sixth embodiment of the present invention will be explained. FIG. 19 is an exemplary cross-sectional view of a wiring board 106 according to the present embodiment. FIG. 20A is an exemplary bottom view of the wiring board 101 according to the first embodiment. FIGS. 20B and 20C are exemplary bottom views of the wiring board 106 according to the present embodiment. FIGS. 21A and 21B are exemplary cross-sectional views showing one example of a manufacturing method of the wiring board 106 according to the present embodiment step by step. In FIG. 19 through FIG. 21, components that are the same as those in FIG. 1 through FIG. 18 will be denoted by the same reference numerals and will not be explained in detail again.

The present embodiment differs from the wiring board 101 according to the first embodiment described above in that a metal frame 35 is formed on a portion of the lower surface of the insulating layer 11, but is the same as the first embodiment in the other respects.

As shown in FIG. 19, the wiring board 106 according to the present embodiment additionally has a metal frame 35 on the lower surface of the wiring board 101 according to the first embodiment described above. The metal frame 35 is provided for maintaining rigidity of the wiring board and ability to handle the wiring board while and after the wiring board is manufactured. The metal frame 35 is made of at least one material selected from the group consisting of stainless, iron, nickel, copper, and aluminum.

FIG. 20A is an exemplary bottom view of the wiring board 101 according to the first embodiment. The wiring board 101 is shown as an example textured with an appropriate pattern for mounting a plurality of semiconductor elements. This wiring board 101 can have the metal frame 35 only on its shorter edges as shown in FIG. 20B, or can have the metal frame 35 not only on its shorter edges but also on its longer edges as shown in FIG. 20C.

Next, a manufacturing method of the wiring board 106 according to the present embodiment will be explained. Note that cleaning and heat treatment will be performed between the manufacturing steps as needed. First, the state of the lower surface of the supporting substrate 21 shown in step 10 of FIG. 3D and FIG. 4A in the manufacturing method of the wiring board 101 according to the first embodiment described above is prepared as shown in FIG. 21A (step 1), and a portion of this lower surface that is to remain as the metal frame 35 is masked with at least one of organic material, inorganic material, and metal so that the portion of the supporting substrate 21 that is not masked is removed by any of wet etching, dry etching, blasting, and grinding, or combination of these. After the removal, the mask is removed if necessary (step 2). In a case where the metal frame 35 is to be formed by grinding, no mask needs to be formed. Hence, the metal frame 35 is directly formed on the surface of the insulating layer 11 in which surface the first wiring layer 14 is formed. As for the wiring substrate 106 according to the present embodiment, for example, the metal frame 35 can be directly formed on the surface of the insulating layer 11 by the method described above. For example, in a case where the supporting substrate 21 is a copper layer having a thickness of 0.25 mm and the etching barrier layer 22 is a nickel layer having a thickness of 3 μm, the metal frame 35 is formed of these supporting substrate 21 and etching barrier layer 22.

As an alternative method for providing the metal frame 35, it may be formed separately and joined to the surface of the insulating layer 11 by an adhesive. In this case, the metal frame may be formed not on the lower surface of the wiring board but on the surface on which the solder resist 19 is formed. Or, if necessary, the metal frame 35 may be formed on both the top and the bottom surfaces.

The metal frame 35 may be formed on the edges of the wiring board on which a plurality of semiconductor elements are to be mounted, or on the patterned area where the semiconductor elements are to be mounted.

The metal frame 35 may likewise be formed on the wiring board 102 according to the second embodiment, the wiring board 103 according to the third embodiment, the wiring board 104 according to the fourth embodiment, and the wiring board 105 according to the fifth embodiment.

Since the wiring board 106 according to the present embodiment can attain the effects of the wiring board 101 according to the first embodiment, the wiring board 102 according to the second embodiment, the wiring board 103 according to the third embodiment, the wiring board 104 according to the fourth embodiment, and the wiring board 105 according to the fifth embodiment, and in addition, can impart itself rigidity by the metal frame 35, it is easy to handle the wiring board and easy to control the warping shape thereof. Therefore, the wiring board can be handier to fabricate and more reliable in mounting.

Next, the seventh embodiment of the present invention will be explained. FIG. 22 is an exemplary cross-sectional view of a wiring board 107 according to the present embodiment. In FIG. 22, components that are the same as those in FIG. 1 through FIG. 21 will be denoted by the same reference numerals, and will not be explained in detail again.

As shown in FIG. 22, the wiring board 107 according to the present embodiment has an etching barrier layer 22 on the entire surface of a supporting substrate 21, a first metal film 12 on the etching barrier layer 22, and a second metal film 13 on the first metal film 12 that has a similar shape to the first metal film 12 but a smaller area than the first metal film 12. The first metal film 12 and the second metal film 13 form a first wiring layer 14. The edges of the first metal film 12 project from the edges of the second metal film 12 in the direction in which the second metal film spreads. An insulating layer 11 is formed to cover the etching barrier layer 22 and the first wiring layer 13. Wiring layer 17, electrodes 18, and a solder resist 19 are formed on the surface of the insulating layer 11, and the surface of the electrode 18 is exposed in openings in the solder resist 19. A part of the first wiring layer 14 and a part of the wiring layer 17 are electrically connected through vias 16 formed of a conductor embedded in via holes 34 formed in the insulating layer 11. This is the construction of the wiring board 107 according to the present embodiment.

The supporting substrate 21 may preferably be formed of sheeted foil or plate made of conductive material, or formed of conductive material stacked on the surface of insulating material or metal material having rigidity. The insulating material may be at least one metal selected from the group consisting of stainless, iron, nickel, copper, titanium, manganese, and aluminum. Alternatively, the insulating material may be selected from conductive organic materials, on the condition that the material has a desired conductivity. Specifically, the supporting substrate 21 may be, for example, copper plate having a thickness of 0.25 mm.

The insulating layer 11 may be made of the same material as in the first embodiment described above. For example, in the wiring board 106 according to the present embodiment, the insulating layer 11 may be made of nonwoven fabric of aramid impregnated with epoxy, and have a thickness of 50 μm at the position where the wiring layer 17 is formed.

The etching barrier layer 22 may be made of the same material as in the first embodiment described above. Specifically, for example, it may be a nickel layer having a thickness of 3 μm.

The first metal film 12 and second metal film 13 that form a first wiring layer 14 may be made of the same materials as in the first embodiment described above. For example, in the wiring board 106 according to the present embodiment, the first metal film 12 may be made of nickel layer having a thickness of 8 μm and gold layer having a thickness of 0.5 μm that are stacked in an order in which the gold layer exposed from the lower surface of the insulating layer 11. The second metal film 13 may be made of copper layer having a thickness of 18 μm.

The first wiring layer 14 is embedded in the insulating layer 11 with its surface exposed. The second metal film 13 has a surface shape similar to but smaller than that of the first metal film 12, so the circumference of the second metal film 13 is located within the first metal film 12.

The via 16 to be formed in the insulating layer 11 can be formed, after the via hole 34 is formed in the insulating layer 11, by filling a conductive material in the via hole 34 by electrolytic plating, nonelectrolytic plating, ink jetting, printing, or the like or by making a conductive material conform to the wall surface of the via hole 34. The conductive material may be the same as in the first embodiment described above.

The wiring layer 17 may be formed from the same material and in the same manner as in the first embodiment described above. In the wiring board 106 according to the present embodiment, the wiring layer 17 may be made of, for example, copper, and have a thickness of, for example, 18 μm. In the wiring board 106 according to the present embodiment, a part of the wiring layer 17 is connected to the first wiring layer 14 through the via 16, but the other part of the wiring layer 17 is not connected to the first wiring layer 14.

The electrode 18 is formed on the insulating layer 11 or on and beyond the via 16 onto the insulating layer 11, and electrically connected to the first wiring layer 14 through the wiring layer 17 or the via 16. The electrode 18 may be made of the same material as in the first embodiment described above.

The solder resist 19 is formed for protecting the circuit on the surface of the wiring board 106 and for developing flame retardancy. The solder resist 19 may be made of the same material as in the first embodiment described above. In the wiring board 106 according to the present embodiment, the solder resist 19 may be made of, for example, liquid solder resist of epoxy series, and have a thickness of 25 μm.

In the example shown in FIG. 22, an opening in the solder resist 19 is formed to be included within the electrode 18, but it may be larger than shown such that the whole electrode 18 is exposed therein. Further, the electrode 18 may have only its surface that is exposed in the openings in the solder resist 19 made of at least one metal selected from the group consisting of gold, silver, copper, tin, and solder material or alloy. Furthermore, the electrodes 18 may be patterned after the solder resist 19 is patterned, such that the electrodes 18 cover the openings in the solder resist. Still further, the electrode 18 may be formed in the same step as the wiring layer 17. In the wiring board 106 according to the present embodiment, the electrode 18 may be made of, for example, copper layer having a thickness of 18 μm, and further made of, only on the surface that is exposed in the openings in the solder resist 19, nickel layer having a thickness of 5 μm and gold layer having a thickness of 0.5 μm, which are stacked in an order in which the gold layer is the outermost layer. It is also possible to form the wiring board with no solder resist 19.

Next, a manufacturing method of the wiring board 107 according to the present embodiment will be explained. Note that cleaning and heat treatment will be performed between the manufacturing steps as needed.

The wiring board 107 according to the present embodiment can be manufactured by firstly performing steps 1 through 7 shown in FIGS. 2A through 2F and FIG. 3A in the manufacturing method of the wiring board 101 according to the first embodiment described above, forming via holes 34 in the insulating layer 11 at a position where a part of the first wiring layer 14 is formed, and then filling a conductive material in the via holes 34 by electrolytic plating, nonelectrolytic plating, ink jetting, printing, or the like, or making a conductive material conform to the wall surface of the via holes 34. The conductive material may be the same as in the first embodiment described above.

Next, the manufacturing method performs steps 9 and 10 shown in FIGS. 3C and 3D, thereby obtaining the wiring board 107 according to the present embodiment. Note that the manufacturing method till the step before step 7 shown in FIG. 3A may follow the manner of any of the manufacturing methods shown in FIG. 5 to FIG. 7 described above.

In the wiring board 107 according to the present embodiment, the conductive portions of the etching barrier layer 22 and supporting substrate 21 can be used as GND, because a part of the wiring layer 17 formed on the surface of the insulating layer 11 is connected to the first wiring layer 14 through the vias 16. Further, if the supporting substrate 12 is made of a material having fine heat dissipation performance, heat dissipation will be effective.

Next, the eighth embodiment of the present invention will be explained. FIG. 23 is an exemplary cross-sectional view of a wiring board 108 according to the present embodiment. In FIG. 23 components that are the same as those in FIG. 1 through FIG. 22 will be denoted by the same reference numerals and will not be explained in detail again.

In the seventh embodiment described above, the etching barrier layer 22 is formed on the entire surface of the supporting substrate 21. The present embodiment differs from the seventh embodiment in that an etching barrier layer 22 having the same shape as or a similar shape to but a larger area than the first metal film 12 is formed at a position where it contacts the lower surface of the first wiring layer 14, with a surface of the etching barrier layer 22 exposed to the supporting substrate 21. The present embodiment is the same as the seventh embodiment in the other respects.

As shown in FIG. 23, in the wiring board 108 according to the present embodiment, the etching barrier layer 22 is formed at a position on the supporting substrate 21 where the first metal film 12 is formed, the first metal film 12 is formed on the etching barrier layer 22, and the second metal film 13 having a similar shape to and a smaller area than the first metal film 12 is formed on the first metal film 12. The first metal film 12 and the second metal film 13 form a first wiring layer 14. The edges of the first metal film 12 project from the edges of the second metal film 12 in the direction in which the second metal film spreads. The insulating layer 11 is formed to cover the etching barrier layer 22 and the first wiring layer 13. The wiring layer 17, the electrodes 18, and the solder resist 19 are formed on the surface of the insulating layer 11, and the surface of the electrode 18 is exposed in the openings in the solder resist 19. Some of the first wiring layer 14 and a part of the wiring layer 17 are electrically connected through vias 16 formed of a conductive material embedded in the via holes 34 formed in the insulating layer 11. This is the construction of the wiring board 108 according to the present embodiment.

The supporting substrate 21 may be made of the same material as in the seventh embodiment described above. Specifically, the supporting substrate 21 may be, for example, a copper plate having a thickness of 0.25 mm.

The insulating layer 11 may be made of the same material as in the first embodiment described above. For example, in the wiring board 108 according to the present embodiment, the insulating layer 11 may be made of nonwoven fabric of aramid impregnated with epoxy, and have a thickness of 50 μm at the position where the wiring layer 17 is formed.

The etching barrier layer 22 may be made of the same material as in the first embodiment described above.

The first metal film 12 and second metal material 13 that form the first wiring layer 14 may be made of the same materials as in the first embodiment described above. For example, in the wiring board 108 according to the present embodiment, the first metal film 12 may be made of nickel layer having a thickness of 8 μm and gold layer having a thickness of 0.5 μm that are stacked in an order in which the gold layer is exposed from the lower surface of the insulating layer 11, and the second metal film 13 may be made of copper layer having a thickness of 18 μm.

The first wiring layer 14 is embedded in the insulating layer 11 with its surface exposed. The second metal film 13 has a surface shape that is similar to but smaller than the surface shape of the first metal film 12, so the circumference of the second metal film 13 is located within the first metal film 12.

The via 16 to be formed in the insulating layer 11 may be formed from the same material as in the first embodiment described above and in the same manner as in the seventh embodiment described above.

The wiring layer 17 may be formed from the same material as in the first embodiment described above and in the same manner as in the first embodiment described above. In the wiring board 108 according to the present embodiment, the wiring board 17 may be formed from, for example, copper, and have a thickness of, for example, 18 μm. In the wiring board 108 according to the present embodiment, a part of the wiring layer 17 is connected to the first wiring layer 14 through the via 16 and the other part of the wiring layer 17 is not connected to the first wiring layer 14.

The electrode 18 is formed on the insulating layer 11 or on or beyond the via 16 onto the insulating layer 11, and electrically connected to the first wiring layer 14 through the wiring layer 17 or the via 16. The electrode 18 may be formed from the same material as in the first embodiment described above.

The solder resist 19 is formed for protecting the circuit on the surface of the wiring board 108 and for developing flame retardancy. The solder resist 19 may be made of the same material as in the first embodiment described above. In the wiring board 107 according to the present embodiment, the solder resist 19 may be made of, for example, liquid solder resist of epoxy series, and have a thickness of 25 μm.

In the example shown in FIG. 23, an opening in the solder resist 19 is formed to be included within the electrode 18, but it may be larger than shown such that the whole electrode 18 is exposed therein. Further, the electrode 18 may have only its surface that is exposed in the openings in the solder resist 19 made of at least one metal selected from the group consisting of gold, silver, copper, tin, and solder material or alloy. Furthermore, the electrodes 18 may be patterned after the solder resist 19 is patterned, such that the electrodes 18 cover the openings in the solder resist. Still further, the electrode 18 may be formed in the same step as the wiring layer 17. In the wiring board 108 according to the present embodiment, the electrode 18 may be made of, for example, copper layer having a thickness of 18 μm, and further made of, only on the surface that is exposed in the openings in the solder resist 19, nickel layer having a thickness of 5 μm and gold layer having a thickness of 0.5 μm, which are stacked in an order in which the gold layer is the outermost layer. It is also possible to form the wiring board with no solder resist 19.

Next, a manufacturing method of the wiring board 108 according to the present embodiment will be explained. Note that cleaning and heat treatment will be performed between the manufacturing steps as needed.

The wiring board 108 according to the present embodiment can be manufactured by firstly performing steps 1 through 6 shown in FIGS. 6A through 6F or steps 1 through 8 shown in FIGS. 7A through 7H in the manufacturing method of the wiring board 101 according to the first embodiment described above, then performing step 7 shown in FIG. 3A, forming via holes 34 in the insulating layer 11 at a position where a part of the first wiring layer 14 is formed, and then filling a conductive material in the via holes 34 by electrolytic plating, non-electrolytic plating, ink jetting, printing, or the like, or making a conductive material conform to the wall surface of the via holes 34. The conductive material may be the same as in the first embodiment described above.

Next, the manufacturing method performs steps 9 and 10 shown in FIGS. 3C and 3D, thereby obtaining the wiring board 107 according to the present embodiment.

The etching barrier layer 22 may be filled in the excavations 36 not only by electrolytic plating or nonelectrolytic plating, but also by sputtering, vapor deposition, printing, or the like. Specifically, the excavations 36 are formed to be 3 μm deep, and the etching barrier layer 22 is formed from nickel to be 3 μm thick, so that the surface of the supporting substrate 21 and the surface of the etching barrier layer 22 can be coplanar.

The behavior and effect of the wiring board 108 according to the present embodiment are the same as those of the wiring board 107 described above.

Next, the ninth embodiment of the present invention will be explained. FIG. 24 is an exemplary cross-sectional view of a wiring board 109 according to the present embodiment. In FIG. 24, components that are the same as those in FIG. 1 through FIG. 23 will be denoted by the same reference numerals and will not be explained in detail again.

In the seventh embodiment described above, the etching barrier layer 22 is formed on the entire surface of the supporting substrate 21. The present embodiment differs from the seventh embodiment in that an etching barrier layer 22 having the same shape as or a similar shape to but a larger area than the first metal film 12 is formed at positions where it contacts the lower surface of the first wiring layer 14. The present embodiment is the same as the seventh embodiment in the other respects.

As shown in FIG. 24, in the wiring board 109 according to the present embodiment, the etching barrier layer 22 is formed at a position on the surface of the supporting substrate 21 where the first metal film 12 is to be formed, the first metal film 12 is formed on the etching barrier layer 22, and the second metal film 13 having a similar shape to the first metal film 12 but a smaller area than the first metal film 12 is formed on the first metal film 12. The first metal film 12 and the second metal film 13 form a first wiring layer 14. The edges of the first metal film 12 project from the edges of the second metal film 12 in the direction in which the second metal film spreads. The insulating layer 11 is formed to cover the etching barrier layer 22 and the first wiring layer 13. The wiring layer 17, the electrodes 18, and the solder resist 19 are formed on the surface of the insulating layer 11, and the surface of the electrodes 18 is exposed in the openings in the solder resist 19. A part of the first wiring layer 14 and a part of the wiring layer 17 are electrically connected through the vias 16 formed of a conductive material embedded in the via holes 34 formed in the insulating layer 11. This is the construction of the wiring board 109 according to the present embodiment.

In the example shown in FIG. 24, the surfaces of the etching barrier layer 22 and first metal film 12 that are parallel with the top and bottom surfaces of the supporting substrate 21 have the same circumferential shape as each other, but this is not the only case. The circumferential shape of the etching barrier layer 22 may be larger than that of the first metal film 12, so that the first metal film 12 is included within the etching barrier layer 22. In this case, the first metal film 12 and the second metal film may have the same circumferential shape.

The supporting substrate 21 may be made of the same material as in the seventh embodiment described above. Specifically, the supporting substrate 21 may be, for example a copper plate having a thickness of 0.25 mm.

The insulating layer 11 may be made of the same material as in the first embodiment described above. For example, in the wiring board 109 according to the present embodiment, the insulating layer 11 may be made of nonwoven fabric of aramid impregnated with epoxy, and have a thickness of 50 μm at the position where the wiring layer 17 is formed.

The etching barrier layer 22 may be made of the same material as in the first embodiment described above.

The first metal film 12 and second metal film 13 that form the first wiring layer 14 may be made of the same materials as in the first embodiment described above. For example, in the wiring board 109 according to the present embodiment, the first metal film 12 may be made of nickel layer having a thickness of 8 μm and gold layer having a thickness of 0.5 μm that are stacked in an order in which the gold layer is exposed from the lower surface of the insulating layer 11, and the second metal film 13 may be made of copper layer having a thickness of 18 μm.

The first wiring layer 14 is embedded in the insulating layer 11 with its surface exposed. The second metal film 13 has a surface shape that is similar to but smaller than the surface shape of the first metal film 12, so the circumference of the second metal film 13 is located within the first metal film 12.

The via 16 to be formed in the insulating layer 11 may be made of the same material as in the first embodiment described above, and formed in the same manner as in the seventh embodiment described above.

The wiring layer 17 may be made of the same material as in the first embodiment described above and in the same manner as in the first embodiment described above. In the wiring board 109 according to the present embodiment, the wiring layer 17 may be made of, for example, copper, and have a thickness of, for example, 18 μm. In the wiring board 109 according to the present embodiment, a part of the wiring layer 17 is connected to the first wiring layer 14 through the via 16, but the other part of the wiring layer 17 is not connected to the first wiring layer 14.

The electrode 18 is formed on the insulating layer 11 or on and beyond the via 16 onto the insulating layer 11, and electrically connected to the first wiring layer 14 through the wiring layer 17 or the via 16. The electrode 18 may be made of the same material as in the first embodiment described above.

The solder resist 19 is formed for protecting the circuit on the surface of the wiring board 109 and for developing flame retardancy. The solder resist 19 may be made of the same material as in the first embodiment described above. In the wiring board 108 according to the present embodiment, the solder resist 19 may be made of, for example, liquid solder resist of epoxy series, and have a thickness of 25 μm.

In the example shown in FIG. 24, an opening in the solder resist 19 is formed to be included within the electrode 18, but it may be larger than shown such that the whole electrode 18 is exposed therein. Further, the electrode 18 may have only its surface that is exposed in the openings in the solder resist 19 made of at least one metal selected from the group consisting of gold, silver, copper, tin, and solder material or alloy. Furthermore, the electrodes 18 may be patterned after the solder resist 19 is patterned, such that the electrodes 18 cover the openings in the solder resist. Still further, the electrode 18 may be formed in the same step as the wiring layer 17. In the wiring board 109 according to the present embodiment, the electrode 18 may be made of, for example, copper layer having a thickness of 18 μm, and further made of, only on the surface that is exposed in the openings in the solder resist 19, nickel layer having a thickness of 5 μm and gold layer having a thickness of 0.5 μm, which are stacked in an order in which the gold layer is the outermost layer. It is also possible to form the wiring board with no solder resist 19.

Next, a manufacturing method of the wiring board 109 according to the present embodiment will be explained. Note that cleaning and heat treatment will be performed between the manufacturing steps as needed.

The wiring board 109 according to the present embodiment can be manufactured by firstly performing steps 1 through 5 shown in FIGS. 9A through 9E in the manufacturing method of the wiring board 102 according to the second embodiment described above, then performing step 6 shown in FIG. 10A, forming via holes 34 in the conductive layer 11 at a position where a part of the first wiring layer 14 is formed, and filling a conductive material in the via holes 34 by electrolytic plating, nonelectrolytic plating, ink jetting, printing, or the like, or making a conductive material conform to the wall surface of the via holes 34. The conductive material may be the same as in the first embodiment described above.

Next, the method performs steps 8 and 9 shown in FIGS. 10C and 10D, thereby obtaining the wiring board 109 according to the present embodiment. Note that the manufacturing method till the step before step 6 shown in FIG. 10A may follow any of the manufacturing methods shown in FIG. 12, FIG. 14, and FIG. 16 described above.

The behaviors and effects of the wiring board 109 according to the present embodiment are the same as those of the wiring board 107 described above.

The wiring board according to any embodiment described above may have, at a desired position therein, a capacitor that functions as a noise filter for the circuit. Dielectric to make the capacitor may preferably be metal oxide such as titanium oxide, tantalum oxide, $Al_2O_3$, $SiO_2$, $ZrO_2$, $HfO_2$, $Nb_2O_5$, or the like, perovskite series such as BST($Ba_xSr_{1-x}TiO_3$), PZT($PbZr_xTi_{1-x}O_3$), PLZT($Pb_{1-y}La_yZr_xTi_{1-x}O_3$), or the like, or Bi-series layer compound such as $SrBi_2Ta_2O_9$, or the like, where $0 \leq x \leq 1$, and $0 < y < 1$. Dielectric to make the capacitor may alternatively be organic material mixed with inorganic material or magnetic material.

Alternatively, a capacitor to function as a noise filter for the circuit may be formed by making one or more layers constituting the insulating layer 11 of a material having a dielectric constant of 9 or larger, and forming electrodes that are opposed to each other at desired positions on the first wiring layer 14 and the wiring layer 17 or the electrodes 18, which are located below and above the insulating layer 11. Dielectric to make the capacitor may preferably be metal oxide such as $Al_2O_3$, $ZrO_2$, $HfO_2$, $Nb_2O_5$, or the like, perovskite series such as BST($Ba_xSr_{1-x}TiO_3$), PZT($PbZr_xTi_{1-x}O_3$), PLZT($Pb_{1-y}La_yZr_xTi_{1-x}O_3$), or the like, or Bi-series layer compound such as $SrBi_2Ta_2O_9$, or the like, where $0 \leq x \leq 1$, and $0 < y < 1$. Dielectric to make the capacitor may alternatively be organic material mixed with inorganic material or magnetic material.

Next, the tenth embodiment of the present invention will be explained. The present embodiment relates to a manufacturing method of the wiring board according to the present invention. FIGS. 25A through 25F and FIGS. 26A through 26D are exemplary cross-sectional views showing one example of a manufacturing method of the wiring board according to the present invention step by step. In FIG. 25 and FIG. 26, components that are the same as those in FIG. 1 through FIG. 24 will be denoted by the same reference numerals and will not be explained in detail again.

The manufacturing method of the wiring board according to the present embodiment tears the supporting substrate 21 after forming the etching barrier layer 22, the first wiring layer 14, the insulating layer 11, the vias 16, the wiring layer 17, the electrodes 18, and the solder resist 19 on both surfaces of the supporting substrate 21. Note that cleaning and heat treatment will be performed between the manufacturing steps as needed.

First, if necessary, wet cleaning, dry cleaning, planarization, roughening, or the like is applied to the surfaces of the supporting substrate 21, as shown in FIG. 25A (step 1). Preferably, the supporting substrate 21 is made of a conductive material or a material with a conductive film on the surface thereof and has an appropriate rigidity, and may be made of a semiconductor wafer material such as silicon, sapphire, GaAs, or the like, or alternatively, metal, quartz, glass, ceramic, a printed board, or the like. The conductive material or the material of the conductive film may be at least one selected from the group consisting of metals, semiconductor materials, and organic materials having a desired electric conductivity. Alternatively, since the supporting substrate 21 will be torn in a later step, it may be made of a plurality of plate-like materials that are pasted together or integrated together mechanically by a jig or the like. Still alternatively, the supporting substrate 21 may have a peel-off layer on the interface with the conductive film on the surface thereof or on another portion on the surface thereof, which peel-off layer less strongly bonds to that interface or that portion than to any other interfaces. Specifically, for example, the supporting substrate 21 may be made of a composite material of a printed board, on each surface of which is stacked a layered copper foil made of a thin copper foil having a thickness of 0.002 mm and another copper foil having a thickness of 0.01 mm that are bonded together.

Next, an etching barrier layer 22 is formed on the top and bottom surfaces of the supporting substrate 21 as shown in FIG. 25B, by electrolytic plating, nonelectrolytic plating, sputtering, vapor deposition, CVD, printing, or the like (step 2). The etching barrier layer 22 is formed for protecting the first wiring layer 14 from any damage such as side etching when the supporting substrate 21 or the conductive film formed on the surface of the supporting substrate 21 is etched out. The etching barrier layer 22 should be made of a material resistant to the etching solution for etching out the supporting substrate 21 or the conductive film formed on the surface of the supporting substrate 21. For example, the etching barrier layer 22 may be made of at least one selected from the group consisting of gold, silver, nickel, copper, aluminum, palladium, platinum, and rhodium, and as needed, may have a single-layered structure or a stacked-layered structure of metals of different kinds. Specifically, the etching barrier layer 22 may be made of, for example, nickel layer having a thickness of 3 µm.

Next, a plated resist 32 is formed on the etching barrier layer 22 such that openings are formed in the plated resist 32 at the position where the first wiring layer 14 is to be formed, as shown in FIG. 25C (step 3). The plated resist 32 can be formed by depositing a liquid form of the plated resist 32 by spin coating, die coating, curtain coating, alpha coating, printing, or the like, or by depositing a dry film form of the plated resist 32 by laminating, pressing, or the like, then hardening the deposited material by drying or the like, and then patterning the material by photolithography or the like when the plated resist 32 is photosensitive or by laser machining or the like when the plated resist 32 is nonphotosensitive. Specifically, for example, a photosensitive dry film resist having a thickness of 35 µm may be patterned by photolithography.

Then, a stacked film is formed in the openings in the plated resist 32 by stacking the first metal film 12 and the second metal film 13 in this order as shown in FIG. 25D, by electrolytic plating or nonelectrolytic plating (step 4).

First, the first metal film 12 is formed on the surface of the etching barrier layer 22 that is exposed in the openings in the plated resist 32. The first metal film 12 will remain in the lower surface of the wiring board 101 when the supporting substrate 21 and the etching barrier layer 22 are removed, and functions as an electrode, to which an external electronic component or the like will be connected. A metal material to form the first metal film 12, which is deposited to contact and cover the etching barrier layer 22, has resistance to the etching solution for etching the etching barrier layer 22 so that the metal(s) deposited or stacked as the first metal film 12 and also the second metal film can be prevented from side etching when the etching barrier layer 22 is etched out. The first metal film 12 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds. Specifically, for example, nickel layer having a thickness of 8 µm and gold layer having a thickness of 0.5 µm may be stacked as the first metal film 12, in an order in which the gold layer contacts the etching barrier layer 22.

After the first metal film 12 is formed, the second metal film 13 is formed on the exposed surface of the first metal film 12. The second metal film 13 remains in the lower surface of the wiring board 101 together with the first metal film 12 after the supporting substrate 21 and the etching barrier layer 22 are removed, and functions as a principal electric conductor. The second metal film 13 may be mainly made of at least one selected from the group consisting of gold, silver, nickel, copper, aluminum, palladium, platinum, rhodium, tin, and solder material, and as needed, may have a single-layered structure or a stacked-layered structure of metals of different kinds, likewise the first metal film 12. Further, the first metal film 12 and the second metal film 13 may be made of the same material. Specifically, for example, copper layer having a thickness of 18 µm may be deposited as the second metal film 13.

The etching barrier layer 22, the first metal film 12, and the second metal film 13 may be made of materials that are selected in relation with one another to meet the purpose of each film. Each of them may be formed as a single-layered structure or a pluri-layered structure.

Next, the plated resist 32 is removed as shown in FIG. 25E (step 5). Here, the surfaces of the first metal film 12 and second metal film 13 that are parallel with the top and bottom surfaces of the supporting substrate 21 have the same circumferential shape as each other.

Next, the second metal film 13 is etched to have a smaller surface shape than that of the first metal film 12 as shown in FIG. 25F (step 6). At this time, the second metal film 13 is etched so that its circumference comes 0.1 to 5 µm more inward, or more preferably, 0.2 to 2 µm more inward than the circumference of the first metal film 12.

The second metal film 13 can be etched based on mixed factors that the etching barrier layer 22 and the first metal film 12 are made of materials resistant to this etching, and that the etching produces an etching rate difference to make the second metal film 13 be etched at a higher rate than that at which the etching barrier layer 22 and the first metal film 12 are etched. The etching may be wet etching, dry etching, blasting, or the like. In a case where the etching of the second metal film 13 is by wet etching, the second metal film 13 to be etched may be intergranularly corroded so that its surface may be roughened. If the surface of the second metal film 13 is roughened, the second metal film 13 can improve its adhesiveness to the insulating layer 11 that is to be deposited thereon in a later step. Specifically, for example, wet etching may be by an etching solution that dissolves neither nickel in the etching barrier layer 22 nor gold and nickel in the first metal film 12, but dissolves copper in the second metal film 13.

Next, the insulating layer 11 is formed to cover the surface of the supporting substrate 21, the etching barrier layer 22, the first metal film 12, and the second metal film 13 as shown in FIG. 26A (step 7). The insulating layer 11 may be made of, for example, a photosensitive or nonphotosensitive organic material. The organic material may be, for example, epoxy resin, epoxy acrylate resin, urethane acrylate resin, polyester resin, phenol resin, polyimide resin, BCB, PBO, polynorbornene resin, or the like, or alternatively, woven or nonwoven fabric made of glass cloth, aramid fiber, or the like and impregnated with epoxy resin, epoxy acrylate resin, urethane acrylate resin, polyester resin, phenol resin, polyimide resin, BCB, PBO, polynorbornene resin or the like. Particularly, polyimide resin, PBO, and the materials using woven or nonwoven fabric have excellent mechanical characteristics such as film strength, modulus of elongation, breaking elongation, etc., and high reliability can therefore be achieved with these materials. Specifically, the insulating layer 11 may be made of, for example, nonwoven fabric of aramid impregnated with epoxy, and have a thickness of 50 µm at the position where the wiring layer 17 is formed.

The insulating layer 11 can be formed by depositing the material and hardening the material by heat treatment such as drying during or after the deposition. The material can be deposited by spin coating, die coating, curtain coating, alpha coating, printing, or the like if the material is liquid, or by laminating, pressing, or laminating or pressing with a vacuum atmosphere if the material is dry film, copper foil with resin, prepreg, or the like.

Next, via holes 34 are formed in the insulating layer 11 as shown in FIG. 26B (step 8). The via holes 34 can be formed by photolithography, when the insulating layer 11 is made of a photosensitive material having a high pattern resolution. The via holes 34 can be formed by laser machining, dry etching, or blasting, when the insulating layer 11 is made of a nonphotosensitive material, or a photosensitive material having a low pattern resolution. Alternatively, no via holes 34 may be formed in the insulating layer 11 to vias 16, if vias 16 are formed by a method that initially forms plated posts at positions where the vias 16 are to be formed, then deposits the insulating film 11, and exposes the plated posts by polishing the surface of the insulating film 11. Specifically, for example, the insulating layer 11 may be made of nonwoven fabric of aramid impregnated with epoxy, and the via holes 34 may be formed in the insulating layer 11 by laser machining.

Next, a conductive material is deposited in the via holes 34 to form the vias 16, and the wiring layer 17 and the electrodes 18 are formed as shown in FIG. 26C (step 9). The via 16 can be formed by filling a conductive material in the via hole 34 by electrolytic plating, nonelectrolytic plating, ink jetting, printing, or the like or by making a conductive material conform to the wall surface of the via hole 34. The via 16 can also be formed simultaneously when the wiring layer 17 is formed, by embedding, in the via hole, a conductive material prepared for the formation of the wiring layer. The via 16 may be made of a metal material such as copper, gold, silver, tin, nickel, solder material, and the like, or alloy of these metals. Before the conductive material is deposited in the via hole 34, cleaning may be conducted by wet etching, dry etching, or both of them so that any residue on the bottom of the via hole 34 may be removed.

The wiring layer 17 can be formed by, for example, a subtractive method, a semi-additive method, a full-additive method, or the like. The subtractive method forms a resist of a desired pattern on a copper foil placed on a substrate, etches out unnecessary copper foil, and then peels off the resist to obtain the desired pattern. The semi-additive method first forms a power feeding layer by nonelectrolytic plating, sputtering, CVD, or the like, forms a resist bored into a desired pattern, precipitates metal that originates from electrolytic plating in the resist bores, then removes the resist and etches the power feeding layer to obtain a desired wiring pattern. The full-additive method first makes a nonelectrolytic plating catalyst adsorb onto a substrate, forms a resist pattern, activates the catalyst with the resist left as an insulating film to precipitate metal in the openings in the insulating film by nonelectrolytic plating thereby to form a desired wiring pattern. Specifically, the wiring layer 17 may be made of, for example, copper and have a thickness of, for example, 18 μm.

The electrode 18 is formed on the insulating layer 11 or formed on and beyond the via 16 onto the insulating layer 11, and electrically connected to the first wiring layer 14 through the wiring layer 17 or the via 16. The electrode 18 may be made of, for example, a plurality of metal layers stacked together. Specifically, for example, the surface of the electrode 18 may be made of at least one metal selected from the group consisting of gold, silver, copper, tin, and solder material, or be made of alloy, in consideration of the wettability of a solder ball to be formed on the surface of the electrode 18 or the connectivity of a bonding wire to be formed thereon in a later step in which a semiconductor element or the like is connected to the electrode 18.

Next, a solder resist 19 is formed to cover the insulating film 11, the wiring layer 17, and the electrodes 18, and openings are formed in the solder resist 19 at desired positions as shown in FIG. 26D (step 10). The solder resist 19 may be made of an organic material of epoxy series, acrylic series, urethane series, or polyimide series, and may additionally contain an inorganic or organic filler or the like, as needed, The solder resist 19 can be formed by depositing the material and hardening the material by heat treatment such as drying. The material can be deposited by spin coating, die coating, curtain coating, alpha coating, printing, or the like if the material is liquid, or by laminating, pressing, or laminating or pressing with a vacuum atmosphere if the material is dry film or the like. Specifically, for example, the solder resist 19 may be made of liquid solder resist of epoxy series, and have a thickness of 25 μm.

In a case where the solder resist 19 is made of a photosensitive organic material having a high pattern resolution, openings in the solder resist 19 can be formed by photolithography. In a case where the solder resist 19 is made of a nonphotosensitive material or a photosensitive material having a low pattern resolution, openings in the solder resist 19 can be formed by laser machining, dry etching, or blasting.

In the example shown in FIG. 26D, an opening in the solder resist 19 is formed to be included within the electrode 18, but it may be larger than shown such that the whole electrode 18 is exposed therein. The electrode 18 may be formed from copper in the same step as the wiring layer 17 and then openings may be formed in the solder resist 19, so that thereafter at least one metal selected from the group consisting of gold, silver, copper, tin, and solder material or alloy may be deposited on the surface of the electrode 18 that is exposed in the openings in the solder resist 19 to complete the electrode 18. Alternatively, the electrodes 18 may be patterned, after openings are formed in the solder resist 19, such that the electrodes 18 cover the openings. Specifically, the electrode 18 can be formed in a manner in which, for example, the wiring layer 17 and the electrode 18 are formed by a semi-additive method that uses nonelectrolytically plated copper layer as a power feeding layer such that the wiring layer 17 and the electrode 18 will be a copper layer having a thickness of 18 μm, and then nickel layer and gold layer are stacked only upon the surface of the electrode 18 that is exposed in the opening in the solder resist 19 in a stacking order in which the gold layer is the outermost layer, such that the nickel layer and the gold layer have a thickness of 5 μm and 0.5 μm.

After step 10 shown in FIG. 26D, the supporting substrate 21 is torn. Tearing is by breaking the supporting substrate 21 at a desired position by a slicer, a water cutter, or the like. If the supporting substrate 21 has a pasted portion only on the edges thereof, it is torn by breaking the pasted portion. In a case where the supporting substrate 21 has an interface having a weak adhesiveness, it is torn by mechanically peeling off the interface. In a case where the supporting substrate 21 is an integrated body formed by a jig or the like, it is torn by releasing the jig.

After the supporting substrate 21 is torn into two units, step 1 shown in FIG. 4B and then step 12 shown in FIG. 4C in the manufacturing method according to the first embodiment described above are performed, thereby the wiring board 101 according to the first embodiment can be obtained.

Though the present embodiment explains the manufacturing method of the wiring board 101 according to the first embodiment, the manufacturing method of the wiring board according to the present embodiment can be applied to the manufacturing methods of the wiring boards 102 to 109 according to the second embodiment to the ninth embodiment. The example shown in FIG. 25 and FIG. 26 shows that there are two levels of wiring layers, but this is not the only case. By repeating steps 7 to 9 shown in FIGS. 3A to 3C in the manufacturing method of the wiring board 101 according to the first embodiment described above, it is possible to stack the insulating layer 11 and the wiring layer 17 alternately to form a wiring board that has three or more levels of wiring layers. The wiring layer 17 may also be formed by a method that forms depressions or a wiring pattern in an insulating layer (unillustrated) on which the wiring layer 17 is to be formed, then forms a power feeding layer in the depressions by nonelectrolytic plating, sputtering, CVD, or the like, fills the depressions by nonelectrolytic plating or electrolytic plating, and then polishes the surface to be finished.

Since the manufacturing method of the wiring board according to the present embodiment can manufacture wiring boards on both surfaces of the supporting substrate 21, the yield from one supporting substrate 21 can be doubled and the manufacturing costs can be reduced.

Next, the eleventh embodiment of the present invention will be explained. FIG. 27 is an exemplary cross-sectional view of a semiconductor device 111 according to the present embodiment. FIGS. 28A and 28B are exemplary cross-sectional views showing one example of a manufacturing method of the semiconductor device 111 according to the present embodiment step by step. In FIG. 27 and FIG. 28, components that are the same as those in FIG. 1 through FIG. 26 will be denoted by the same reference numerals and will not be explained in detail again.

As shown in FIG. 27, the semiconductor device 11 according to the present embodiment is formed of the wiring board 101 according to the first embodiment described above, and a semiconductor element 23 that is flip-chip bonded via solder balls 25 to the electrodes 18 of the wiring board 101, with underfill 26 applied in this bonding site.

The semiconductor element 23 has connection electrodes 24 on its surface, and the connection electrodes 24 and the electrodes 18 of the wiring board 101 are electrically connected via the solder balls 25. The underfill 26 is applied in the space between the semiconductor element 23 and the wiring board 101.

The solder ball 25 is a minute ball made of a solder material, and formed on the connection electrode 24 of the semiconductor element 23 by plating, ball transferring, printing, or the like. The material of the solder ball 25 can be appropriately selected from eutectic solder of lead and tin and lead-free solder materials. The example of FIG. 27 and FIG. 28 shows that the semiconductor element 23 is flip-chip bonded to the wiring board 101 via the solder balls 25, but this is not the only case. The semiconductor element 23 and the wiring board 101 may be electrically connected via metal bump, conductive paste, conductive organic material, organic material containing a conductive filler, or the like.

The underfill 26 is made of a material of epoxy series, and filled after the semiconductor element 23 is connected to the electrodes 18 via the solder balls 25. The underfill 26 is applied for reducing the difference in coefficient of thermal expansion between the semiconductor element 23 and the wiring board 101 so that this difference may not break the solder balls 25. If the solder balls 25 have a strength that ensures desired reliability, the underfill 26 needs not necessarily be applied.

Next, a manufacturing method of the semiconductor device 111 according to the present embodiment will be explained.

First, the semiconductor element 23 is bonded to the electrodes 18 of the wiring board 101 via the solder balls 25 as shown in FIG. 28A (step 1). The solder balls 25 are formed on the connection electrodes 24 on the surface of the semiconductor element 23, by printing, plating, ball transferring, ink jetting, or the like. The solder balls 25 may alternatively be formed on the electrodes 18 on the wiring board 101 by the same method. In a case where a semiconductor element 23 that has solder balls 25 on the connection electrodes 24 is used, a spare solder may be formed on the electrodes 18. In a case where flux is used for bonding the solder balls 25, it may be washed away after the bonding.

Next, the underfill 26 is applied in the gap between the semiconductor element 23 and the wiring board 101 as shown in FIG. 28B (step 2). In this manner, the semiconductor device 110 according to the present embodiment can be obtained. Here, if the solder balls 25 have a strength that ensures desired reliability, the underfill 26 may not be applied.

The manufacturing method of the semiconductor device 111 according to the present embodiment described above has explained a case that the semiconductor element 23 is mounted on the wiring board 101, but this is not the only case. The semiconductor element 23 may be mounted in a step before the supporting substrate 21 is removed in the manufacturing method of the wiring board 101 according to the first embodiment described above. In this case, the step of removing the supporting substrate 21 and the etching barrier layer 22 is performed after the semiconductor element 23 is mounted. Therefore, for the semiconductor element 23 to be protected when the supporting substrate 21 and the etching barrier layer 22 are removed, a cover made of organic material or metal material may be formed, or the semiconductor element 23 may be covered with mold resin.

In the example shown in FIG. 27, no particular element is connected to the first wiring layer 14. However, a solder ball or a metallic pin to function as an external terminal may be attached thereto, or another semiconductor element or electronic component may be mounted thereon. If the wiring board has insufficient rigidity at its region on which the semiconductor element 23 of the semiconductor device 111 according to the present embodiment is not mounted, a frame member that uncovers the region of the semiconductor element 23 may be joined to the wiring board or such an insufficiently rigid region may be covered with mold resin.

The present embodiment can obtain a semiconductor device 111 that includes a wiring board having a stable fine wiring pattern. Further, since an external terminal is embedded in the insulating layer 11 as embodied by the first wiring layer 14, stress applied when the semiconductor device 11 on the wiring board is mounted on another substrate or the like can be absorbed by the whole wiring board. Therefore, secondary mounting reliability is improved.

The semiconductor device 111 according to the present embodiment is explained as an example where the semiconductor element 23 is mounted on the wiring board 101, but this is not the only case. The semiconductor element 23 may be mounted on the wiring board according to the second through the ninth embodiments described above. In a case where the semiconductor element 23 is mounted on the wiring board according to the seventh through the ninth embodiments, heat dissipation can be effected by the supporting substrate 21. The wiring board may not necessarily be mounted with only one semiconductor element 23 but with a plurality of semiconductor elements 23, or further with components such as a capacitor, a resistor, and the like.

Next, the twelfth embodiment of the present invention will be explained. FIG. 29 is an exemplary cross-sectional view of a semiconductor device 112 according to the present embodiment. In FIG. 29, components that are the same as those in FIG. 1 through FIG. 28 will be denoted by the same reference numerals and will not be explained in detail again.

As shown in FIG. 29, the semiconductor device 112 according to the present embodiment is formed of the wiring board 105 according to the fifth embodiment described above, and a semiconductor element 23 that is flip-chip bonded via a semiconductor ball 25 to the first wiring layer 14 of the wiring board 105, with underfill 26 applied in this bonding site.

The semiconductor element 23 has a connection electrode 24 on its surface, and the connection electrode 24 and the first wiring layer 14 are electrically connected via the solder ball 25. The underfill 26 is applied in the space between the semiconductor element 23 and the wiring board 105. The underfill 26 is made of a material of epoxy series, and is filled in the space after the semiconductor element 23 is bonded to the first wiring layer 14 via the solder ball 25. As long as the solder ball 25 has a strength that ensures desired reliability, the underfill 26 needs not be applied. The example shown in FIG. 29 shows that the semiconductor element 23 is flip-chip bonded to the wiring board 105 via the solder ball 25, but this is not the only case. The semiconductor element 23 and the wiring board 105 may be electrically connected via a metal bump, conductive paste, conductive organic material, organic material containing a conductive filler, or the like.

The semiconductor device 112 according to the present embodiment is an example where the semiconductor element 23 is mounted on the wiring board 105, but this is not the only case. In a case where the first wiring layer 14 is formed only at the position at which the solder ball 25 is to be bonded, or in case where the amount of solder flow is controllable, the solder resist 20 may not be provided. This means that the semiconductor element 23 can be mounted on the first wiring layer 14 of the wiring boards 101 through 104 or of the wiring boards 106 through 109. Since the underfill 26 and the insulating layer 11 bond more strongly than the solder resist 20 and the underfill 26 bond, the omission of the solder resist 20 improves reliability of the semiconductor device over a long span.

In the example shown in FIG. 29, no particular element is connected to the electrodes 18. However, a solder ball or a metallic pin to function as an external terminal may be attached thereto, or another semiconductor element or electronic component may be mounted thereon. If the wiring board has insufficient rigidity at its region on which the semiconductor element 23 of the semiconductor device 111 according to the present embodiment is not mounted, a frame member that uncovers the region of the semiconductor element 23 may be joined to the wiring board or such an insufficiently rigid region may be covered with mold resin.

The present embodiment can obtain high reliability in the connection of the semiconductor element 23 and can adapt to a smaller pitch between connection terminals, because the semiconductor element 23 is mounted on the surface smoother than the surface on which the electrodes 18 are formed.

Next, the thirteenth embodiment of the present invention will be explained. FIG. 30 is an exemplary cross-sectional view of a semiconductor device 113 according to the present embodiment. FIGS. 29A through 29C are exemplary cross-sectional views showing one example of a manufacturing method of the semiconductor device 113 according to the present embodiment step by step. In FIG. 30 and FIG. 31, components that are the same as those in FIG. 1 through FIG. 29 will be denoted by the same reference numerals and will not be explained in detail again.

As shown in FIG. 30, the semiconductor device 113 according to the present embodiment is formed of the wiring board 101 according to the first embodiment described above, a semiconductor element 27 having a connection electrode 28 on its surface and bonded via adhesive 31 to the wiring board 101 to cover a part of the surface of the solder resist 19, a wire 29 that connects the connection electrode 28 of the semiconductor element 27 to the electrode 18 of the wiring board 101, and mold resin 30 that seals the semiconductor device 113 to cover the semiconductor element 27 and the wiring board 101.

The semiconductor element 27 has the connection electrode 28 on its surface, and the connection electrode 28 and the electrode 18 of the wiring board 101 are electrically connected by the wire 29.

The bonding wire 29 is mainly made of gold, and electrically connects the connection electrode 28 of the semiconductor element 27 and the electrode 18.

The mold resin 30 may be made of a material of epoxy series mixed with silica filler, and can be deposited by transfer molding or compression molding for covering the semiconductor element 27 and the wires on the connector region by using a mold, or printing or the like.

The adhesive 31 is applied to the surface of the semiconductor element 27 on which no circuit is provided, and may be made of organic material of epoxy series, acrylic series, polyimide series, or the like, or Ag paste, or the like.

Next, a manufacturing method of the semiconductor device 113 according to the present embodiment will be explained.

First, the semiconductor element 27 having the connection electrode 28 on its surface is bonded by the adhesive 31 to the wiring board 101 to cover a part of the surface of the solder resist 19 as shown in FIG. 31A (step 1). The adhesive 31 is applied to the surface of the semiconductor element 27 on which no circuit is formed, or to the wiring board 101.

Next, the connection electrode 28 of the semiconductor element 27 and the electrode 18 of the wiring board 101 are connected by the bonding wire 29 as shown in FIG. 31B (step 2).

Next, the mold resin 30 is deposited to cover the semiconductor element 27 and the wiring board 101 as shown in FIG. 31C (step 3). The mold resin 30 can be deposited by transfer molding or compression molding using a mold, or printing or the like. In this manner, the semiconductor device 13 according to the present embodiment is obtained.

The above-described manufacturing method of the semiconductor device 113 according to the present embodiment has explained an example in which the semiconductor element 27 is mounted on the wiring board 101, but this is not the only case. The semiconductor element 27 may be mounted in a step before the supporting substrate 21 is removed in the manufacturing method of the wiring board 101 according to the first embodiment described above. In this case, the step of removing the supporting substrate 21 and the etching barrier layer 22 is performed after the semiconductor element 27 is mounted and the mold resin 30 is deposited.

The semiconductor device 113 according to the present embodiment is an example in which no solder resist 20 is formed on the surface of the wiring board in which the first wiring layer 14 exists. However, the solder resist 20 may be formed on the wiring board in order to protect the first wiring layer 14 and control warping. Further, when the wiring board is practically used, the solder resist 19 on the surface on which the wiring layer 17 exists may not be provided.

In the example shown in FIG. 30, no particular element is connected to the first wiring layer 14. However, a solder ball or a metallic pin to function as an external terminal may be attached thereto, or another semiconductor element or electronic component may be mounted thereon. If the wiring board of the semiconductor device 112 according to the present embodiment has insufficient rigidity, a frame member may be joined to the wiring board.

The present embodiment can obtain a semiconductor device 113 that has a wiring board having a stable fine wiring pattern. Further, since an external terminal is embedded in the insulating layer 11 as embodied by the first wiring layer 14, stress applied when the semiconductor device 113 on the wiring board is mounted on another substrate or the like can be absorbed by the whole wiring board. Therefore, secondary mounting reliability is improved. Further, since the semiconductor element 27 is covered by the mold resin 30, it can be protected. Furthermore, with the mold resin 30, the semiconductor device 113 as a whole can have improved rigidity and hence improved reliability.

The semiconductor device 113 according to the present embodiment is an example in which the semiconductor element 27 is mounted on the wiring board 101, but this is not the only case. The semiconductor element 27 may be mounted on the wiring board according to the second through the ninth embodiments described above. In a case where the semiconductor element 27 is mounted on the wiring board according to the seventh through the ninth embodiments, heat dissipation can be effected by the supporting substrate 21. The wiring board may not necessarily be mounted with only one semiconductor element 23 but with a plurality of semiconductor elements 23, or further with components such as a capacitor, a resistor, and the like.

In the example shown in FIG. 30, the mold resin 30, which exists on the surface of the wiring board 101 on which the semiconductor element 27 is mounted, covers the entire surface of the wiring board 101 including the semiconductor element 27. However, the mold resin 30 needs not necessarily cover the entire surface of the wiring board 101, but may cover a part of the surface of the wiring board 101, in which part the semiconductor element 27 is included.

Next, the fourteenth embodiment of the present invention will be explained. FIG. 32 is an exemplary cross-sectional view of a semiconductor device 114 according to the present embodiment. In FIG. 32, components that are the same as those in FIG. 1 through FIG. 31 will be denoted by the same reference numerals and will not be explained in detail again.

As shown in FIG. 32, the semiconductor device 114 according to the present embodiment is formed of the wiring board 101 according to the first embodiment described above, a semiconductor element 27 having a connection electrode 28 on its surface and bonded via adhesive 31 to the lower surface of the wiring board 101, a wire 29 that connects the connection electrode 28 of the semiconductor element 27 to the first wiring layer 14 of the wiring board 101, and mold resin 30 that seals the semiconductor device 114 to cover the semiconductor element 27 and the wiring board 101.

The bonding wire 29 is mainly made of gold, and electrically connects the connection electrode 28 of the semiconductor element 27 and the first wiring layer 14.

In the example shown in FIG. 32, no particular element is connected to the electrodes 18. However, a solder ball or a metallic pin to function as an external terminal may be attached thereto, or another semiconductor element or electronic component may be mounted thereon. If the wiring board of the semiconductor device 114 according to the present embodiment has insufficient rigidity, a frame member may be joined to the wiring board.

According to the present embodiment, since the semiconductor element 27 is mounted on the surface smoother than the surface on which the electrodes 18 are formed, the semiconductor element 27 can be mounted more accurately and the surface becomes smoother, which enables reliable connection and a smaller pitch between the connection terminals.

The semiconductor device 114 according to the present embodiment is an example in which no solder resist 20 is provided on the surface of the wiring board in which the first wiring layer 14 exists, but the wiring board may be provided with the solder resist 20 for protecting the first wiring layer 14 and controlling warping. When the wiring board is practically used, the solder resist 19 on the surface on which the wiring layer 17 exists may not be provided.

In the example shown in FIG. 32, the mold resin 30, which exists on the surface of the wiring board 101 on which the semiconductor element 27 is mounted, covers the entire surface of the wiring board 101 including the semiconductor element 27. However, the mold resin 30 needs not necessarily cover the entire surface of the wiring board 101, but may cover a part of the surface of the wiring board 101, in which part the semiconductor element 27 is included. Further, the example shows that the wiring board has two levels of wiring layers, but this is not the only case. The semiconductor element 27 can be mounted on a wiring board that has three or more levels of wiring layers.

The semiconductor device according to any embodiment described above may have, at a desired position in the wiring board, a capacitor that functions as a noise filter for the circuit. Dielectric to make the capacitor may preferably be metal oxide such as titanium oxide, tantalum oxide, $Al_2O_3$, $SiO_2$, $ZrO_2$, $HfO_2$, $Nb_2O_5$, or the like, perovskite series such as $BST(Ba_xSr_{1-x}TiO_3)$, $PZT(PbZr_xTi_{1-x}O_3)$, $PLZT(Pb_{1-y}La_yZr_xTi_{1-x}O_3)$, or the like, or Bi-series layer compound such as $SrBi_2Ta_2O_9$, or the like, where $1 \leq x \leq 1$, and $0 < y < 1$. Dielectric to make the capacitor may alternatively be organic material mixed with inorganic material or magnetic material.

Alternatively, a capacitor to function as a noise filter for the circuit may be formed by making one or more layers constituting the insulating layer 11 of a material having a dielectric constant of 9 or larger, and forming electrodes that are opposed to each other at desired positions on the first wiring layer 14 and the wiring layer 17 or the electrode 18, which are located below and above the insulating layer 11. Dielectric to make the capacitor may preferably be metal oxide such as $Al_2O_3$, $ZrO_2$, $HfO_2$, $Nb_2O_5$, or the like, perovskite series such as $BST(Ba_xSr_{1-x}TiO_3)$, $PZT(PbZr_xTi_{1-x}O_3)$, $PLZT(Pb_{1-y}La_yZr_xTi_{1-x}O_3)$, or the like, or Bi-series layer compound such as $SrBi_2Ta_2O_9$, or the like, where $0 \leq x \leq 1$, and $0 < y < 1$. Dielectric to make the capacitor may alternatively be organic material mixed with inorganic material or magnetic material.

In the wiring board according to the present invention, the first wiring layer 14, which is formed in the insulating layer 11 with its surface exposed, is formed of the first metal film 12 and the second metal film 13, which are stacked from the side of the lower surface of the wiring layer 11, and the edges of the first metal film 12 project from the edges of the second metal film 12 in the direction in which the second metal film spreads. Therefore, the second metal film 13 can be protected from side etching during the manufacturing process, and the wiring board can hence be manufactured with high yield even if minute wires need to be formed thereon Further, with the first metal film 12 of the first wiring layer 14 used as a metal film for connection and the second metal film used as a metal film for reducing wire resistance, the connection electrode can have a large size, and at the same time the second metal film having a low resistance value can have a large gap from adjacent patterns, which makes it possible to improve connection reliability and to increase resistance to migration between adjacent patterns. Particularly, in a case where the second metal film is made of copper or silver that tends to migrate, migration that is to occur between minute wires can be delayed.

Further, since the first wiring layer 14 is embedded in the insulating layer 11 with its surface exposed, it can accept ultrasonical connection manners such as wire bonding while causing less ultrasonic absorption (relaxation) than caused by a wiring structure in which the wire protrudes from the insulating layer, and can therefore realize stable connection. Further, since the first wiring layer 14 is embedded in the insulating layer 11 with its surface exposed, stress applied when the semiconductor device on the wiring board 101 is mounted on another substrate or the like can be absorbed by the whole wiring board 101. Therefore, secondary mounting reliability is improved.

In the wiring board according to the second embodiment and the third embodiment, since the surface of the first wiring layer 14 has a position recessed inward from the lower surface of the insulating layer 11, an effect can be achieved that solder flow is dammed at the time of reflow that accompanies an operation of solder-connecting a semiconductor element such as a flip chip or mounting a solder ball.

In the wiring board according to the fourth embodiment, since the side surfaces of the depression 15 are located more outward than the edges of the first metal film 12, a solder ball can be connected to the entire surface of the first metal film 12 in a later step in which a semiconductor element or the like is connected to the first wiring layer 14 or the lower electrode of the wiring board. Therefore, the solder ball can be bonded more firmly.

Further, since the wiring board according to the fourth embodiment is largely opened because the side surfaces of the depression 15 are located more outward than the edges of the first metal film 12, it can prevent the insulating layer 11 from being frictioned by a wire bonding jig in a later step in which a semiconductor element or the like is connected by a wire to the first wiring layer 14 or the lower electrode of the wiring board.

Further, since the manufacturing method of the wiring board according to the present invention uses the supporting substrate 21 and stacks layers on the supporting substrate 21 for manufacturing the wiring board, any deformation during the manufacturing process can be suppressed and a fine handling ability can be obtained. Furthermore, the supporting substrate 21 ensures a thick base and can give a higher accuracy in the alignment of the layers than on a thin manufacturing base.

The manufacturing method of the wiring board according to the tenth embodiment can manufacture wiring boards on both surfaces of the supporting substrate 21. Therefore, the yield from one supporting substrate 21 can be doubled and manufacturing costs can be reduced.

The manufacturing method of the semiconductor device according to the present invention allows option whether to mount a semiconductor element on the wiring board before removing the supporting substrate 21 that is used in manufacturing the wiring board or to mount a semiconductor element on the wiring board of the present invention in the completed state. In a case where a semiconductor element is to be mounted on the wiring board before such removal of the supporting substrate 21, the precision in mounting the semiconductor element is so high as to be ready for a narrow pitch, i.e. 50 μm or smaller. On the other hand, in a case where a semiconductor element is mounted on the wiring board from which the supporting substrate 21 has been removed, a thin semiconductor device can be realized. If handling ability during the manufacturing process of a semiconductor device needs to be improved, a partially left supporting substrate 21 can keep rigidity of the wiring board.

BRIEF DESCRIPTION OF DRAWINGS

FIGS. 6A through 6F are exemplary cross-sectional views showing still another example of the manufacturing method till the step before FIG. 3A step by step.

FIGS. 7A through 7H are exemplary cross-sectional views showing yet another example of the manufacturing method till the step before FIG. 3A step by step.

FIGS. 16A through 16G are exemplary cross-sectional views showing one example of the manufacturing method of the wiring board 104 according to the fourth embodiment of the present invention step by step.

Figure 1:
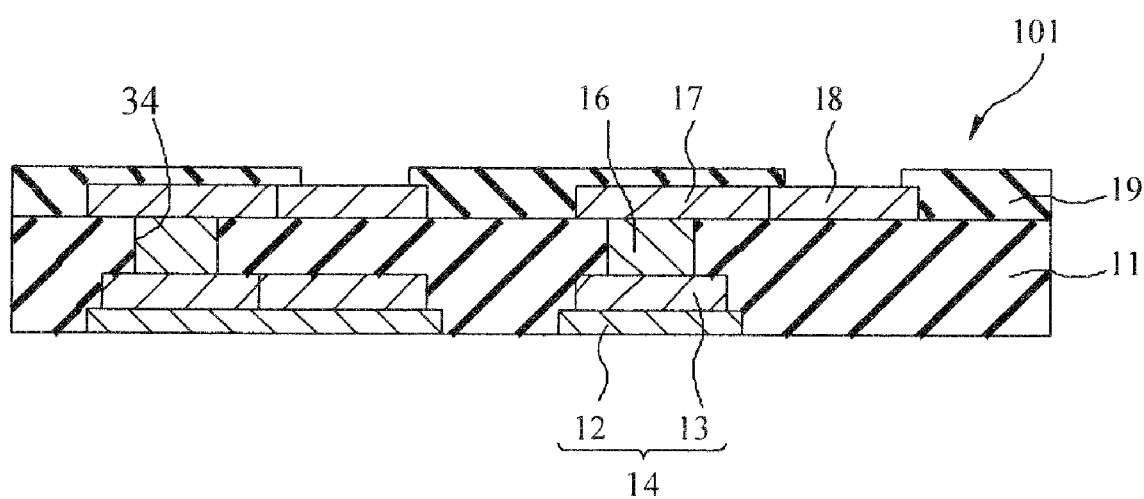
FIG. 1 is an exemplary cross-sectional view of a wiring board 101 according to the first embodiment of the present invention.
Figure 2A:
FIGS. 2A through 2F are exemplary cross-sectional views showing one example of the manufacturing method of the wiring board 101 according to the first embodiment of the present invention step by step.
Figure 2B:
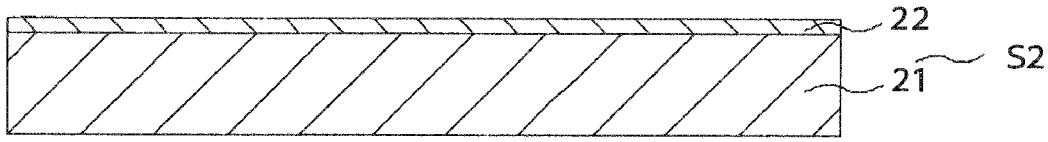
Figure 2C:
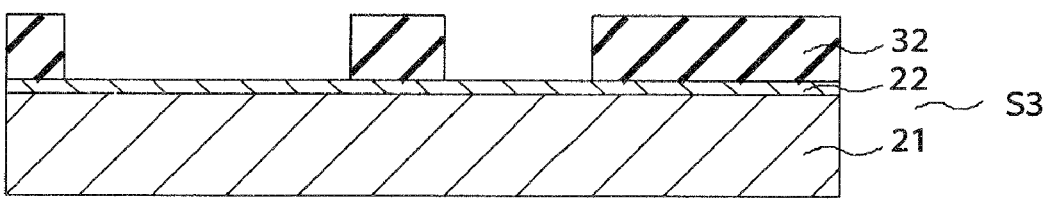
Figure 2D:
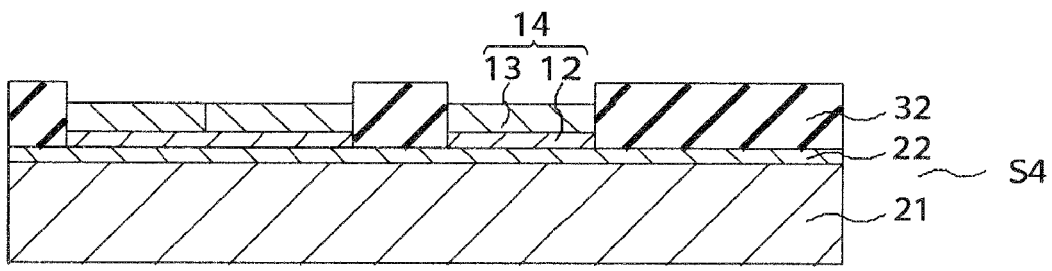
Figure 2E:
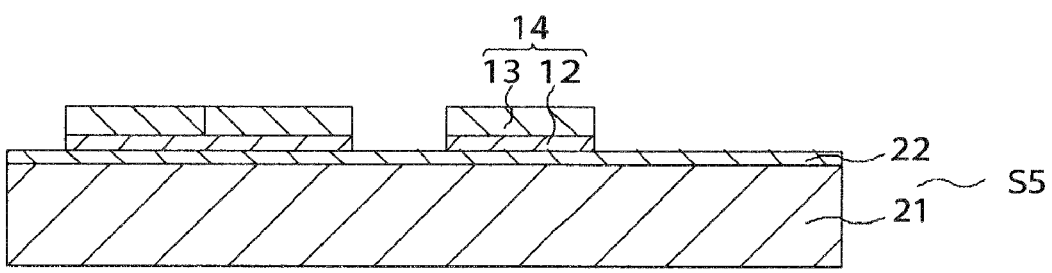
Figure 2F:
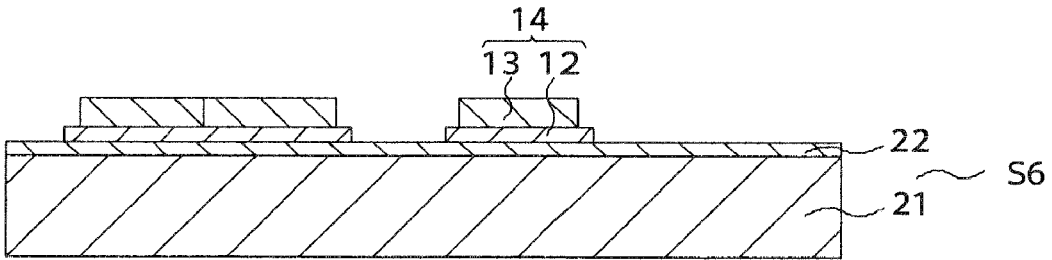
Figure 3A:
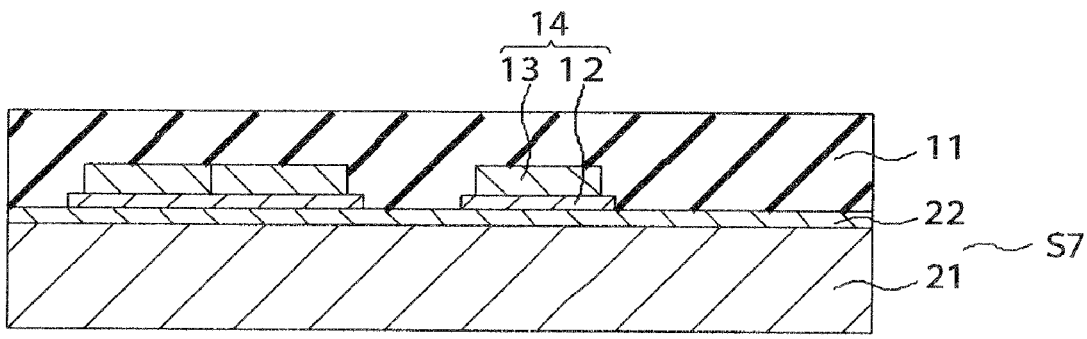
FIGS. 3A through 3D are exemplary cross-sectional views showing one example of the manufacturing method of the wiring board 101 according to the first embodiment of the present invention step by step.
Figure 3B:
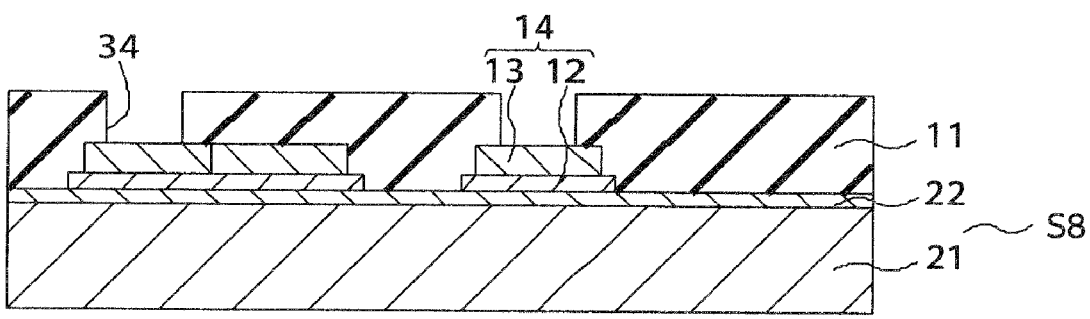
Figure 3C:
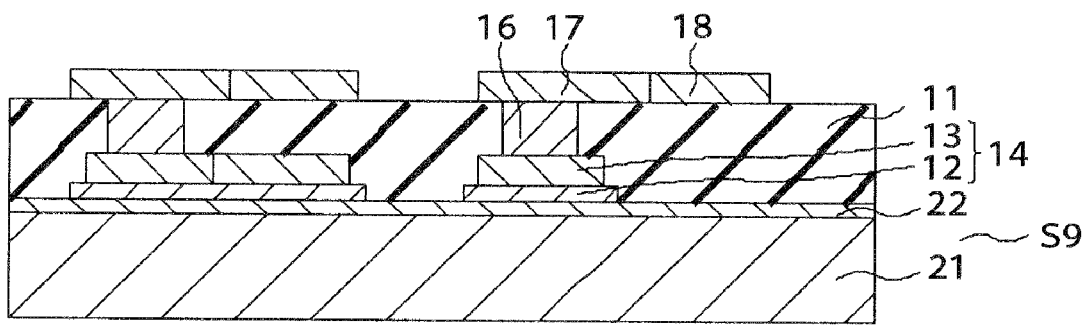
Figure 3D:
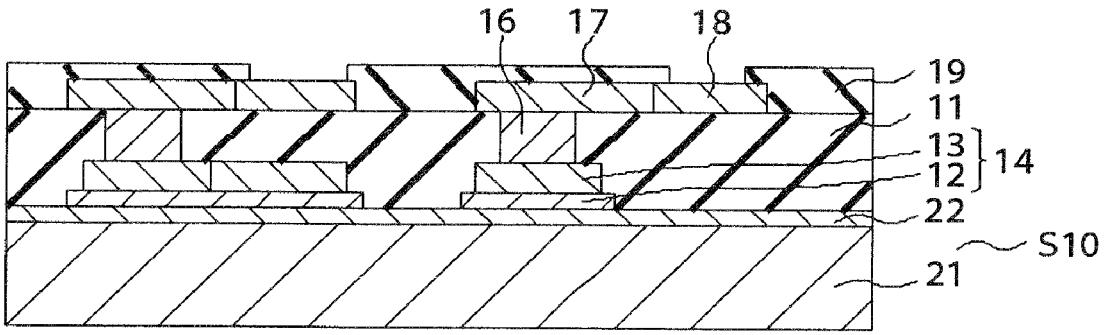
Figure 4A:
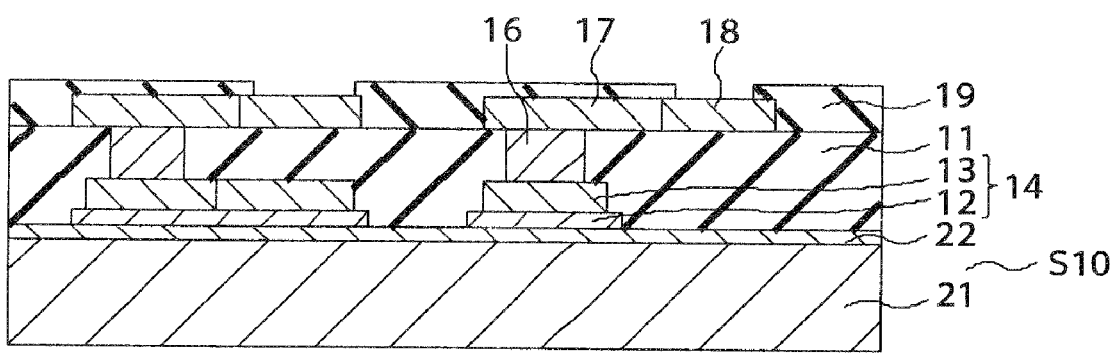
FIGS. 4A through 4C are exemplary cross-sectional views showing one example of the manufacturing method of the wiring board 101 according to the first embodiment of the present invention step by step.
Figure 4B:
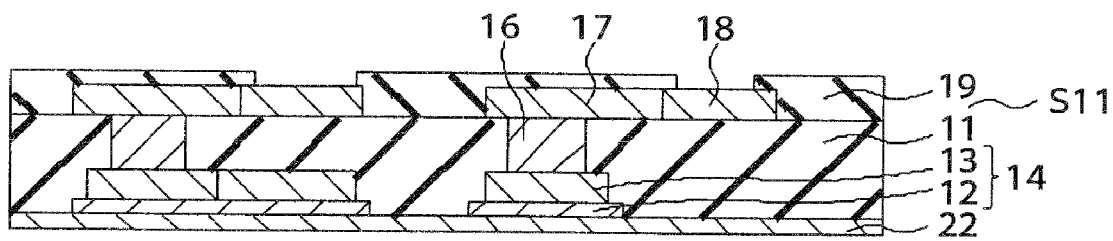
Figure 4C:
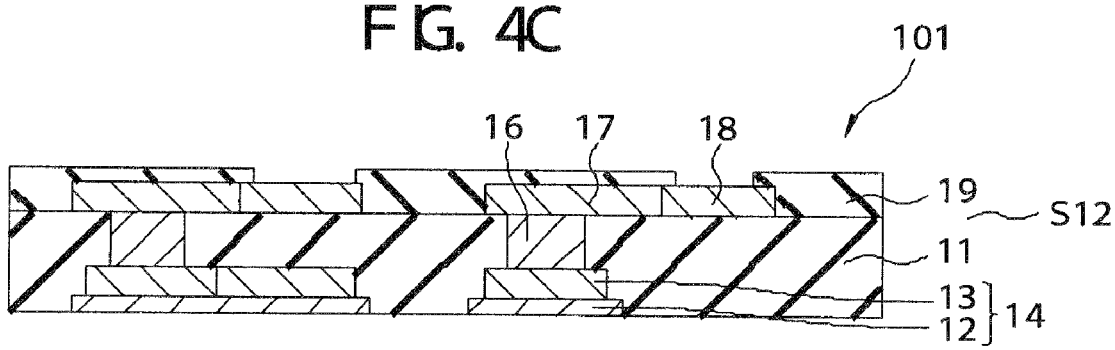
Figure 5A:
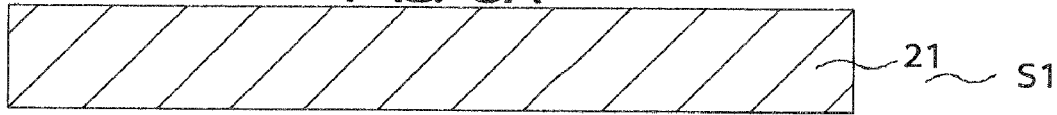
FIGS. 5A through 5H are exemplary cross-sectional views showing another example of the manufacturing method till the step before FIG. 3A step by step.
Figure 5B:
Figure 5C:
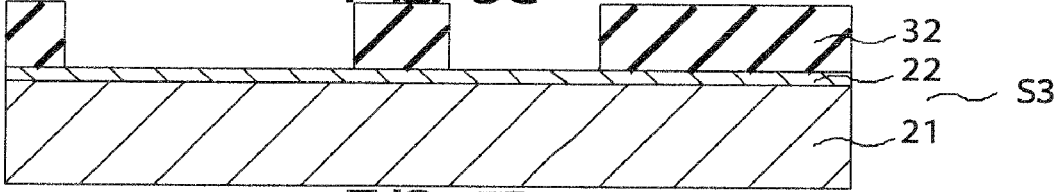
Figure 5D:
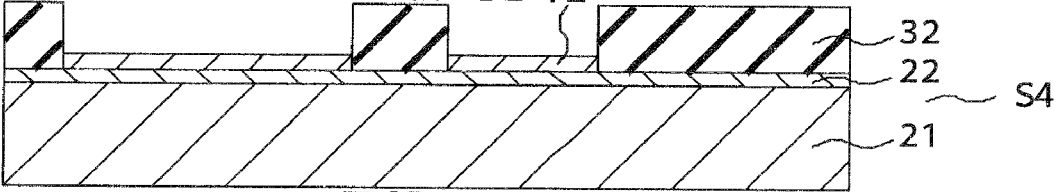
Figure 5E:
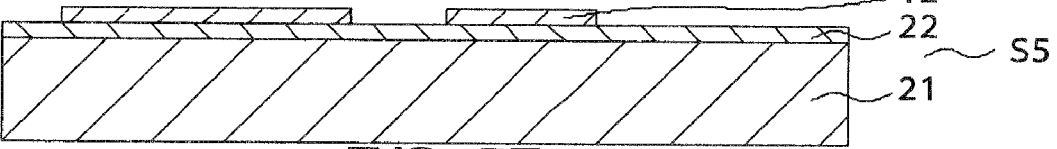
Figure 5F:
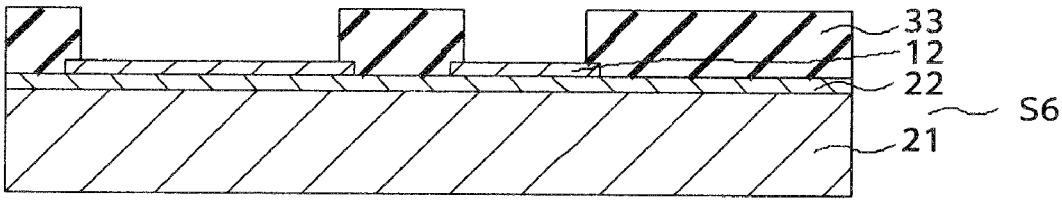
Figure 5G:
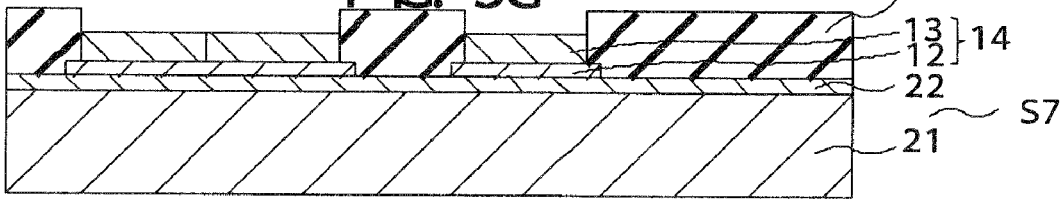
Figure 5H:
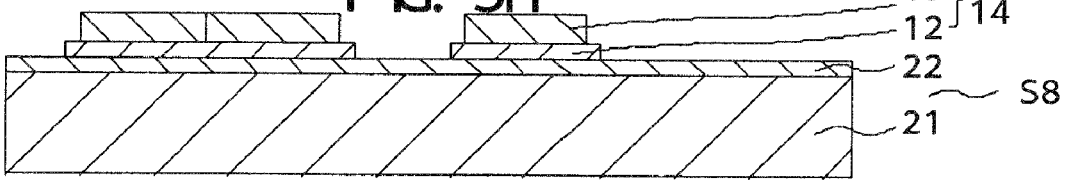
Figure 8:
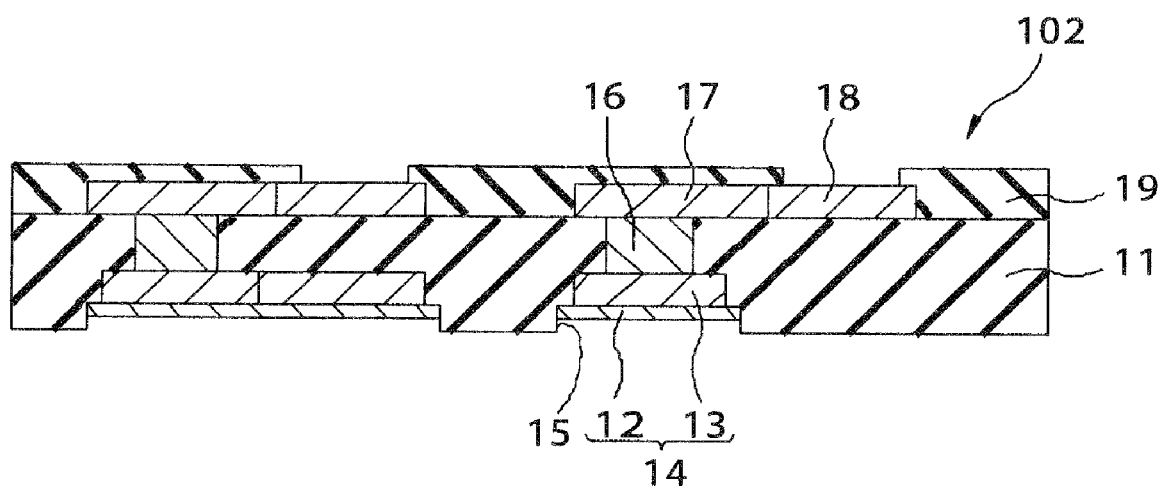
FIG. 8 is an exemplary cross-sectional view of a wiring board 102 according to the second embodiment of the present invention.
Figure 9A:
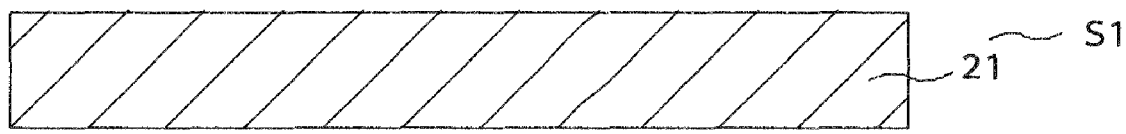
FIGS. 9A through 9E are exemplary cross-sectional views showing one example of the manufacturing method of the wiring board 102 according to the second embodiment of the present invention step by step.
Figure 9B:
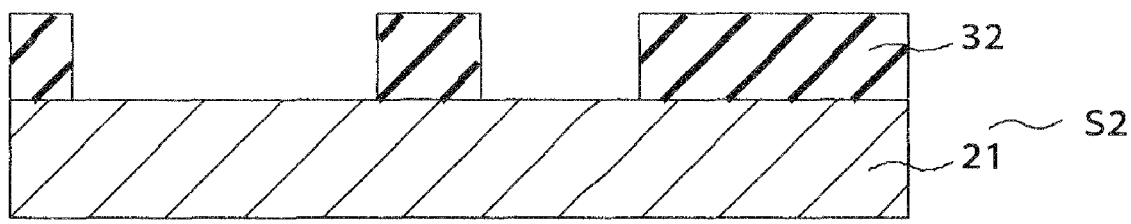
Figure 9C:
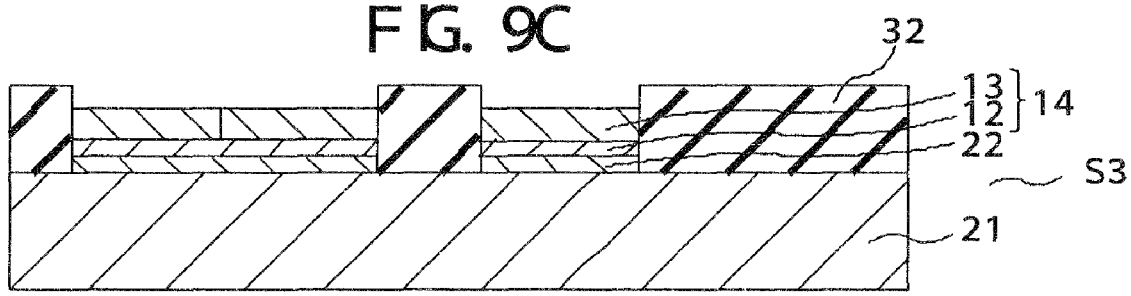
Figure 9D:
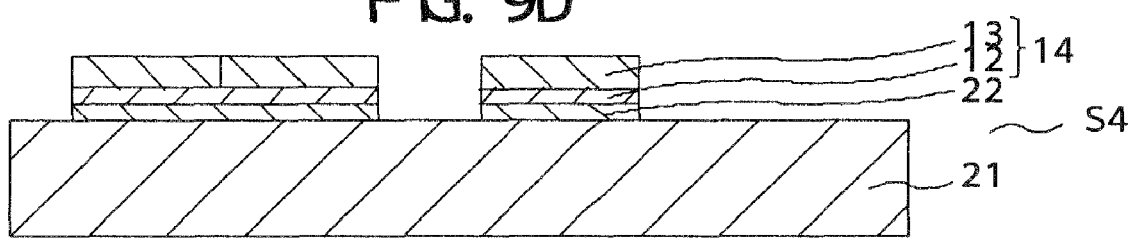
Figure 9E:
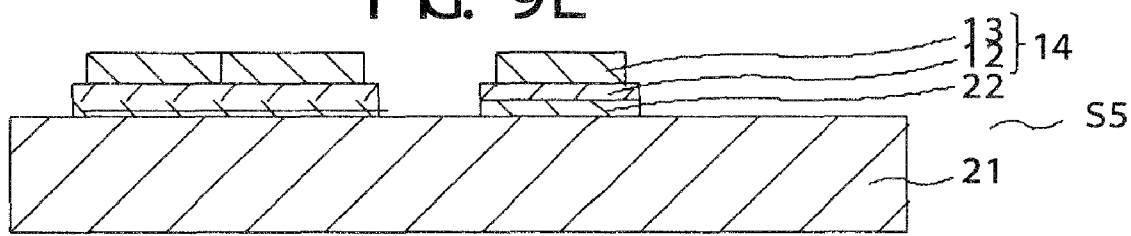
Figure 10A:
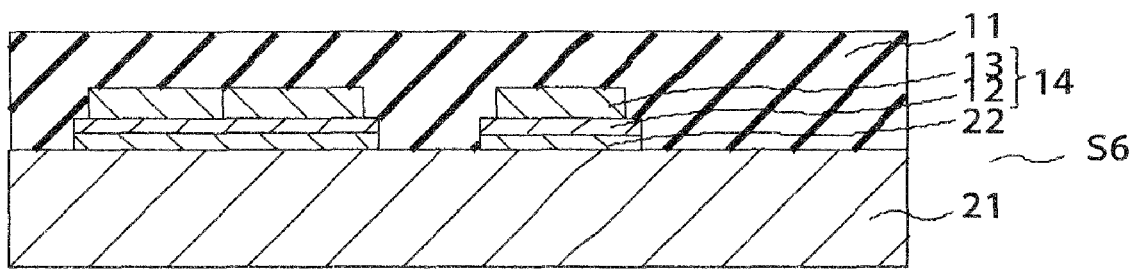
FIGS. 10A through 10D are exemplary cross-sectional views showing one example of the manufacturing method of the wiring board 102 according to the second embodiment of the present invention step by step.
Figure 10B:
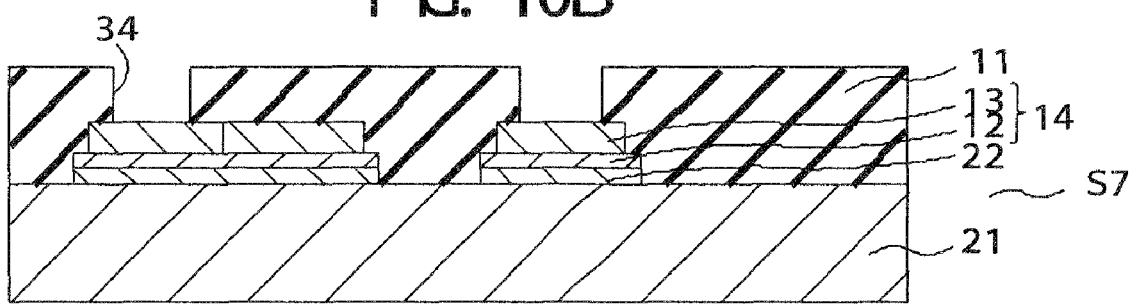
Figure 10C:
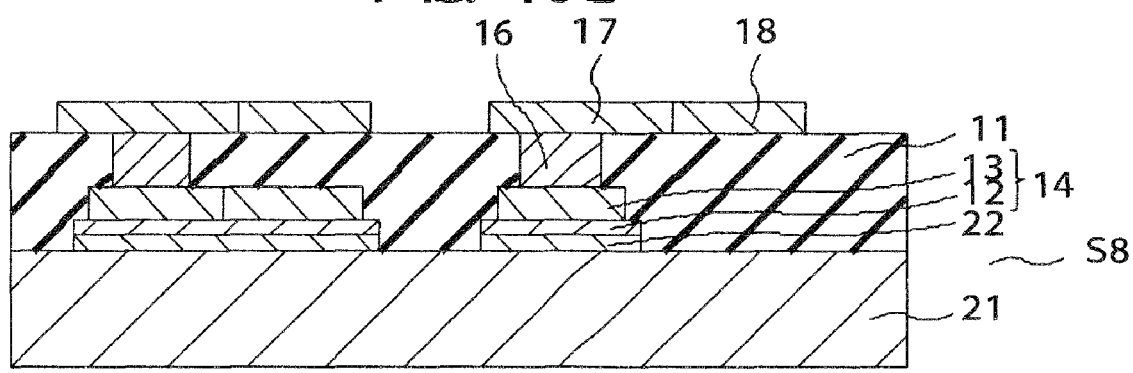
Figure 10D:
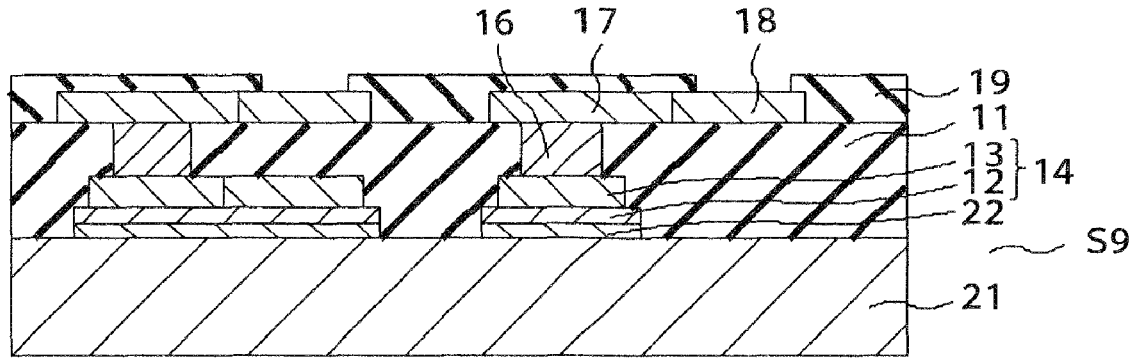
Figure 11A:
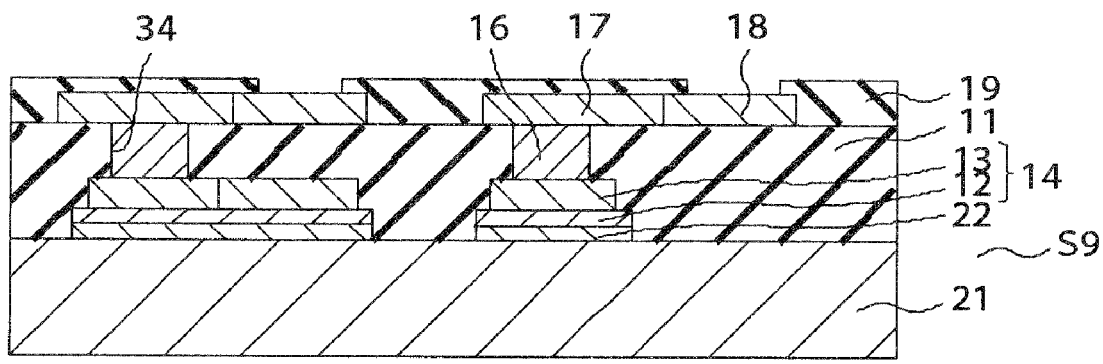
FIGS. 11A through 11C are exemplary cross-sectional views showing one example of the manufacturing method of the wiring board 102 according to the second embodiment of the present invention step by step.
Figure 11B:
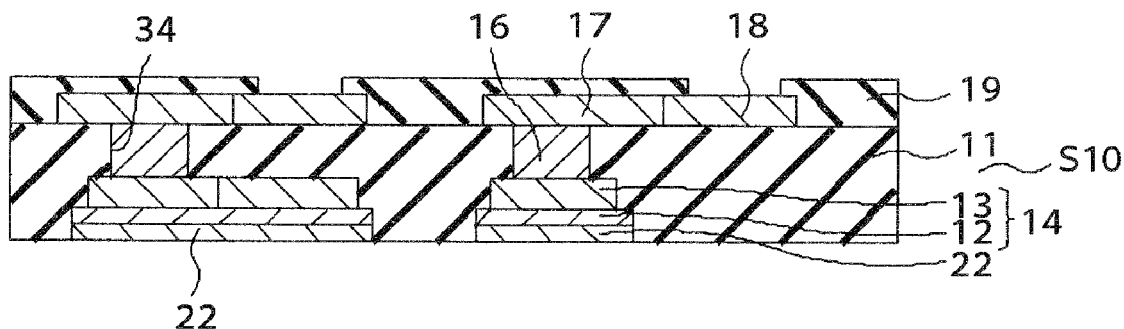
Figure 11C:
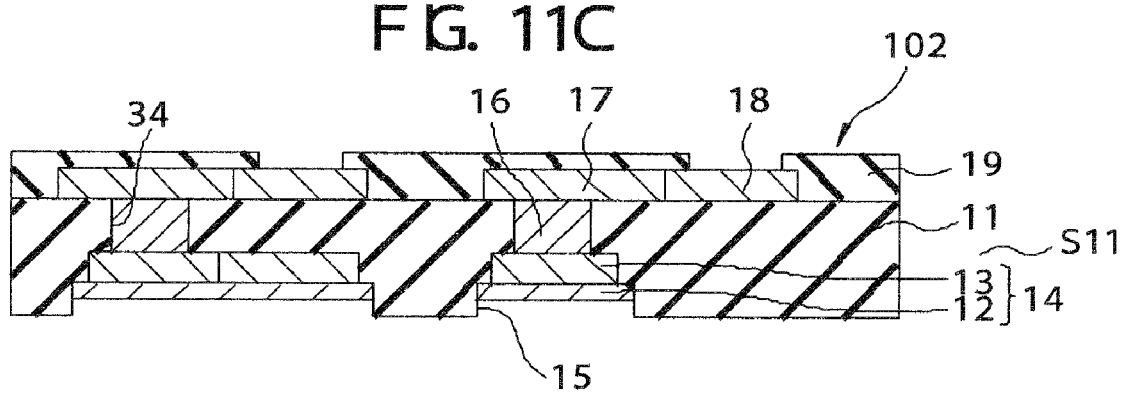
Figure 12A:
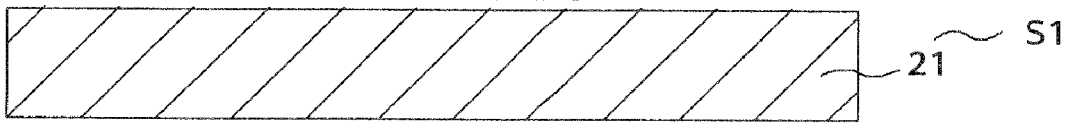
FIGS. 12A through 12G are exemplary cross-sectional views showing another example of the manufacturing method till the step before FIG. 11A step by step.
Figure 12B:
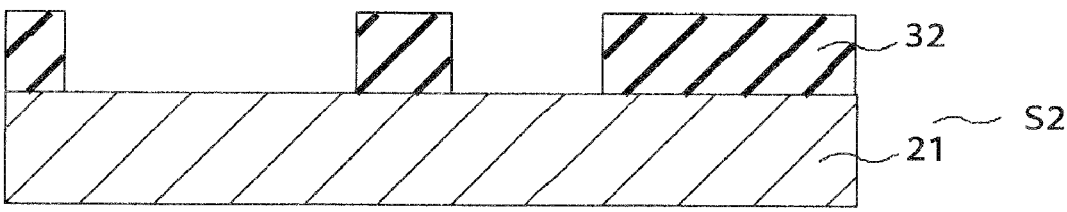
Figure 12C:
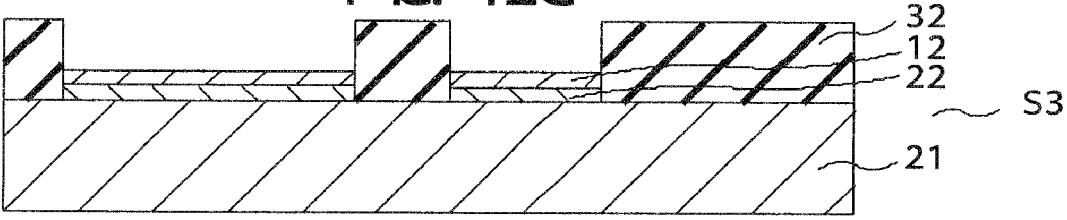
Figure 12D:
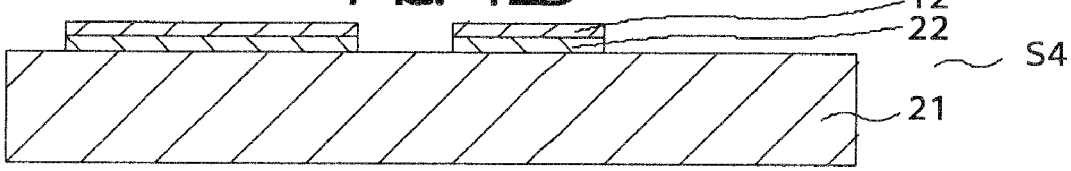
Figure 12E:
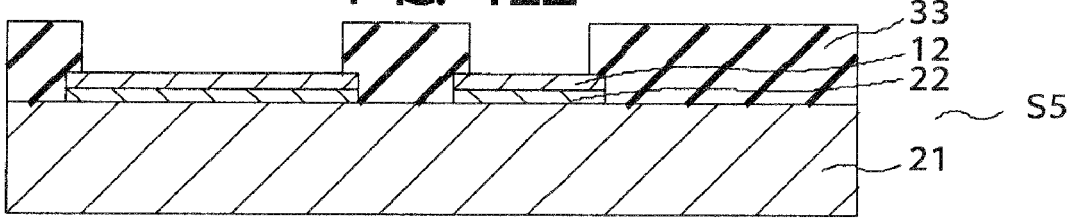
Figure 12F:
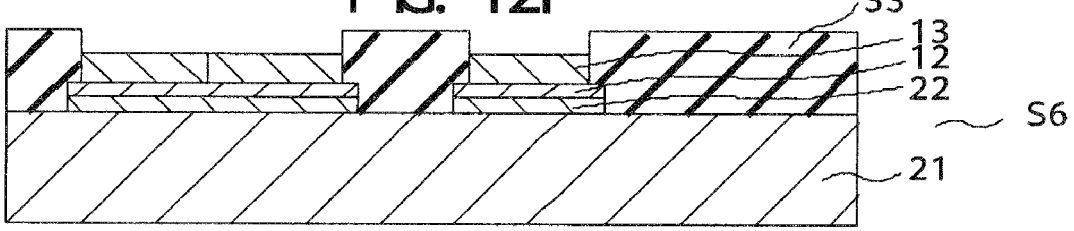
Figure 12G:
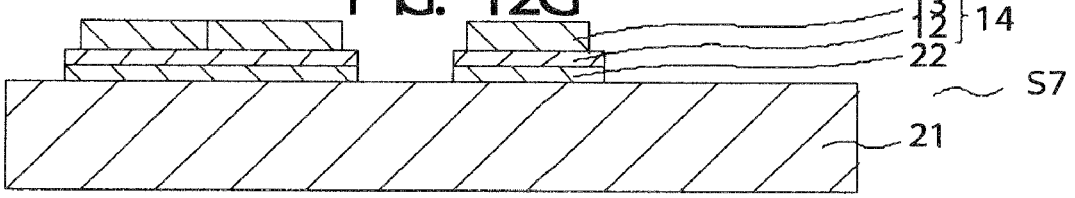
Figure 13:
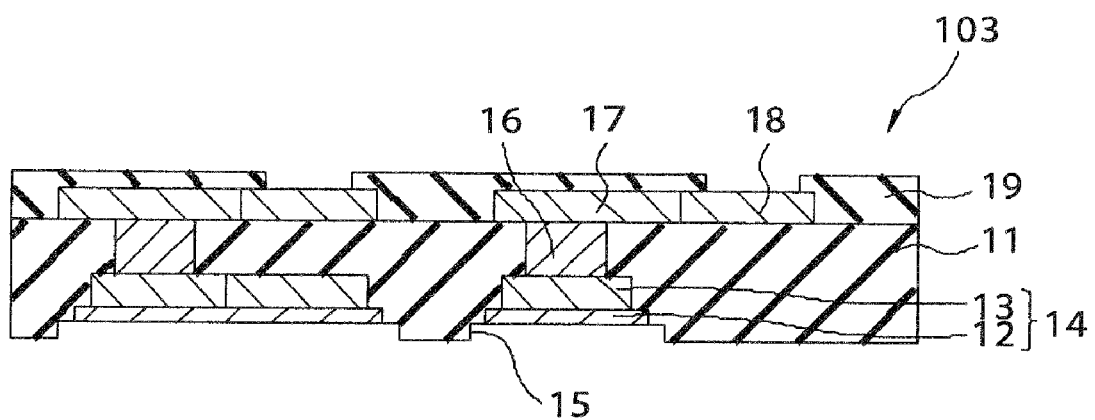
FIG. 13 is an exemplary cross-sectional view of the wiring board 103 according to the third embodiment of the present invention.
Figure 14A:
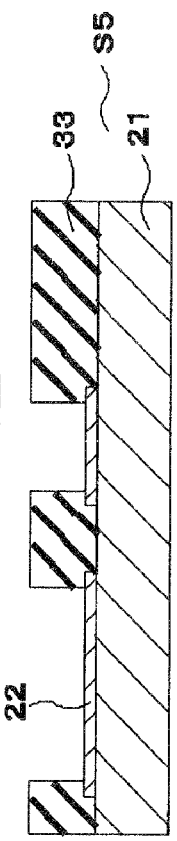
FIGS. 14A through 14H are exemplary cross-sectional views showing one example of the manufacturing method of the wiring board 103 according to the third embodiment of the present invention step by step.
Figure 14B:
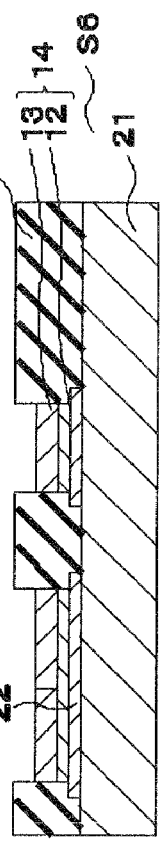
Figure 14C:
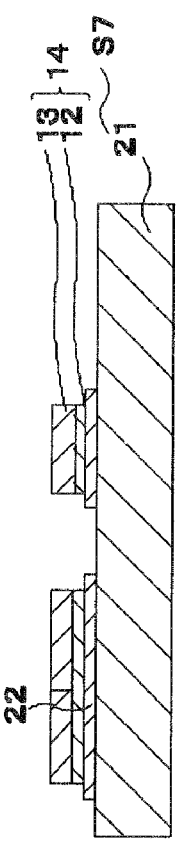
Figure 14D:
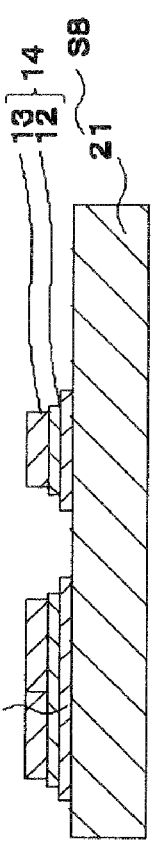
Figure 14E:
Figure 14F:
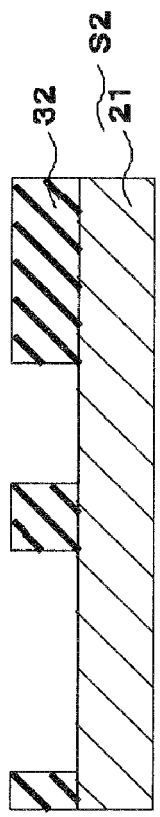
Figure 14G:
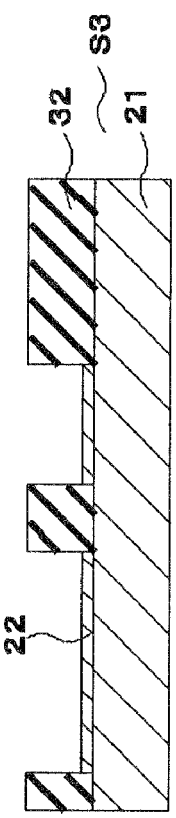
Figure 14H:
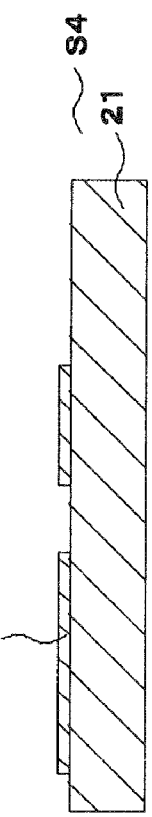
Figure 15:
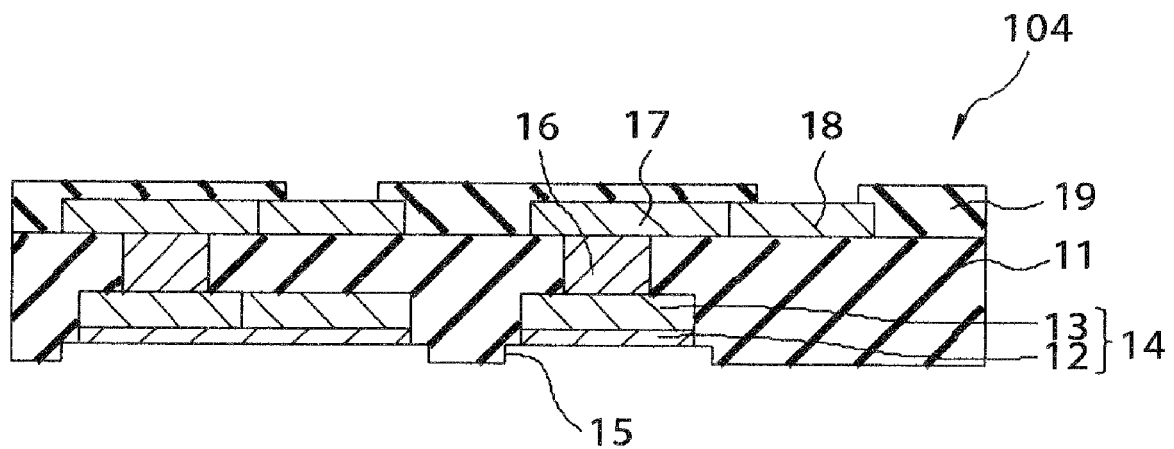
FIG. 15 is an exemplary cross-sectional view of a wiring board 104 according to the fourth embodiment of the present invention.
Figure 17:
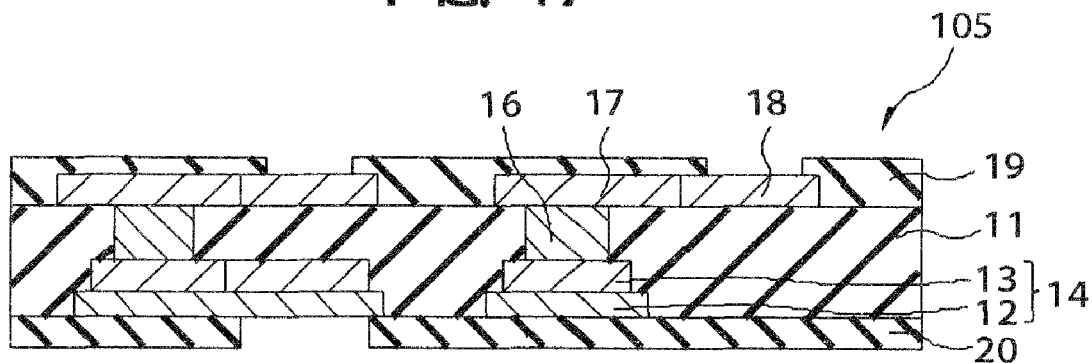
FIG. 17 is an exemplary cross-sectional view of a wiring board 105 according to the fifth embodiment of the present invention.
Figure 18A:
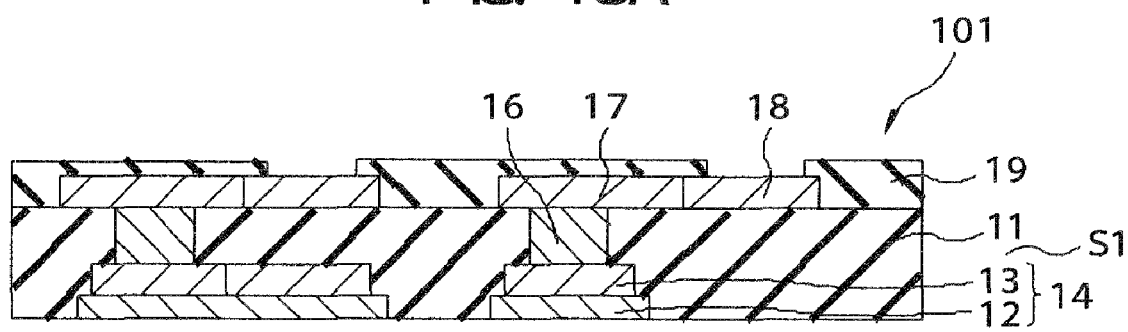
FIGS. 18A and 18B are exemplary cross-sectional views showing one example of the manufacturing method of the wiring board 105 according to the fifth embodiment of the present invention step by step.
Figure 18B:
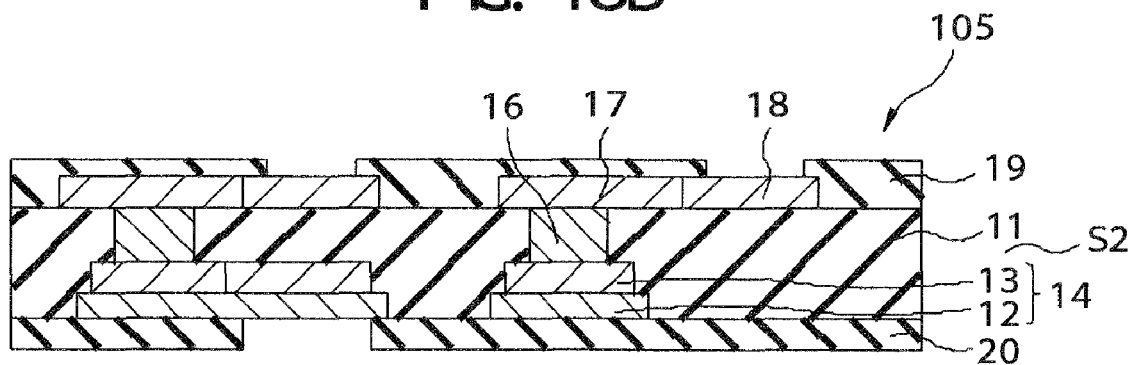
Figure 19:
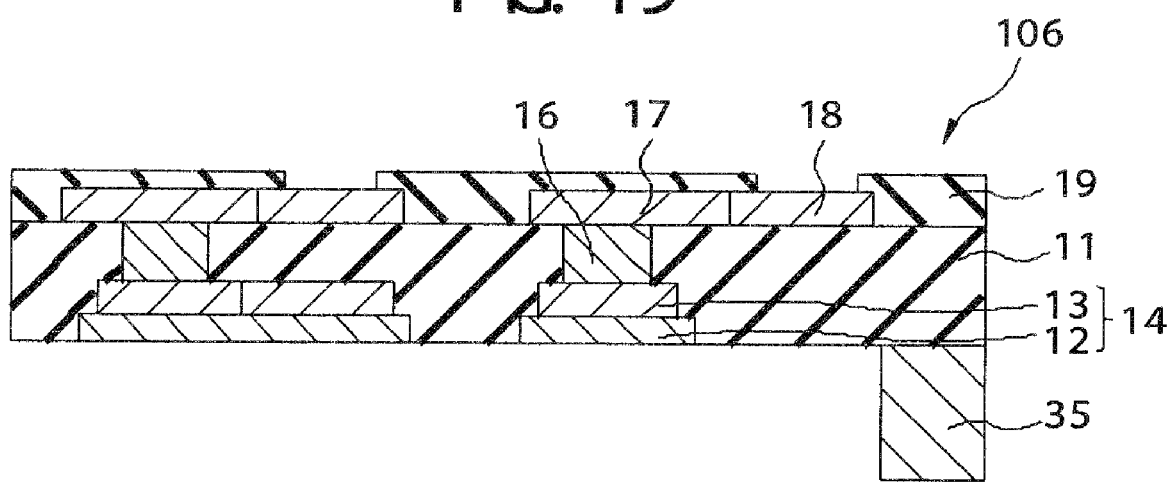
FIG. 19 is an exemplary cross-sectional view of a wiring board 106 according to the fifth embodiment of the present invention.
Figure 20A:
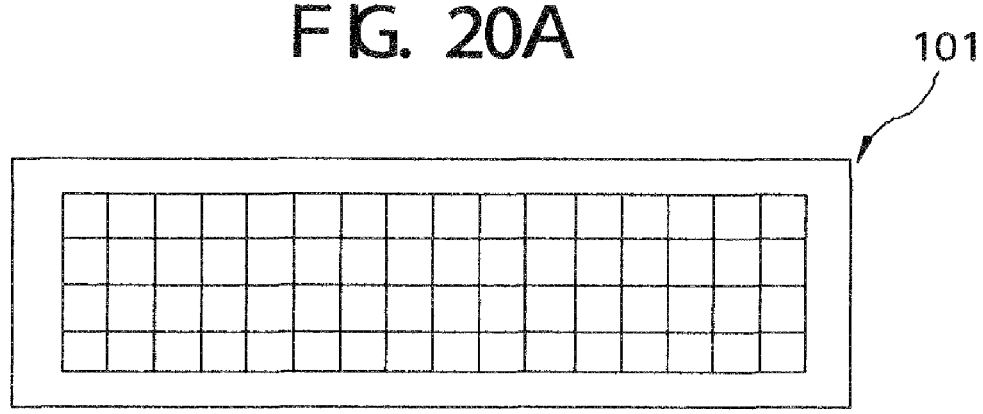
FIG. 20A is an exemplary bottom view of the wiring board 101 according to the first embodiment of the present invention.
Figure 20B:
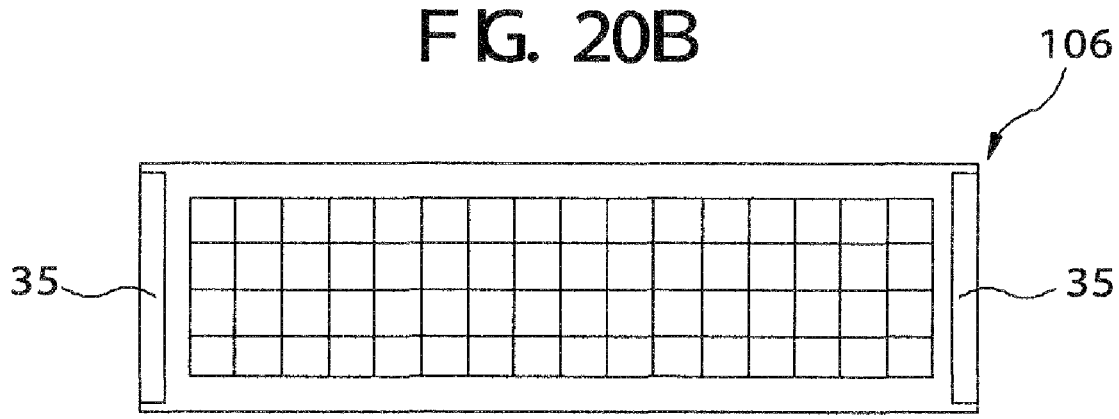
FIGS. 20B and 20C are exemplary bottom views of the wiring board 106 according to the sixth embodiment of the present invention.
Figure 20C:
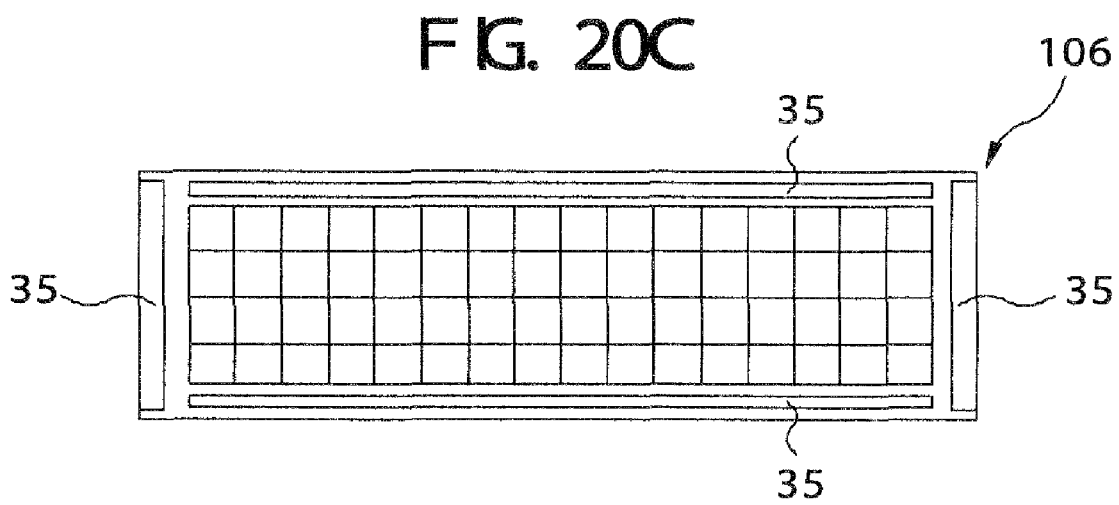
Figure 21A:
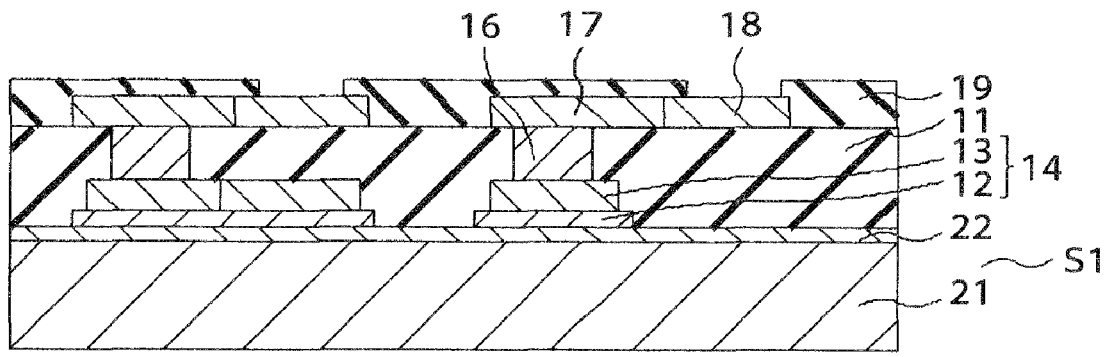
FIGS. 21A and 21B are exemplary cross-sectional views showing one example of the manufacturing method of the wiring board 106 according to the sixth embodiment of the present invention step by step.
Figure 21B:
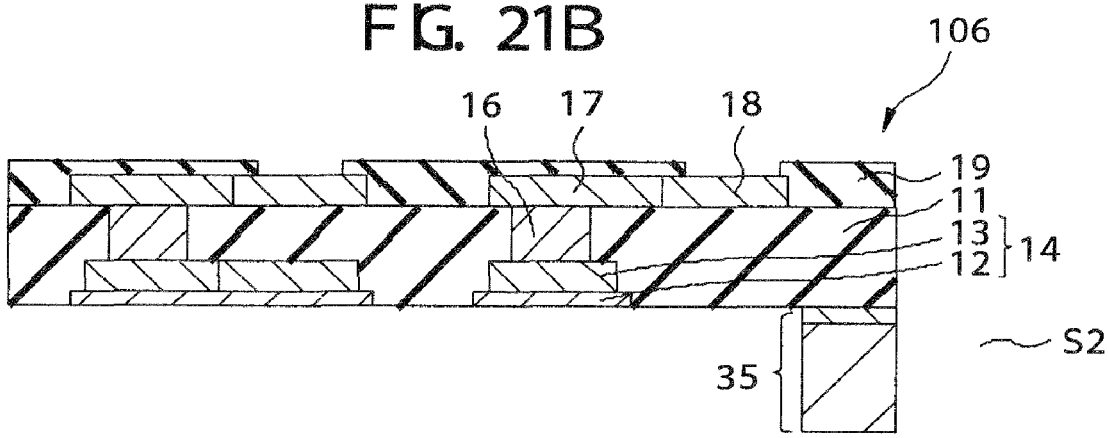
Figure 22:
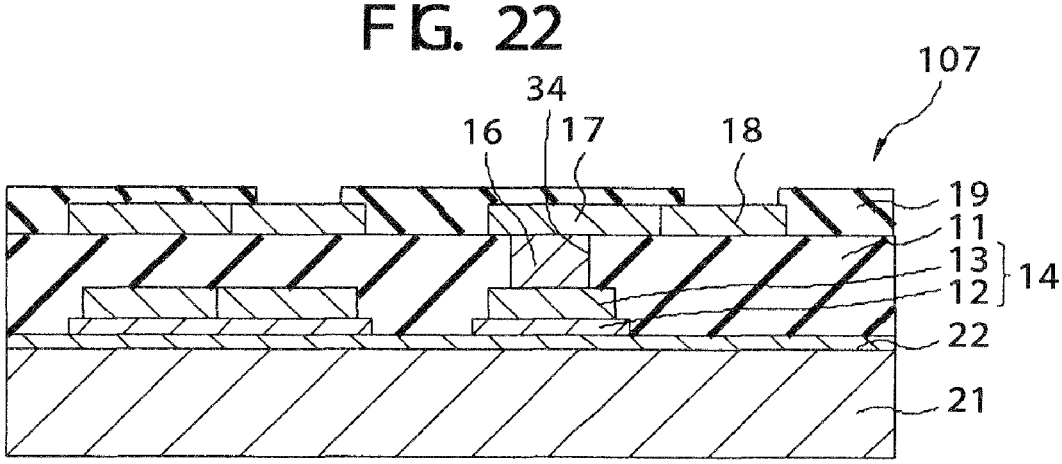
FIG. 22 is an exemplary cross-sectional view of a wiring board 107 according to the seventh embodiment of the present invention.
Figure 23:
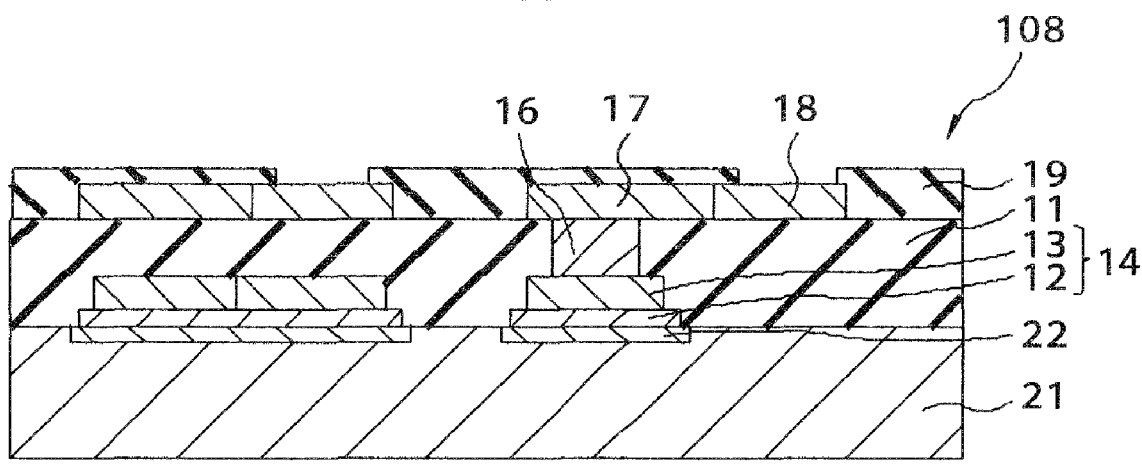
FIG. 23 is an exemplary cross-sectional view of a wiring board 108 according to the eighth embodiment of the present invention.
Figure 24:
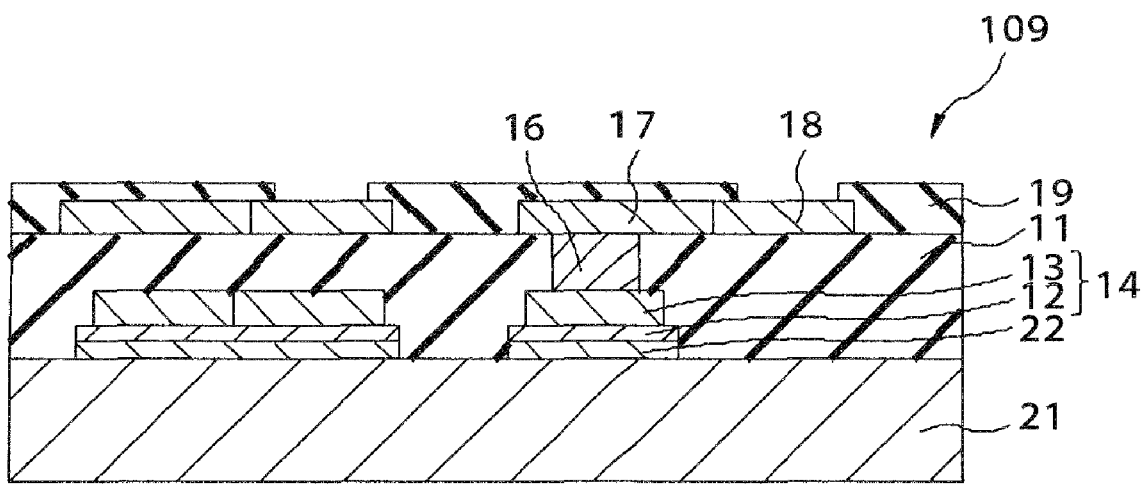
FIG. 24 is an exemplary cross-sectional view of a wiring board 109 according to the ninth embodiment of the present invention.
Figure 25A:
FIGS. 25A through 25F are exemplary cross-sectional views showing one example of a manufacturing method of a wiring board according to the tenth embodiment of the present invention step by step.
Figure 25B:
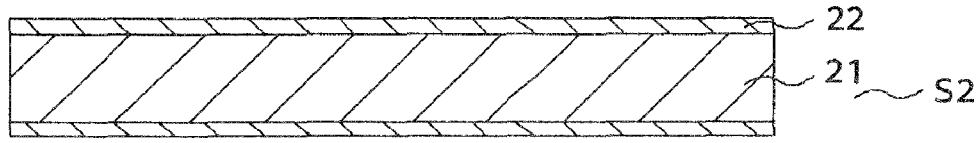
Figure 25C:
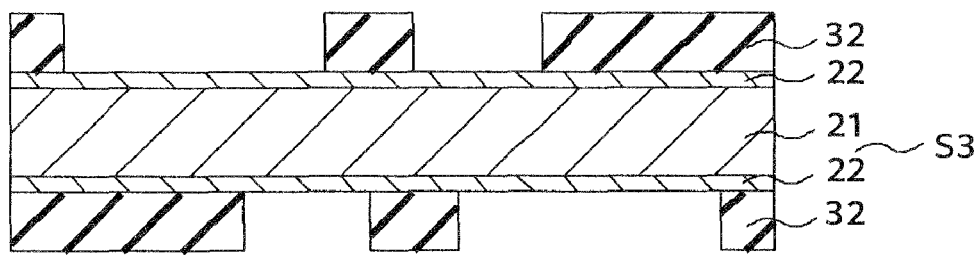
Figure 25D:
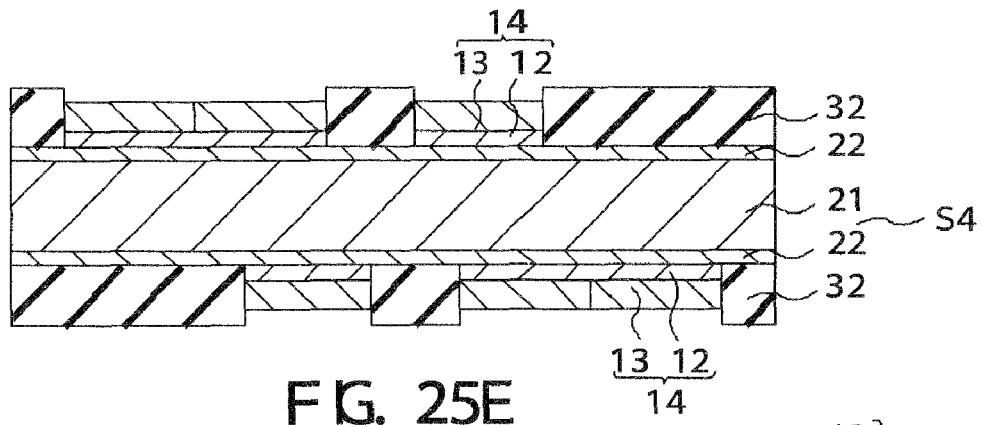
Figure 25E:
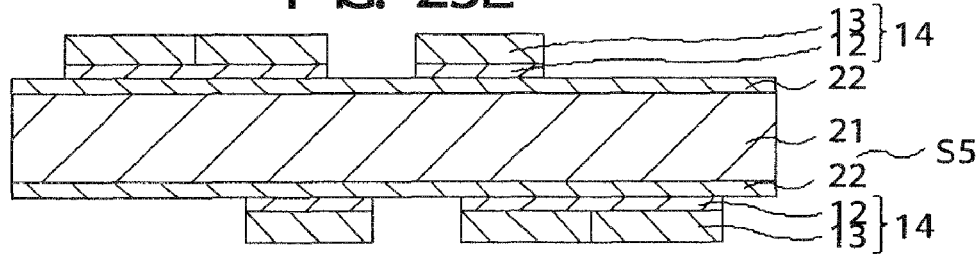
Figure 25F:
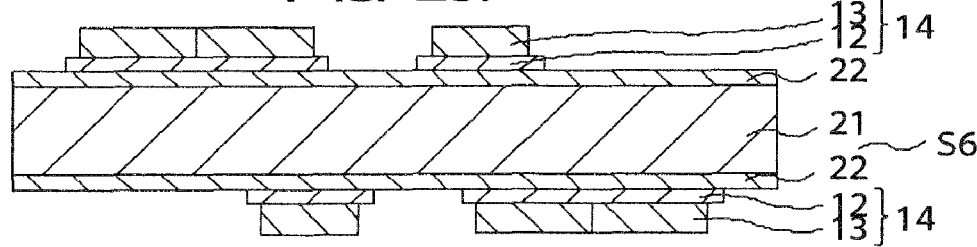
Figure 26A:
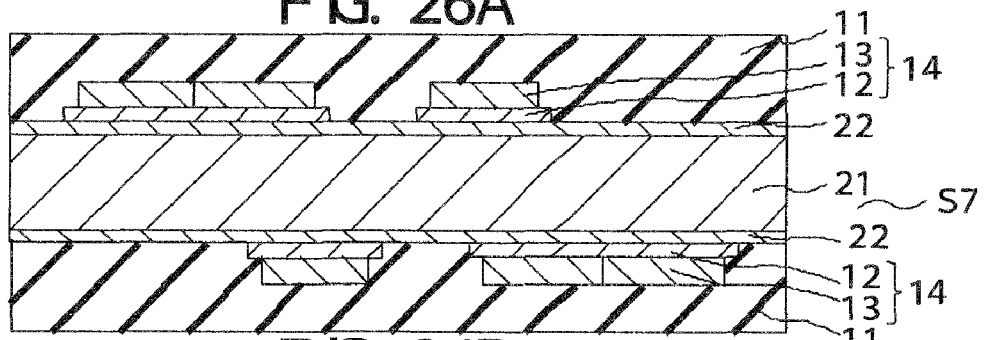
FIGS. 26A through 26D are exemplary cross-sectional views showing one example of the manufacturing method of a wiring board according to the tenth embodiment of the present invention step by step.
Figure 26B:
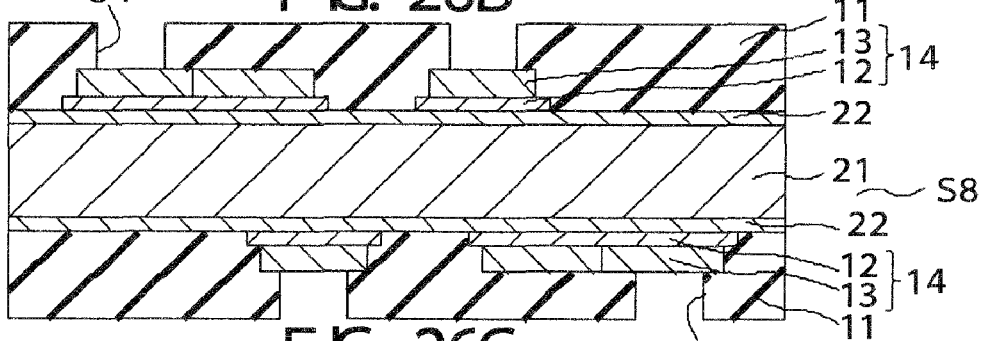
Figure 26C:
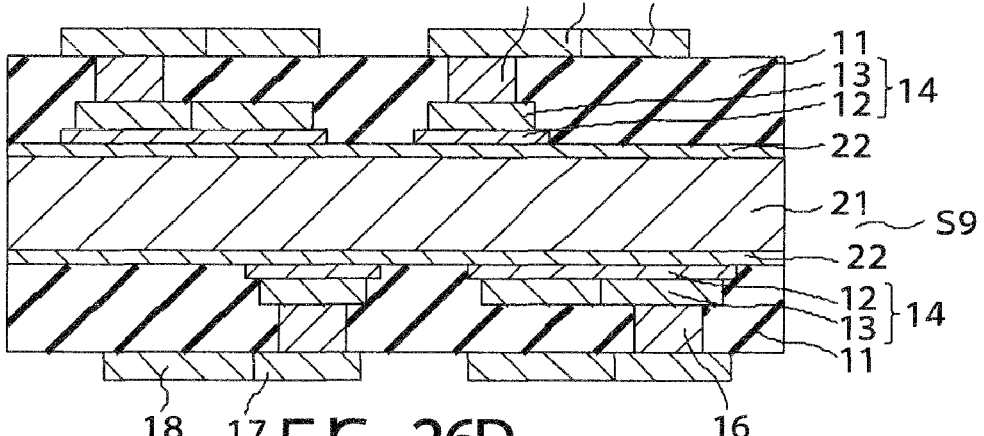
Figure 26D:
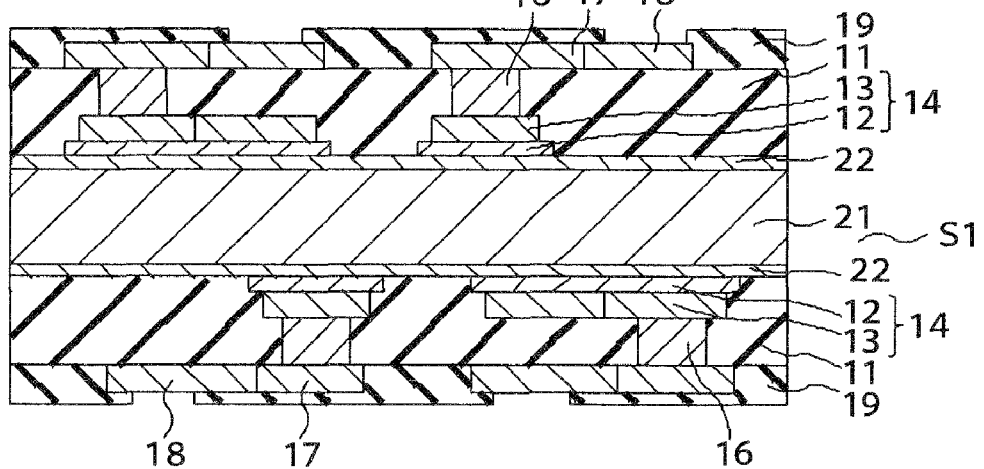
Figure 27:
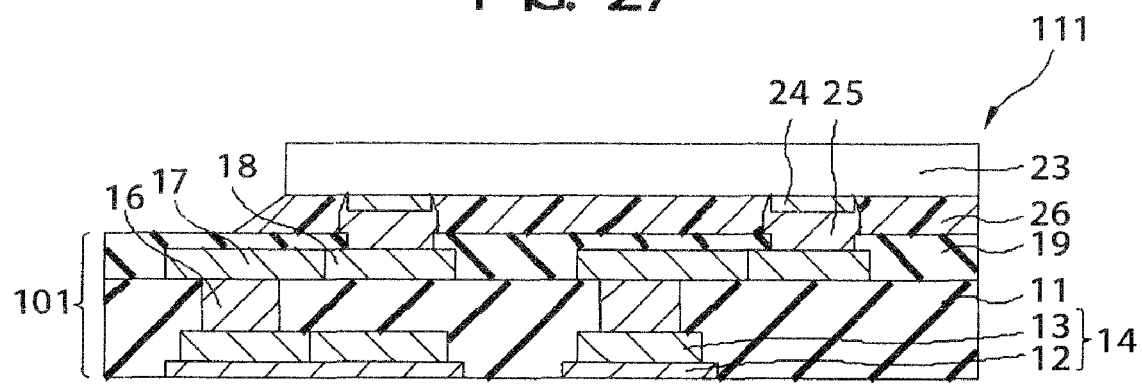
FIG. 27 is an exemplary cross-sectional view of a semiconductor device 111 according to the eleventh embodiment of the present invention.
Figure 28A:
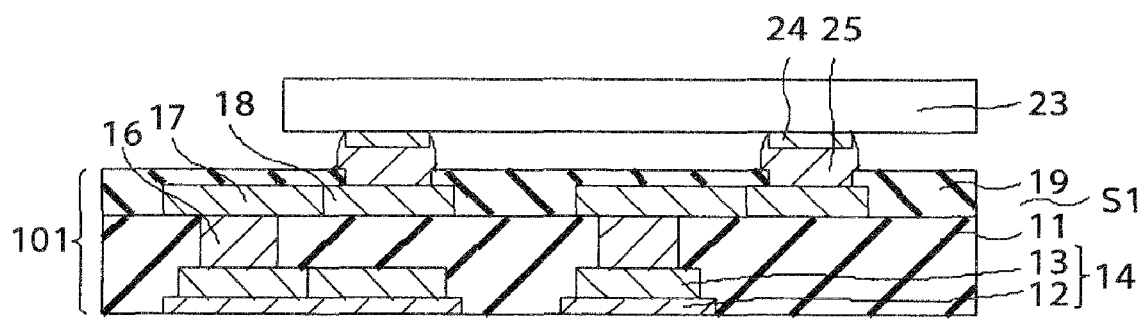
FIGS. 28A and 28B are exemplary cross-sectional views showing one example of the manufacturing method of the semiconductor device 111 according to the eleventh embodiment of the present invention step by step.
Figure 28B:
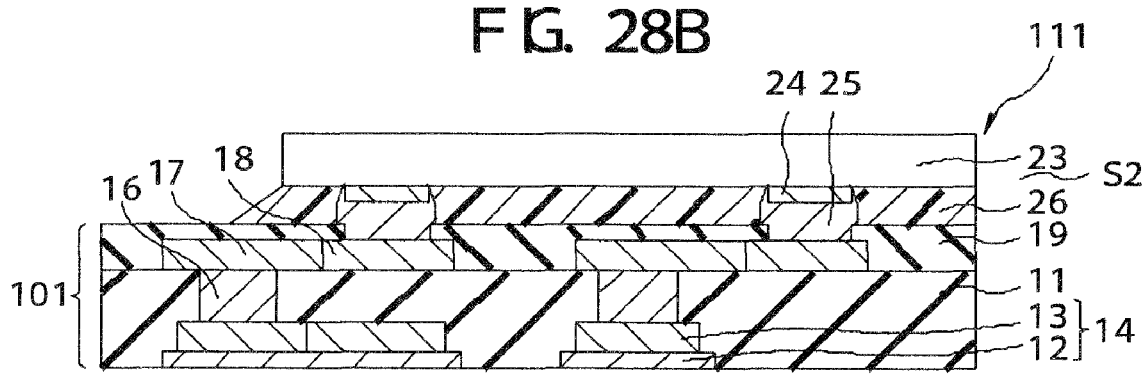
Figure 29:
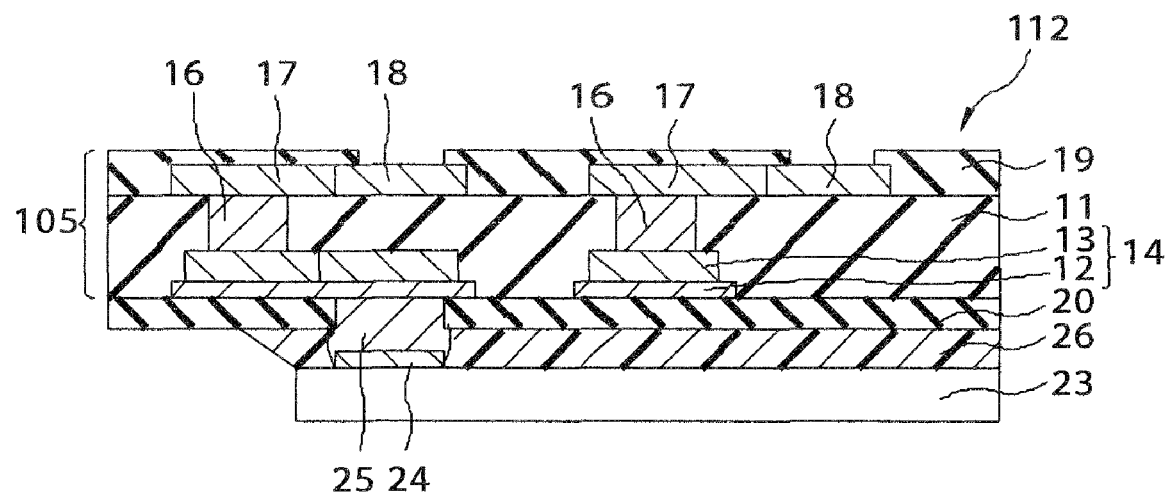
FIG. 29 is an exemplary cross-sectional view of a semiconductor device 112 according to the twelfth embodiment of the present invention.
Figure 30:
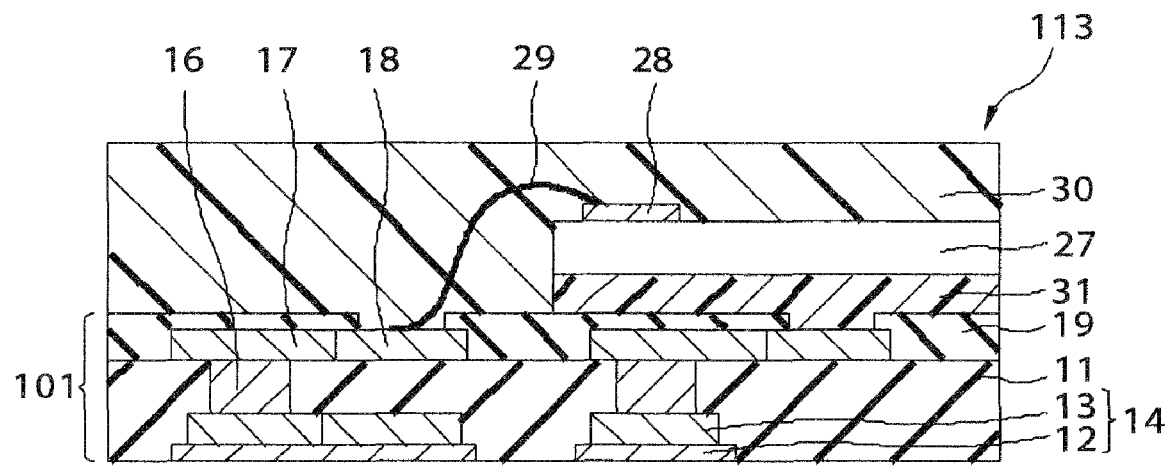
FIG. 30 is an exemplary cross-sectional view of a semiconductor device 113 according to the thirteenth embodiment of the present invention.
Figure 31A:
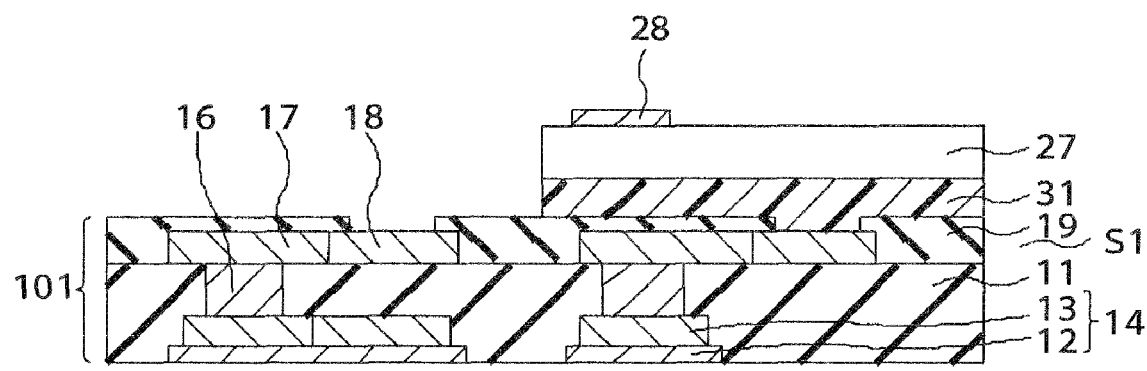
FIGS. 31A through 31C are exemplary cross-sectional views showing one example of the manufacturing method of the semiconductor device 113 according to the thirteenth embodiment of the present invention step by step.
Figure 31B:
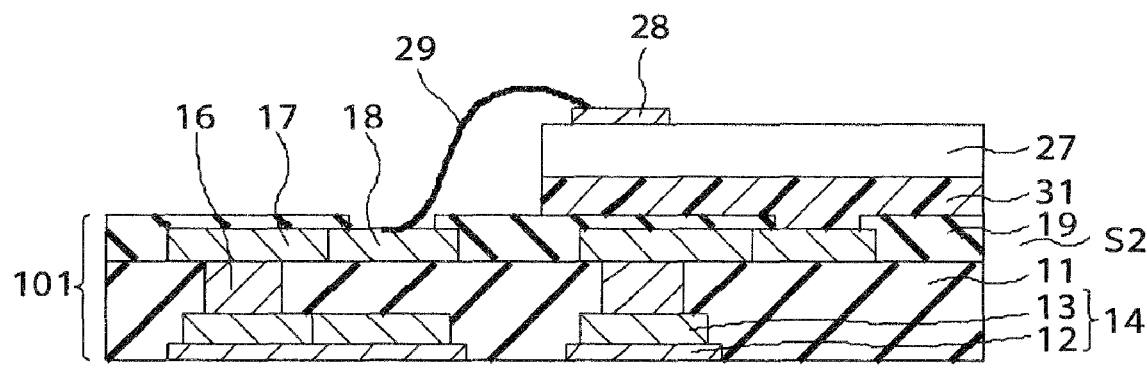
Figure 31C:
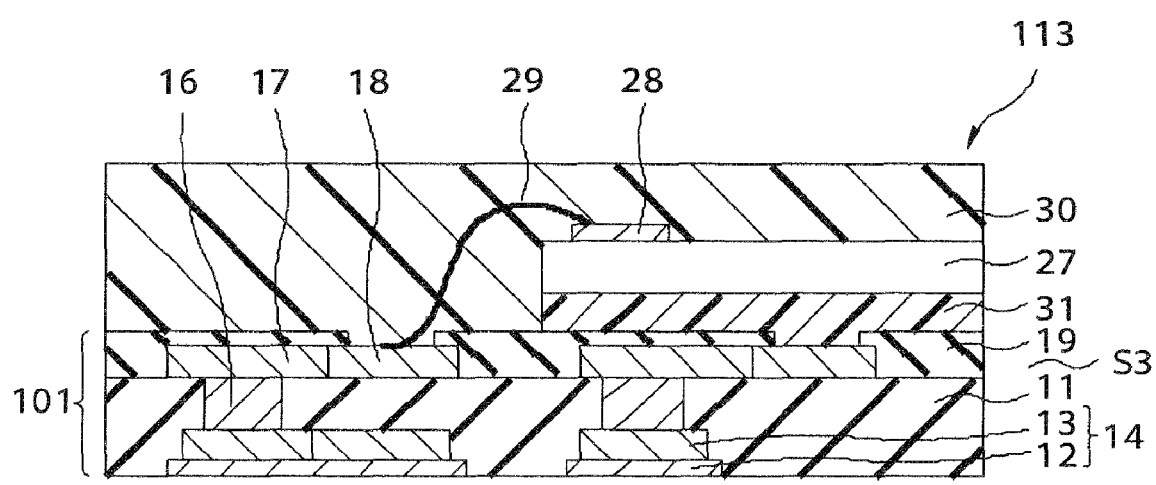
Figure 32:
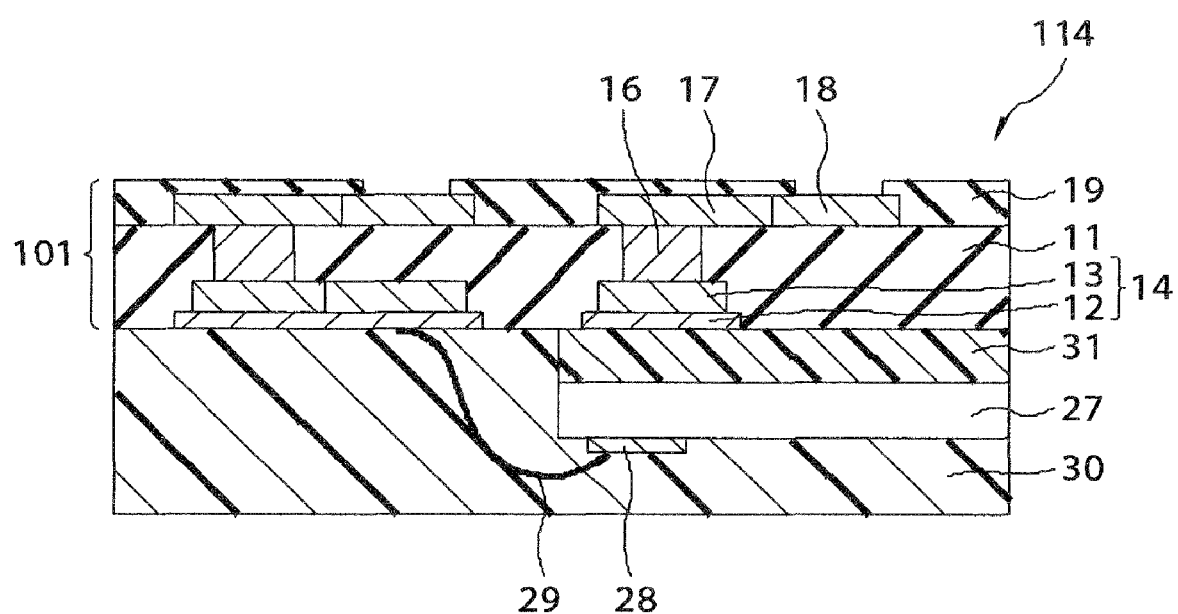
FIG. 32 is an exemplary cross-sectional view of a semiconductor device 114 according to the fourteenth embodiment of the present invention.

EXPLANATION OF REFERENCE NUMERALS 101, 102, 103, 104, 105, 106, 107, 108, 109; wiring board
111, 112, 113, 114; semiconductor device
11; insulating layer
12; first metal film
13; second metal film
14; first wiring layer
15; depression
16; via
17; wiring layer
18; electrode
19, 20; solder resist
21; supporting substrate
22; etching barrier layer
23, 27; semiconductor element
24, 28; connection electrode
25; solder ball
26; underfill
29; wire
30; mold resin
31; adhesive
32; 33; plated resist
34; via hole
35; metal frame
36; excavation

The invention claimed is:

1. A wiring board, comprising:
an insulating layer;
a plurality of wiring layers formed in such a way as to be insulated from each other by said insulating layer; and
a plurality of vias formed in said insulating layer to connect said wiring layers, wherein said wiring layers include a surface wiring layer, which is formed in one surface of said insulating layer, said surface wiring layer comprising:
a first metal film exposed from said one surface and having side surfaces that at least partially contact said insulating layer; and
a second metal film embedded in said insulating layer and stacked symmetrically and directly onto said first metal film, and edges of said first metal film coincide with edges of said second metal film or project from the edges of said second metal film in a direction in which said second metal film spreads.

2. The wiring board according to claim 1, wherein an external surface of said first metal film is located at a position recessed from said one surface of said insulating layer.

3. The wiring board according to claim 2, wherein a recess in said insulating layer at which said first metal film is formed has side surfaces that positionally coincide with the edges of said first metal film.

4. The wiring board according to claim 2, wherein a recess in said insulating layer at which said first metal film is formed has side surfaces that are located more outward than the edges of said first metal film.

5. The wiring board according to claim 1, wherein said first metal film and said second metal film are made of the same material.

6. The wiring board according to claim 1, wherein said first metal film is made of one metal selected from the group consisting of gold, silver, nickel, copper, aluminum, palladium, platinum, rhodium, tin, and solder material, or plural metals selected from said group and stacked together.

7. The wiring board according to claim 1, wherein said second metal film is made of one metal selected from the group consisting of gold, silver, nickel, copper, aluminum, palladium, platinum, rhodium, tin, and solder material, or plural metals selected from said group and stacked together.

8. The wiring board according to claim 1, wherein said via is not connected to a part of said surface wiring layer.

9. The wiring board according to claim 1, wherein a metal frame is provided on either surface or both surfaces of said insulating layer.

10. The wiring board according to claim 1, wherein a second electrode is formed on a surface of said insulating layer opposite to said one surface, a part of said surface wiring layer is used as a first electrode, and a solder resist is formed on either surface or both surfaces of said insulating layer, said solder resist having an opening to expose all or a part of said first electrode or said second electrode.

11. A semiconductor device, wherein at least one semiconductor element is connected to said wiring board according to claim 1.

12. The semiconductor device according to claim 11, wherein said at least one semiconductor element and said wiring board are connected by at least one of flip-chip bonding and wire bonding.

13. A wiring board, comprising an etching barrier layer and a supporting substrate that are formed on said one surface of said wiring board according to claim 1, in an order in which said etching barrier layer is on said one surface.

14. The wiring board according to claim 13, wherein said etching barrier layer is formed on an entire surface of said one surface.

15. The wiring board according to claim 13, wherein edges of said etching barrier layer project from the edges of said first metal film in a direction in which said first metal film spreads, or positionally coincide with the edges of said first metal film.

16. The wiring board according to claim 13, wherein said supporting substrate is made of a conductive material, or a composite material formed of a conductive material stacked on a surface of an insulating material.

17. The wiring board according to claim 13, wherein said etching barrier layer is made of a material that is different from said conductive material of said supporting substrate and a material of said first metal film.

18. The wiring board according to claim 13, wherein a second electrode is formed on a surface of said insulating layer opposite to said one surface, and a solder resist is formed to have an opening to expose all or a part of said second electrode.

* * * * *